United States Patent
Yamaguchi et al.

(10) Patent No.: US 9,632,410 B2
(45) Date of Patent: Apr. 25, 2017

(54) ACTINIC RAY-SENSITIVE OR RADIATION-SENSITIVE RESIN COMPOSITION, RESIST FILM, RESIST-COATED MASK BLANK, PHOTOMASK AND PATTERN FORMING METHOD, AND METHOD FOR PRODUCING ELECTRONIC DEVICE USING THEM, AND ELECTRONIC DEVICE

(71) Applicant: FUJIFILM Corporation, Tokyo (JP)

(72) Inventors: Shuhei Yamaguchi, Shizuoka (JP); Toru Tsuchihashi, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/868,409

(22) Filed: Sep. 29, 2015

(65) Prior Publication Data
US 2016/0018732 A1 Jan. 21, 2016

Related U.S. Application Data

(63) Continuation of application No. PCT/JP2014/054950, filed on Feb. 27, 2014.

(30) Foreign Application Priority Data

Mar. 29, 2013 (JP) ................. 2013-073754

(51) Int. Cl.
G03F 7/039 (2006.01)
G03F 1/50 (2012.01)
G03F 1/76 (2012.01)
G03F 7/32 (2006.01)
G03F 7/004 (2006.01)
G03F 7/20 (2006.01)

(52) U.S. Cl.
CPC ............... *G03F 7/039* (2013.01); *G03F 1/50* (2013.01); *G03F 1/76* (2013.01); *G03F 7/0045* (2013.01); *G03F 7/0397* (2013.01); *G03F 7/20* (2013.01); *G03F 7/2004* (2013.01); *G03F 7/2039* (2013.01); *G03F 7/2059* (2013.01); *G03F 7/32* (2013.01)

(58) Field of Classification Search
CPC .......... G03F 7/039; G03F 7/2059; G03F 1/50; G03F 7/2039; G03F 1/76; G03F 7/32; G03F 7/2004; G03F 7/20; G03F 7/0397; G03F 7/0045; G03F 1/78
See application file for complete search history.

(56) References Cited

U.S. PATENT DOCUMENTS 5,120,633 A * 6/1992 Bauer ................... G03F 7/0045
430/176
2004/0091817 A1 5/2004 Komatsu et al.
2008/0096128 A1 4/2008 Takeda et al.
2010/0009299 A1 1/2010 Watanabe et al.
2011/0008735 A1* 1/2011 Ohsawa ................ G03F 7/0397
430/326
2011/0200941 A1* 8/2011 Masunaga ............. G03F 7/0392
430/270.1
2014/0099572 A1 4/2014 Inasaki et al.
2014/0349221 A1* 11/2014 Takizawa .............. G03F 7/0045
430/9

FOREIGN PATENT DOCUMENTS

| JP | 2000-029216 | | 1/2000 |
|---|---|---|---|
| JP | 2001-330956 A | * | 11/2001 |
| JP | 2002-006500 | | 1/2002 |
| JP | 2002-006500 A | * | 1/2002 |
| JP | 2002-131916 | | 5/2002 |
| JP | 2002-365802 | | 12/2002 |
| JP | 2004-158287 | | 6/2004 |
| JP | 2005-275072 | | 10/2005 |
| JP | 2008-102383 | | 5/2008 |
| JP | 2008-162101 | | 7/2008 |
| JP | 2010-061087 | | 3/2010 |
| JP | 2010-164933 | | 7/2010 |
| JP | 2011-016746 | | 1/2011 |
| JP | 2012-252124 | | 12/2012 |
| JP | 2013-020226 | | 1/2013 |
| KR | 20080035985 | | 4/2008 |
| KR | 20110004799 | | 1/2011 |
| WO | WO-2013/121819 A1 | * | 8/2013 |

OTHER PUBLICATIONS

"amine oxides" PAC. 1995, 67, 1307 (Glossary of class names of organic compounds and reactivity intermediates based on structure (IUPAC Recommendations 1995) on p. 1316.*
English translation of JP, 2001-330956, A (2001) from machine translation from AIPN Japan Patent Office National Center for Industrial Property Information and Training, generated Feb. 3, 2016. 1 to 52 pages and 1 to 32 pages.*
English translation of JP 2002-006500, A (2002) from machine translation from AIPN Japan Patent Office National Center for Industrial Property Information and Training, generated Aug. 11, 2016, 43 pages.*

(Continued)

*Primary Examiner* — Cynthia Hamilton
(74) *Attorney, Agent, or Firm* — Jianq Chyun IP Office

(57) ABSTRACT

There is provided an actinic ray-sensitive or radiation-sensitive resin composition containing: a resin (A) containing a repeating unit represented by a specific formula (1), and an ionic compound (B) represented by a specific formula (2), a resist film formed by using the actinic ray-sensitive or radiation-sensitive resin composition, a pattern forming method including: (a) a step of forming the resist film, (b) a step of exposing the film, and (c) a step of developing the exposed film using a developer to form a pattern.

11 Claims, No Drawings

(56) References Cited

OTHER PUBLICATIONS

"International Search Report (Form PCT/ISA/210)", mailed on Mar. 25, 2014, with English translation thereof, pp. 1-6, in which nine of the listed references (JP2008-102383A, JP2010-164933A, JP2013-020226A, JP2010-061087A, JP2005-275072A, JP2012-252124A, JP2000-029216A, JP2002-131916A and JP2002-365802A) were cited.

"Written Opinion of the International Searching Authority of PCT/JP2014/054950", this report contains the following items: Form PCT/ISA237(cover sheet), PCT/ISA237(Box No. I) and PCT/ISA237(Box No.V), mailed on Mar. 25, 2014, which is English translation of "Written Opinion of the International Searching Authority", pp. 1-9.

"Office Action of Japan Counterpart Application", issued on Mar. 22, 2016, pp. 1-9, with machine English translation tereof.

"Office Action of Korea Counterpart Application", issued on Feb. 16, 2017, p. 1-p. 14, with machine English translation thereof.

* cited by examiner

ACTINIC RAY-SENSITIVE OR RADIATION-SENSITIVE RESIN COMPOSITION, RESIST FILM, RESIST-COATED MASK BLANK, PHOTOMASK AND PATTERN FORMING METHOD, AND METHOD FOR PRODUCING ELECTRONIC DEVICE USING THEM, AND ELECTRONIC DEVICE

CROSS REFERENCE TO RELATED APPLICATION

This is a continuation of International Application No. PCT/JP2014/054950 filed on Feb. 27, 2014, and claims priority from Japanese Patent Application No. 2013-073754 filed on Mar. 29, 2013, the entire disclosures of which are incorporated therein by reference.

TECHNICAL FIELD

The present invention relates to an actinic ray-sensitive or radiation-sensitive resin composition, a resist film using the same, a resist-coated mask blank, a photomask and a pattern forming method, and a method for producing an electronic device using them, and an electronic device. In particular, the invention relates to an actinic ray-sensitive or radiation-sensitive resin composition, which is suitably used in an ultra-micro lithography process applicable to a production process of VLSI and high capacity microchip, a preparation process of a nanoimprint mold, a production process of a high-density information recording medium and the like, and in other photofabrication processes, a resist film using the same, and a pattern forming method. More particularly, the invention relates to an actinic ray-sensitive or radiation-sensitive resin composition suitably employed in microfabrication of semiconductor device using an electron beam, an X-ray or EUV light, a resist film using the same, a resist-coated mask blank, a photomask and a pattern forming method, and a method for producing an electronic device using them, and an electronic device.

BACKGROUND ART

In the microfabrication using a resist composition, with an increase in the integration degree of an integrated circuit, formation of an ultrafine pattern is required. With such a trend, an exposure wavelength tends to become shorter, for example, from g-line to i-line to KrF laser or ArF laser, and further in recent years, development of a lithography technique using an electron beam, an X-ray or EUV light in place of an excimer laser beam proceeds.

However, from the standpoint of comprehensive performance as a resist, it is extremely difficult to find an adequate combination of a resin, a photo-acid generator, a basic compound, an additive, a solvent and the like to be used and in particular, the recent demand of forming an ultrafine pattern (for example, having a line width of 50 nm or less) with high performance is actually not yet sufficiently fulfilled. Further, the microfabrication using a resist composition is not only directly used in the production of integrated circuit but also is applied to the production of a so-called imprint mold structure in recent years. Thus, in order to sufficiently respond to these applications, it becomes an important problem to form an ultrafine pattern (for example, having a line width of 50 nm or less) in a state where high sensitivity and high resolution are satisfied at the same time.

In the electron beam (EB) lithography, it is known that the influence of electron scattering in the resist film, that is, forward scattering, is reduced by increasing the accelerating voltage of EB. Therefore, in recent years, there is a tendency to increase the accelerating voltage of EB. However, when the accelerating voltage of EB is increased, the influence of scattering of electrons reflected on a resist substrate, that is, back scattering increases instead of reducing the influence of forward scattering. The influence of the back scattering is particularly large in the case of forming an isolated line pattern having a large exposure area. Therefore, the increase of accelerating voltage of EB may cause, for example, reduction in the resolution of an isolated line pattern.

In particular, in the case of patterning a photomask blank used for semiconductor exposure, since a light-shielding film containing a heavy atom, for example, chromium, molybdenum or tantalum is present as an underlayer of the resist film, the influence of the back scattering attributable to refection from the resist underlayer is more prominent in comparison with the case of coating a resist on a silicon wafer. Therefore, the case of forming an isolated line pattern on a photomask blank is susceptible to the influence of the back scattering and the resolution is highly likely to decrease.

A chemical amplification positive resist is, in general, a photosensitive composition containing a compound (photo-acid generator) which generates a strong acid upon light irradiation and a compound in which a hydrophobic acid-unstable group is decomposed upon a catalyst action of the acid generated, thereby converting the compound to an alkali-soluble substance. The photosensitive composition may further contain a basic compound in order to inhibit dark reaction in the unexposed area. The presence of the basic compound makes it possible to deactivate an acid generated due to the influence of electrons scattered through a neutralization reaction to suppress decomposition of the acid-unstable group in the unexposed area. However, in the case of using an amine as the basic compound, since the amine evaporates from the film in each step of resist film formation, exposure and after heating, suppression of the decomposition reaction of the acid-unstable group in the unexposed area is insufficient.

Thus, methods of using various ionic compounds as the basic compound have been investigated. For example, in Patent Document 1, a betaine type compound is proposed as the basic compound. However, the structure acting as the base in the betaine type compound is a carboxylic acid anion group and it has slight acidity after the neutralization of the acid generated so that the suppression effect on the decomposition reaction in the unexposed area is insufficient.

Further, the microfabrication using a resist composition is not only directly used in the production of integrated circuit but also is applied to the production of a so-called imprint mold structure in recent years (see, for example, Patent Documents 2 and 3, and Non-Patent Document 1). Therefore, particularly in the case of forming a pattern using an X-ray, a soft X-ray or an electron beam as an exposure light source, it is also an important problem to satisfy high resolution and the resist performance, for example, roughness performance at the same time, and the solution of the problems has been desired.

PRIOR ART DOCUMENT

Patent Document

Patent Document 1: JP-A-2002-6500
Patent Document 2: JP-A-2004-158287
Patent Document 3: JP-A-2008-162101

Non-Patent Document

Non-Patent Document 1: Nanoimprint no Kiso to Gijutsu Kaihatsu•Oyo Tenkai-Nanoimprint no Kiban Gljutsu to Saishin no Gljutsu Tenkai-, complied by Yoshihiko Hirai, Frontier Shuppan (issued June, 2006)

DISCLOSURE OF THE INVENTION

Problems that the Invention is to Solve

An object of the present invention is to provide an actinic ray-sensitive or radiation-sensitive resin composition capable of forming an ultrafine pattern (for example, a pattern formed by all electron beam exposure) while satisfying high vacuum PED stability, high resolution, high rectangularity of pattern profile, less occurrence of bridge and pattern collapse and a state of low line width roughness (LWR) at the same time.

Another object of the invention is to provide a resist film using the actinic ray-sensitive or radiation-sensitive resin composition described above, a pattern forming method, a resist-coated mask blank, a photomask, and a method for producing an electronic device using them, and an electronic device.

Means for Solving the Problems

As a result of the intensive investigations, the inventors have found that the objects described above can be achieved by an actinic ray-sensitive or radiation-sensitive resin composition containing a resin (A) containing a repeating unit represented by formula (1) having a specific structure and an ionic compound (B) having a specific structure.

Specifically, the present invention is as follows.

[1] An actinic ray-sensitive or radiation-sensitive resin composition containing:
a resin (A) containing a repeating unit represented by formula (1) shown below, and
an ionic compound (B) represented by formula (2) shown below:

[Chem. 1]

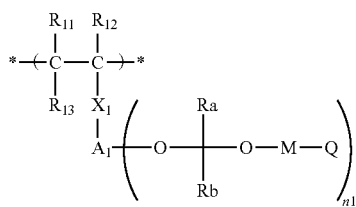

(1)

(2)

wherein in formula (1) above,
$X_1$ represents a single bond or a divalent connecting group,
$A_1$ represents a keto group or an (n1+1) valent aromatic ring group,
each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may be connected to $A_1$ to form a ring and in this case $R_{13}$ represents an alkylene group,
Ra represents an alkyl group having 2 or more carbon atoms, a cycloalkyl group, an aryl group, an aralkyl group or a heterocyclic group,
Rb represents a hydrogen atom, an alkyl group, a cycloalkyl group, an aryl group, an aralkyl group or a heterocyclic group,
M represents a single bond or a divalent connecting group,
Q represents an alkyl group, a cycloalkyl group, an aryl group, an aralkyl group or a heterocyclic group,
Ra and Rb may be connected to form a ring, at least two of Ra, M and Q may be connected to form a ring,
when $A_1$ is a keto group, n1 represents 1, and when $A_1$ is an (n+1) valent aromatic ring group, n1 represents an integer from 1 to 4, when n1 is 2 or more, each of a plurality of Ra, each of a plurality of Rb, each of a plurality of M and each of a plurality of Q may be the same as or different from every other Ra, Rb, M and Q, respectively,
in formula (2) above,
$A^-$ represents an organic acid anion,
L represents a single bond or a divalent connecting group,
cation $X^+$ represents a nitrogen cation or a sulfur cation,
each Rx independently represents an alkyl group, a cycloalkyl group, an aryl group, an aralkyl group or a heterocyclic group, a plurality of Rx may be connected to each other to from a ring, and the ring formed may contain a nitrogen atom, an oxygen atom or a sulfur atom, as a ring member, n2 represents 3, when $X^+$ is a nitrogen cation, and n2 represents 2, when $X^+$ is a sulfur cation.

[2] The actinic ray-sensitive or radiation-sensitive resin composition as described in [1],
wherein the resin (A) is a resin containing a repeating unit represented by formula (3) shown below:

[Chem. 2]

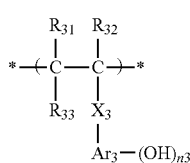

(3)

wherein in formula (3) above,
each of $R_{31}$, $R_{32}$ and $R_{33}$ independently represents a hydrogen atom, an alkyl group, a cycloalkyl group, a halogen atom, a cyano group or an alkoxycarbonyl group, $R_{33}$ may be connected to $Ar_3$ to form a ring and in this case $R_{33}$ represents an alkylene group,
$X_3$ represents a single bond or a divalent connecting group,
$Ar_3$ represents an (n3+1) valent aromatic ring group, and when $Ar_3$ is connected to $R_{33}$ to form a ring, $Ar_3$ represents an (n3+2) valent aromatic ring group, and
n3 represents an integer from 1 to 4.

[3] The actinic ray-sensitive or radiation-sensitive resin composition as described in [1] or [2], wherein in formula (2) above, A⁻ is a carboxylic acid anion or a sulfonic acid anion.

[4] The actinic ray-sensitive or radiation-sensitive resin composition as described in any one of [1] to [3], wherein in formula (2) above, L is a group selected from any of an alkylene group, a cycloalkylene group and an arylene group.

[5] The actinic ray-sensitive or radiation-sensitive resin composition as described in any one of [1] to [4], wherein in formula (1) above, Ra has a structure represented by formula (4) shown below, and Rb is a hydrogen atom:

[Chem. 3]

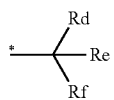

(4)

wherein in formula (4),

Rd represents an alkyl group, a cycloalkyl group or an aryl group, and each of Re and Rf independently represents a hydrogen atom, an alkyl group, a cycloalkyl group or an aryl group, Rd may be connected to any one of Re and Rf or both of them to form a ring structure.

[6] A resist film formed by using the actinic ray-sensitive or radiation-sensitive resin composition as described in any one of [1] to [5].

[7] A pattern forming method including:

(a) a step of forming the resist film as described in [6], (b) a step of exposing the film, and (c) a step of developing the exposed film using a developer to form a pattern.

[8] The pattern forming method as described in [7], wherein the exposure is performed using an X-ray, an electron beam or EUV.

[9] A resist-coated mask blank coated with the resist film as described in [6].

[10] A resist pattern forming method including:

exposing the resist-coated mask blank as described in [9], and developing the exposed mask blank.

[11] A photomask obtained by exposing and developing the resist-coated mask blank as described in [9].

[12] A method for producing an electronic device including the pattern forming method as described in [7] or [8].

[13] An electronic device produced by the method for producing an electronic device as described in [12].

Further, the present invention preferably has the constitution described below.

[14] The actinic ray-sensitive or radiation-sensitive resin composition as described in any one of [1] to [5] above, wherein the cation X⁺ is a nitrogen cation.

[15] The actinic ray-sensitive or radiation-sensitive resin composition as described in any one of [1] to [5] and [14] above, wherein in formula (1) above $X_1$ is a single bond, and $A_1$ is an (n1+1) valent aromatic ring group.

[16] The actinic ray-sensitive or radiation-sensitive resin composition as described in any one of [1] to [5], [14] and [15] above, which further contains a compound capable of generating an acid upon irradiation with an actinic ray or radiation.

[17] The actinic ray-sensitive or radiation-sensitive resin composition as described in any one of [1] to [5] and [14] to [16] above, which is used for electron beam exposure.

[18] The actinic ray-sensitive or radiation-sensitive resin composition as described in any one of [1] to [5] and [14] to [17] above, which further contains a surfactant.

Advantage of the Invention

According to the invention, an actinic ray-sensitive or radiation-sensitive resin composition capable of forming an ultrafine pattern (for example, a pattern formed by an electron beam exposure) while satisfying high vacuum PED stability, high resolution, high rectangularity of pattern profile, less occurrence of bridge and pattern collapse and a state of low LWR at the same time can be provided.

Also, according to the invention, a resist film using the actinic ray-sensitive or radiation-sensitive resin composition described above, a pattern forming method, a resist-coated mask blank, a photomask, and a method for producing an electronic device using them, and an electronic device can be provided.

MODE FOR CARRYING OUT THE INVENTION

Embodiments of the invention will be described in detail hereinafter.

With respect to the description of a group (atomic group) in the specification, the group, which is not particularly referred to whether it is substituted or not, encompasses both a group having no substituent and a group having a substituent. For instance, the description of an "alkyl group" encompasses not only an alkyl group having no substituent (an unsubstituted alkyl group) but also an alkyl group having a substituent (a substituted alkyl group).

In the specification, light includes not only an extreme ultraviolet ray (EUV light) but also an electron beam.

Also, in the specification, unless otherwise noted, the "exposure" includes not only exposure with an extreme ultraviolet ray (EUV light) but also lithography with an electron beam.

In the specification, "actinic ray" or "radiation" means, for example, a bright line spectrum of mercury lamp, a far-ultraviolet ray typified by excimer laser, an extreme-ultraviolet ray (EUV light), an X-ray or an electron beam. Also, in the invention, light means an actinic ray or radiation. In the specification, unless otherwise noted, "exposure" includes not only exposure to a mercury lamp, a far ultraviolet ray typified by excimer laser, an X-ray, EUV light or the like but also lithography with a particle beam, for example, an electron beam or an ion beam.

The actinic ray-sensitive or radiation-sensitive resin composition according to the invention contains a resin (A) containing a repeating unit represented by formula (1) shown below and an ionic compound (B) represented by formula (2) shown below.

[Chem. 4]

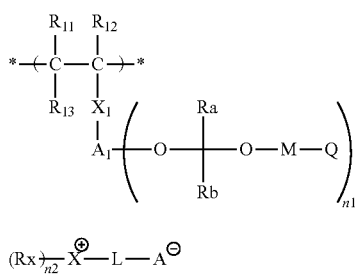

(1)

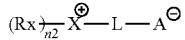

(2)

In formula (1) above, $X_1$ represents a single bond or a divalent connecting group.

$A_1$ represents a keto group or an (n1+1) valent aromatic ring group, and each of $R_{11}$, $R_{12}$ and $R_{13}$ independently represents a hydrogen atom, an alkyl group, a cycloalkyl group, a halogen atom, a cyano group or an alkoxycarbonyl group.

$R_{13}$ may be connected to $A_1$ to form a ring and in this case $R_{13}$ represents an alkylene group.

Ra represents an alkyl group having 2 or more carbon atoms, a cycloalkyl group, an aryl group, an aralkyl group or a heterocyclic group, and Rb represents a hydrogen atom, an alkyl group, a cycloalkyl group, an aryl group, an aralkyl group or a heterocyclic group.

M represents a single bond or a divalent connecting group. Q represents an alkyl group, a cycloalkyl group, an aryl group, an aralkyl group or a heterocyclic group. Ra and Rb may be connected to form a ring. At least two of Ra, M and Q may be connected to form a ring.

When $A_1$ is a keto group, n1 represents 1, and when $A_1$ is an (n+1) valent aromatic ring group, n1 represents an integer from 1 to 4. When n1 is 2 or more, each of a plurality of Ra, each of a plurality of Rb, each of a plurality of M and each of a plurality of Q may be the same as or different from every other Ra, Rb, M and Q, respectively.

In formula (2) above, $A^-$ represents an organic acid anion, L represents a single bond or a divalent connecting group, cation $X^+$ represents a nitrogen cation or a sulfur cation, each Rx independently represents an alkyl group, a cycloalkyl group, an aryl group, an aralkyl group or a heterocyclic group. A plurality of Rx may be connected to each other to from a ring, and the ring formed may contain a nitrogen atom, an oxygen atom or a sulfur atom, as a ring member.

n2 represents 3, when $X^+$ is a nitrogen cation, and n2 represents 2, when $X^+$ is a sulfur cation.

The reason why an ultrafine pattern (for example, a pattern formed by an electron beam exposure) can be formed while satisfying high vacuum PED stability, high resolution, high rectangularity of pattern profile, less occurrence of bridge and pattern collapse and a state of low LWR at the same time by the actinic ray-sensitive or radiation-sensitive resin composition according to the invention is not necessarily clear, but it is estimated as follows.

Also, it is believed that because the ionic compound (B) has the specific structure represented by formula (2), the ionic compound (B) has high diffusibility in the resist film in comparison with a conventional ionic quencher (for example, an alkylammonium hydroxide). Also, it is believed that an acid-decomposable group in the repeating unit represented by formula (1) contained in the resin (A) tends to have a low activation energy (Ea). It is estimated that due to the high diffusibility of the compound (B) and the low Ea of the acid-decomposable group in the resin (A), in the formation of ultrafine pattern (for example, a pattern formed by an electron beam exposure), high resolution is obtained, the rectangularity of pattern profile is improved, bridge and pattern collapse are suppressed, and LWR becomes low.

Also, it is estimated that because the ionic compound (B) having the specific structure represented by formula (2) has low volatility, the vacuum PED stability is enhanced, and the rectangularity of pattern profile is improved, and the pattern collapse is suppressed.

The actinic ray-sensitive or radiation-sensitive resin composition according to the invention is typically a resist composition, and although it may be used as a positive type resist composition or a negative type resist composition, it is preferably used as a positive type resist composition because a particularly large effect can be obtained. Also, the composition according to the invention is typically a chemical amplification resist composition.

[1] Resin Containing Repeating Unit Represented by Formula (1) Shown Below (A)

The actinic ray-sensitive or radiation-sensitive resin composition according to the invention contains a resin containing a repeating unit represented by formula (1) shown below (A) (hereinafter, also referred to as "Resin (A)").

The repeating unit represented by formula (1) shown below is a repeating unit having a group which is decomposed by an action of an acid to generate a polar group (hereinafter, also referred to as an "acid-decomposable group"), and the resin (A) is a resin containing an acid-decomposable group. The acid-decomposable group will be described in detail later.

(1)

[Chem. 5]

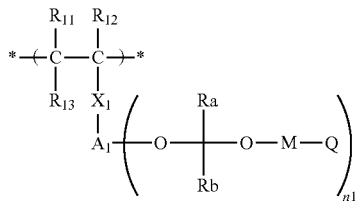

In formula (1) above, $X_1$ represents a single bond or a divalent connecting group.

$A_1$ represents a keto group or an (n1+1) valent aromatic ring group.

Each of $R_{11}$, $R_{12}$ and $R_{13}$ independently represents a hydrogen atom, an alkyl group, a cycloalkyl group, a halogen atom, a cyano group or an alkoxycarbonyl group.

$R_{13}$ may be connected to $A_1$ to form a ring and in this case $R_{13}$ represents an alkylene group.

Ra represents an alkyl group having 2 or more carbon atoms, a cycloalkyl group, an aryl group, an aralkyl group or a heterocyclic group, and Rb represents a hydrogen atom, an alkyl group, a cycloalkyl group, an aryl group, an aralkyl group or a heterocyclic group.

M represents a single bond or a divalent connecting group. Q represents an alkyl group, a cycloalkyl group, an aryl group, an aralkyl group or a heterocyclic group. Ra and Rb may be connected to form a ring. At least two of Ra, M and Q may be connected to form a ring.

When $A_1$ is a keto group, n1 represents 1, and when $A_1$ is an (n+1) valent aromatic ring group, n1 represents an integer from 1 to 4. When n1 is 2 or more, each of a plurality of Ra, each of a plurality of Rb, each of a plurality of M and each of a plurality of Q may be the same as or different from every other Ra, Rb, M and Q, respectively.

The alkyl group represented by any of $R_{11}$ to $R_{13}$ in formula (1) is preferably an alkyl group having 20 or less carbon atoms which may have a substituent, for example, a methyl group, an ethyl group, a propyl group, an isopropyl group, an n-butyl group, a sec-butyl group, a hexyl group, a 2-ethylhexyl group, an octyl group or a dodecyl group, and more preferably an alkyl group having 8 or less carbon atoms.

The alkyl group contained in the alkoxycarbonyl group is preferably the same as the alkyl group represented by any of $R_{11}$ to $R_{13}$ above.

The cycloalkyl group may be a monocyclic type or a polycyclic type, and is preferably a monocyclic type cycloalkyl group having from 3 to 10 carbon atoms which may have a substituent, for example, a cyclopropyl group, a cyclopentyl group or a cyclohexyl group.

The halogen atom includes a fluorine atom, a chlorine atom, a bromine atom and an iodine atom, and is preferably a fluorine atom.

Preferred substituents in the groups described above include, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The number of carbon atoms in the substituent is preferably 8 or less.

Also, in the case where $R_{13}$ is an alkylene group and forms a ring together with $A_1$, the alkylene group is preferably an alkylene group having from 1 to 8 carbon atoms, for example, a methylene group, an ethylene group, a propylene group, a butylene group, a hexylene group or an octylene group. An alkylene group having from 1 to 4 carbon atoms is more preferred, and an alkylene group having from 1 to 2 carbon atoms is particularly preferred. The ring formed by connecting $R_{13}$ and $A_1$ is particularly preferably a 5-membered or 6-membered ring.

In formula (1), each of $R_{11}$ and $R_{12}$ is more preferably a hydrogen atom, an alkyl group or a halogen atom, and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{13}$ is more preferably a hydrogen atom, an alkyl group, a halogen atom or an alkylene group (forming a ring together with $L_5$), and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring together with $A_1$) or an ethylene group (forming a ring together with $A_1$).

The divalent connecting group represented by $X_1$ includes, for example, —COO—, —$CONR_{14}$— (wherein $R_{14}$ represents a hydrogen atom or an alkyl group), an alkylene group, and a group composed of a combination of two or more thereof. The alkyl group represented by $R_{14}$ includes the same as the alkyl group represented by any of $R_{11}$ to $R_{13}$.

$X_1$ is preferably a single bond, —COO— or —CONH—, more preferably a single bond or —COO—, and still more preferably a single bond.

$A_1$ represents a keto group or an (n1+1) valent aromatic ring group, and is preferably an (n1+1) valent aromatic ring group.

In the case where n1 is 1, the divalent aromatic ring group may have a substituent, preferred examples thereof include, for example, an arylene group having from 6 to 18 carbon atoms, for example, a phenylene group, a tolylene group or a naphthylene group, and a divalent aromatic ring group containing a hetero ring, for example, thiophene, furan, pyrrole, benzothiophene, benzofuran, benzopyrrole, triazine, imidazole, benzimidazole, triazole, thiadiazole or thiazole.

Specific examples of the (n1+1) valent aromatic ring group in the case where n is an integer of 2 or more preferably include groups formed by removing an (n1−1) number of appropriate hydrogen atoms from the specific examples of the divalent aromatic ring group described above.

The (n1+1) valent aromatic ring group may further has a substituent.

The substituent which the (n1+1) valent aromatic ring group described above may have includes the specific examples of the substituents which the respective groups represented by any of $R_{11}$ to $R_{13}$ may have.

When $A_1$ is an (n1+1) valent aromatic ring group, n1 is preferably 1 or 2, and more preferably 1.

The alkyl group represented by Ra is, for example, an alkyl group having from 2 to 8 carbon atoms, and specifically preferably includes a methyl group, an ethyl group, a propyl group, an n-butyl group, a sec-butyl group, a tert-butyl group, a hexyl group and an octyl group.

The alkyl group represented by Rb is, for example, an alkyl group having from 1 to 8 carbon atoms, and specifically preferably includes a methyl group, an ethyl group, a propyl group, an n-butyl group, a sec-butyl group, a tert-butyl group, a hexyl group and an octyl group.

The cycloalkyl group represented by any of Ra and Rb is, for example, a cycloalkyl group having from 3 to 15 carbon atoms, and specifically preferably includes, for example, a cyclopentyl group, a cyclohexyl group, a norbornyl group and an adamantyl group.

The aryl group represented by any of Ra and Rb is, for example, an aryl group having from 6 to 15 carbon atoms, and specifically preferably includes, for example, a phenyl group, a tolyl group, a naphthyl group and an anthryl group.

The aralkyl group represented by any of Ra and Rb is preferably an aralkyl group having from 6 to 20 carbon atoms, and more preferably an aralkyl group having from 7 to 12 carbon atoms. Specific examples of the aralkyl group represented by any of Ra and Rb include a benzyl group, a phenethyl group, a naphthylmethyl group and a naphthylethyl group.

The heterocyclic group represented by any of Ra and Rb is preferably a heterocyclic group having from 6 to 20 carbon atoms, and more preferably a heterocyclic group having from 6 to 12 carbon atoms. Specific examples of the heterocyclic group represented by any of Ra and Rb include a pyridyl group, a pirazyl group, a tetrahydrofuranyl group, a tetrahydropyranyl group, a tetrahydrothiophenyl group, a piperidyl group, a piperazyl group, a furanyl group, a pyrenyl group and a chromanyl group.

In the formula (1) described above, from the standpoint of adequate stability and adequate acid decomposition reactivity of the acid-decomposable group, it is preferred that Ra has a structure represented by formula (4) shown below, and Rb is a hydrogen atom.

[Chem> 6]

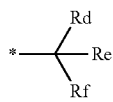

(4)

In formula (4) above, Rd represents an alkyl group, a cycloalkyl group or an aryl group, and each of Re and Rf independently represents a hydrogen atom, an alkyl group, a cycloalkyl group or an aryl group. Rd may be connected to any one of Re and Rf or both of them to form a ring structure.

The alkyl group represented by any of Rd, Re and Rf includes the same as the alkyl group described above as the alkyl group represented by Rb.

The cycloalkyl group and the aryl group represented by any of Rd, Re and Rf include the same as the cycloalkyl group and the aryl group described above as the cycloalkyl group and the aryl group represented by any of Ra and Rb, respectively.

The divalent connecting group represented by M includes, for example, an alkylene group (for example, a methylene group, an ethylene group, a propylene group, a butylene group, a hexylene group or an octylene group), a cycloalkylene group (for example, a cyclopentylene group, a cyclohexylene group or an adamantylene group), an alkenylene group (for example, an ethenylene group, a propenylene group or a butenylene group), a divalent aromatic ring group (for example, a phenylene group, a tolylene group or a naphthylene group), —S—, —O—, —CO—, —N($R_0$)— or a divalent connecting group composed of a combination of these plural groups. $R_0$ represents a hydrogen atom or an alkyl group (for example, an alkyl group having from 1 to 8 carbon atoms, specifically, for example, a methyl group, an ethyl group, a propyl group, an n-butyl group, a sec-butyl group, a hexyl group or an octyl group).

Specific examples and preferred examples of the alkyl group represented by Q are, for example, the same as those described as to the alkyl group represented by Rb above.

The cycloalkyl group represented by Q may be a monocyclic type or a polycyclic type. The number of carbon atoms in the cycloalkyl group is preferably from 3 to 10. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$0.0$^{2,7}$]dodecyl group, a 8-tricyclo[5.2.1.0$^{2,6}$]decyl group and a 2-bicyclo[2.2.1]heptyl group. Among them, a cyclopentyl group, a cyclohexyl group, a 2-adamantyl group, a 8-tricyclo[5.2.1.0$^{2,6}$]decyl group and a 2-bicyclo[2.2.1]heptyl group are preferred.

Specific examples and preferred examples of the aryl group represented by Q are, for example, the same as those described as to the aryl group represented by Ra above.

Specific examples and preferred examples of the heterocyclic group represented by Q are, for example, the same as those described as to the heterocyclic group represented by Ra above.

The alkyl group, cycloalkyl group, aryl group and heterocyclic group represented by Q may have a substituent, and specific examples thereof include the same as the substituents which the respective groups represented by any of $R_{11}$ to $R_{13}$ may have.

At least two of Q, M and Ra may be connected to form a ring (preferably, a 5-membered or 6-membered ring).

The ring which may be formed by connecting at least two of Q, M and Ra includes a case where at least two of Q, M and Ra are connected to form, for example, a propylene group or a butylene group so as to form a 5-membered or 6-membered ring containing an oxygen atom.

The groups represented by Ra, Rb, M and Q in formula (1) may have a substituent, and specific examples thereof include, for example, the same as the substituents which the respective groups represented by any of $R_{11}$ to $R_{13}$ may have. The number of carbon atoms in the substituent is preferably 8 or less.

Specific examples of the repeating unit represented by formula (1) are set forth below, but the invention should not be construed as being limited thereto.

[Chem. 7]

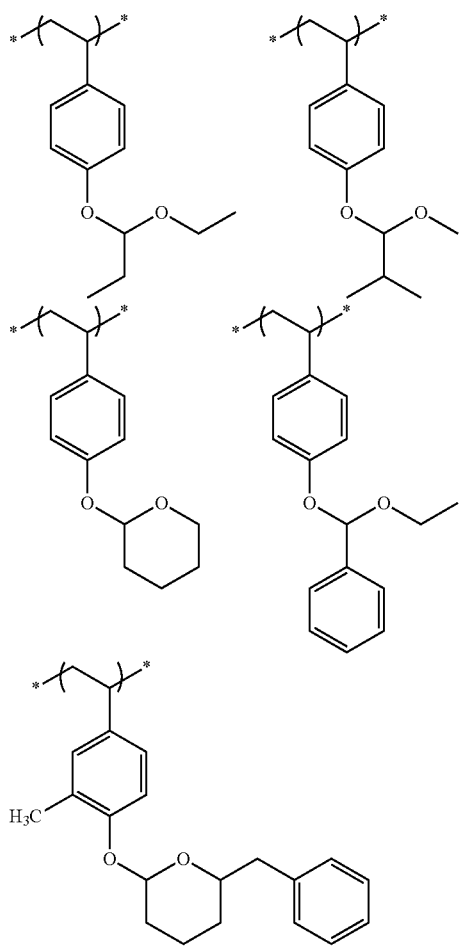

-continued
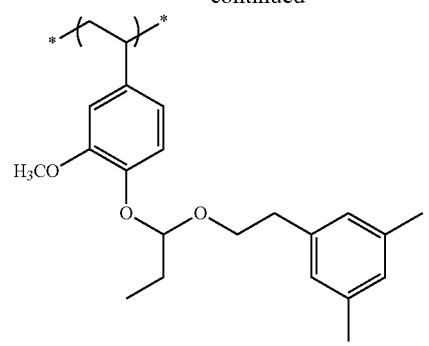
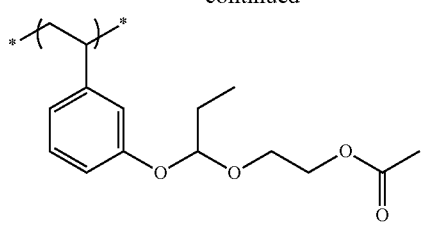
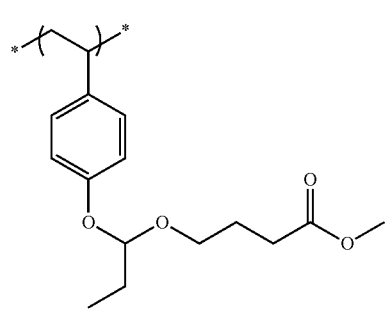
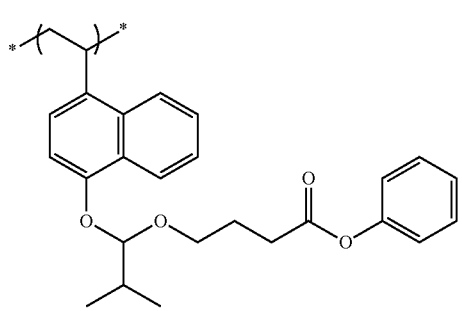
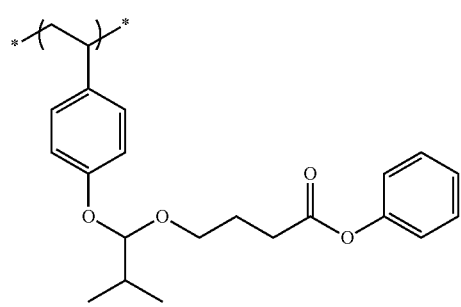
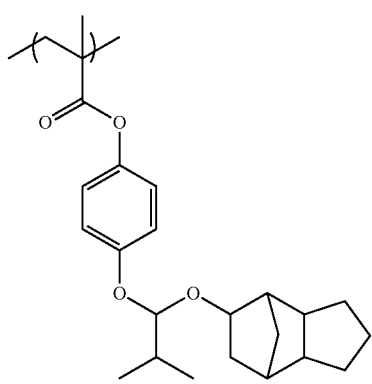
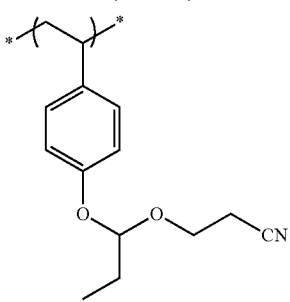
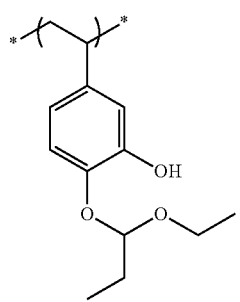
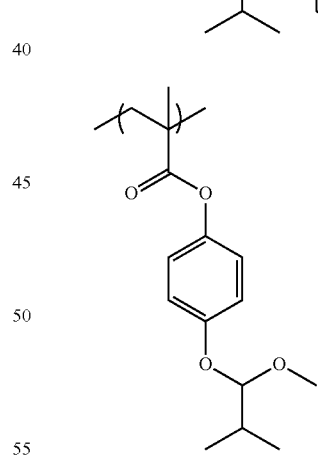
[Chem. 8]
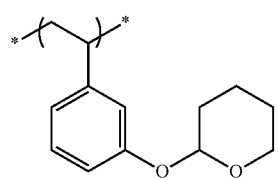
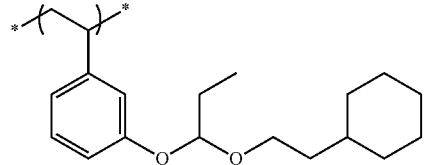
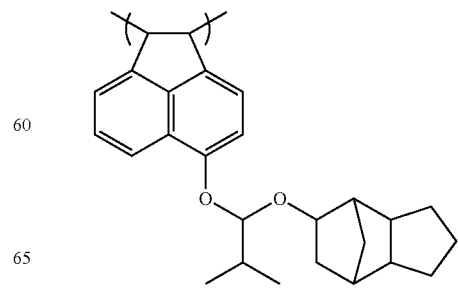

-continued
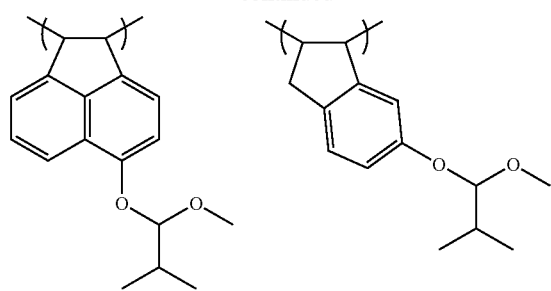
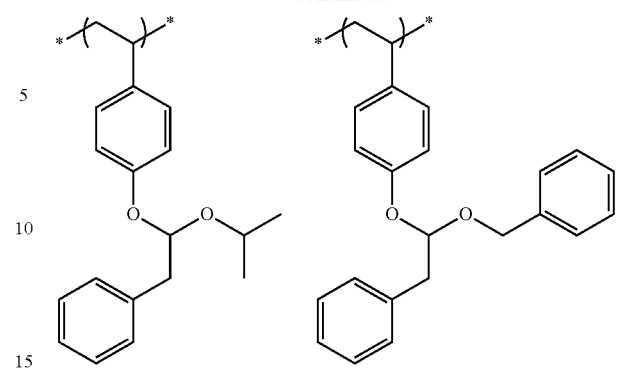
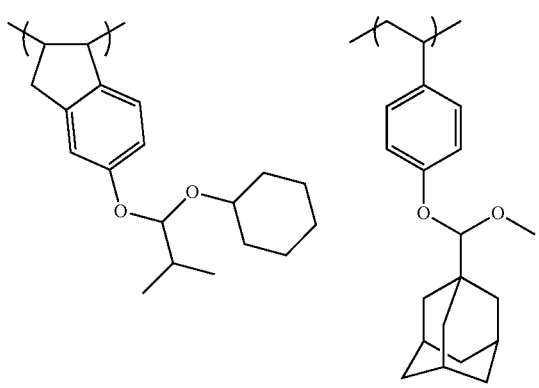
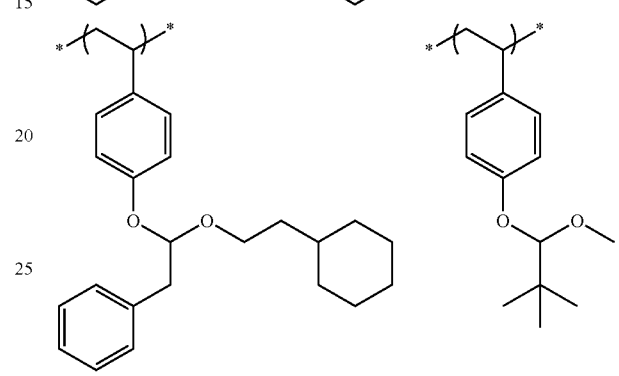
[Chem. 9]
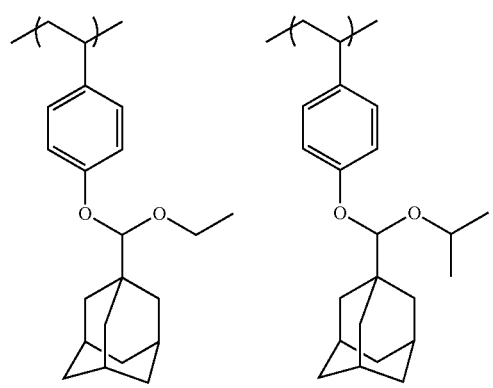
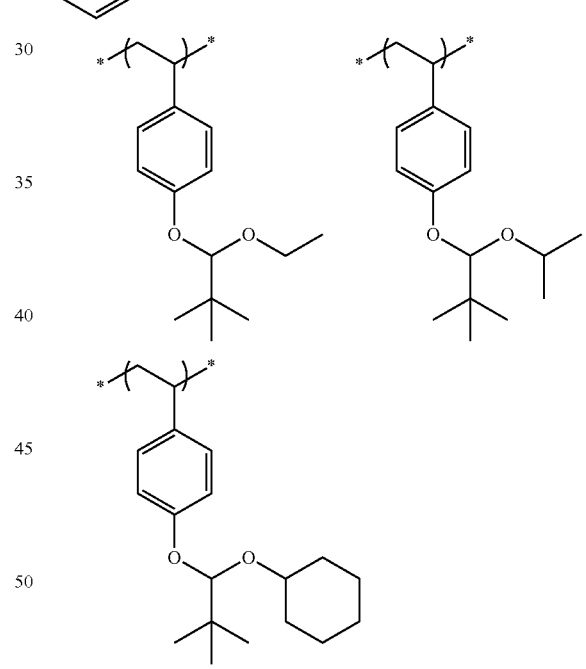
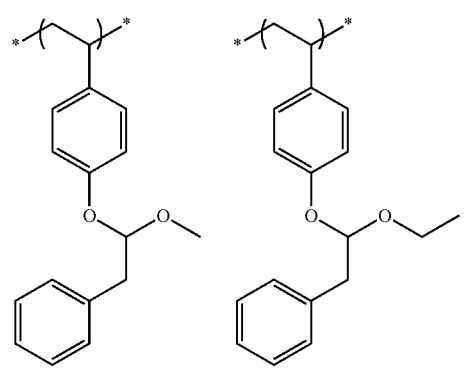
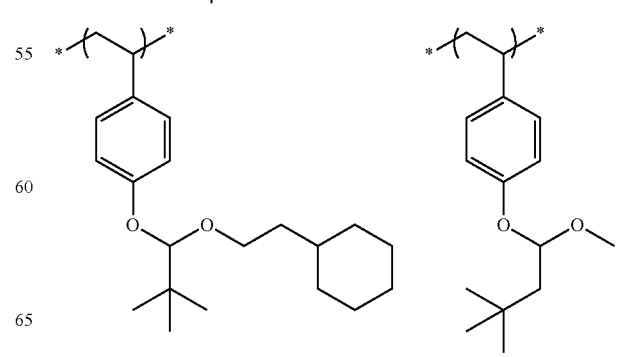

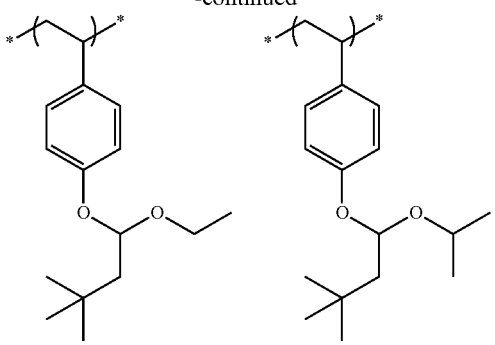
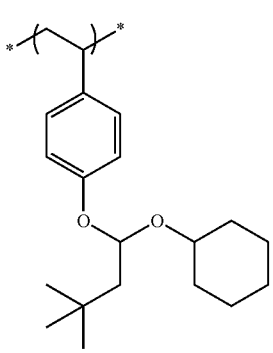
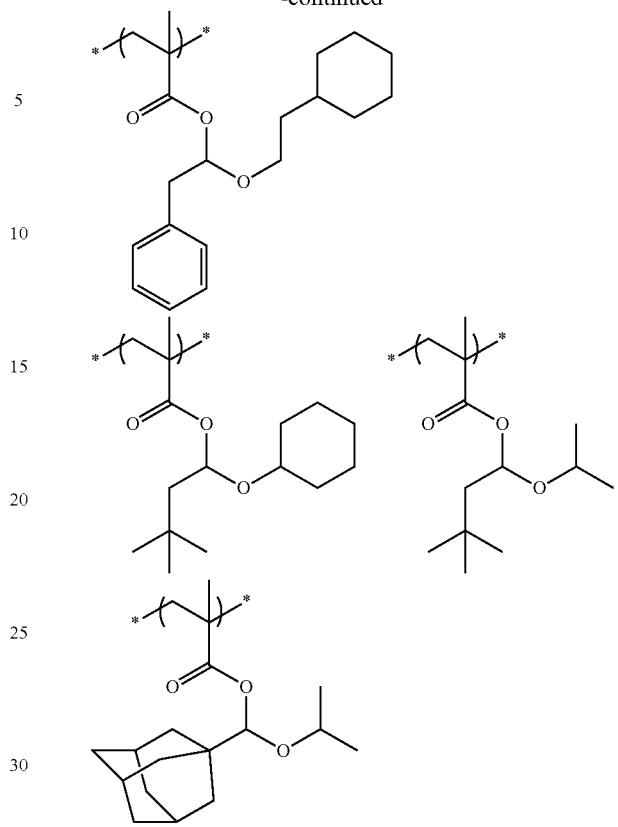
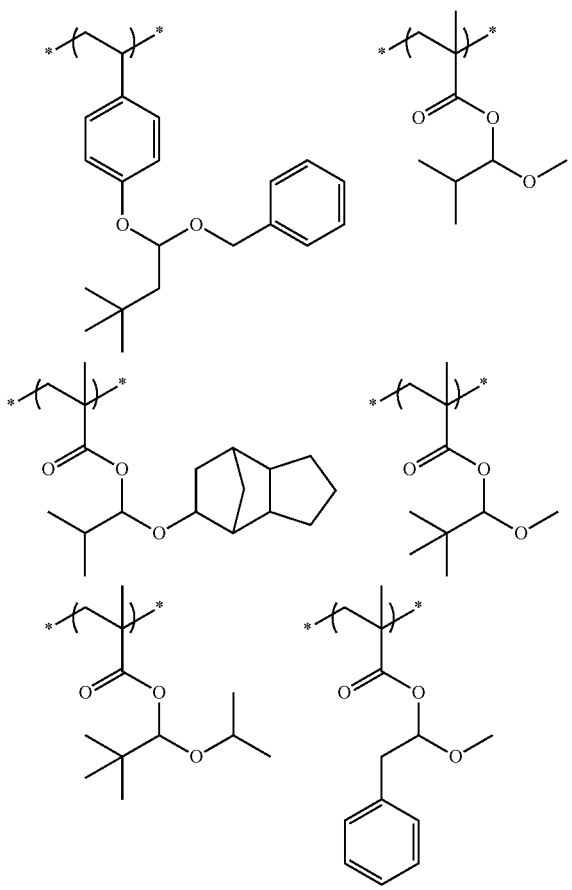

In the resin (A), the repeating unit represented by formula (1) described above may be used one kind or in combination of two or more kinds thereof.

The content of the repeating unit represented by formula (1) described above (in the case of containing plural kinds of repeating units, the total thereof) in the resin (A) is preferably from 5 to 70% by mole, more preferably from 5 to 60% by mole, still more preferably from 10 to 50% by mole, based on the total repeating units in the resin (A).

(a) Repeating Unit Having Acid-Decomposable Group Other than Repeating Unit Represented by Formula (1) Described Above The resin (A) according to the invention may contain a repeating unit having an acid-decomposable group (hereinafter, also referred to as a repeating unit (a)) other than the repeating unit represented by formula (1) described above.

The repeating unit having an acid-decomposable group is preferably, for example, a repeating unit having an acid-decomposable group in the main chain or the side chain, or both of the main chain and the side chain of the resin.

The definition of the polar group is same as the definition described in the section of the repeating unit (c) later, and examples of the polar group which is generated by the decomposition of the acid-decomposable group includes, for example, an alcoholic hydroxyl group, an amino group and an acidic group.

The polar group which is generated by the decomposition of the acid-decomposable group is preferably an acidic group.

The acidic group is not particularly limited as long as it is a group which is insolubilized in a developer containing an organic solvent, and preferably includes, for example, a phenolic hydroxyl group, a carboxylic acid group, a sulfonic acid group, a fluorinated alcohol group, a sulfonamido group, a sulfonylimido group, an (alkylsulfonyl) (alkylcarbonyl)methylene group, an (alkylsulfonyl) (alkylcarbonyl) imido group, a bis(alkylcarbonyl)methylene group, a bis (alkylcarbonyl)imido group, a bis(alkylsulfonyl)methylene group, a bis(alkylsulfonyl)imido group, a tris(alkylcarbonyl) methylene group and a tris(alkylsulfonyl)methylene group, and more preferably an acidic group (a group dissociating in a 2.38% by mass aqueous solution of tetramethyl ammonium hydroxide, which is conventionally used as a developer of resist), for example, a carboxylic acid group, a fluorinated alcohol group (preferably a hexafluoroisopropanol group), a phenolic hydroxyl group or a sulfonic acid group.

A group preferred as the acid-decomposable group is a group where a hydrogen atom of such an acidic group is substituted with a group capable of leaving by an action of an acid.

The group capable of leaving by an action of an acid includes, for example, —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, a group composed of a combination of an alkylene group and an aryl group, or an alkenyl group. $R_{36}$ and $R_{37}$ may be connected to each other to form a ring.

Each of $R_{01}$ and $R_{02}$ independently represents a hydrogen atom, an alkyl group, a cycloalkyl group, an aryl group, a group composed of a combination of an alkylene group and an aryl group, or an alkenyl group.

The acid-decomposable group preferably includes, for example, a cumyl ester group, an enol ester group, an acetal ester group and a tertiary alkyl ester group.

The repeating unit having an acid-decomposable group other than the repeating unit represented by formula (1) described above includes a repeating unit represented by formula (V) shown below.

[Chem. 10]

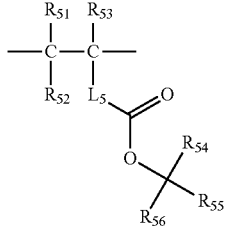

(V)

In formula (V), each of $R_{51}$, $R_{52}$ and $R_{53}$ independently represents a hydrogen atom, an alkyl group, a cycloalkyl group, a halogen atom, a cyano group or an alkoxycarbonyl group, or $R_{52}$ may be connected to $L_5$ to form a ring and in this case $R_{52}$ represents an alkylene group.

$L_5$ represents a single bond or a divalent connecting group, when $L_5$ is connected to $R_{52}$ to form a ring, $L_5$ represents a trivalent connecting group.

$R_{54}$ represents an alkyl group, and each of $R_{55}$ and $R_{56}$ independently represents a hydrogen atom, an alkyl group, a cycloalkyl group, an aryl group or an aralkyl group, or $R_{55}$ and $R_{56}$ may be connected to each other to form a ring, and provided that $R_{55}$ and $R_{56}$ are not hydrogen atoms at the same time.

Formula (V) will be described in more detail below.

Specific examples and preferred examples of the alkyl group, alkoxycarbonyl group, cycloalkyl group and halogen atom represented by any of $R_{51}$ to $R_{53}$ in formula (V) include the same as the specific examples and preferred examples of the alkyl group, alkoxycarbonyl group, cycloalkyl group and halogen atom represented by any of $R_{11}$ to $R_{13}$ in formula (1).

The divalent connecting group represented by $L_5$ includes, for example, an alkylene group, a divalent aromatic ring group, —COO-$L_1$-, —O-$L_1$- and a group composed of a combination of two or more thereof. In the formulae, $L_1$ represents an alkylene group, a cycloalkylene group, a divalent aromatic ring group or a group composed of a combination of an alkylene group and a divalent aromatic ring group.

$L_5$ is preferably a single bond, a group represented by —COO-$L_1$- or a divalent aromatic ring group. $L_1$ is preferably an alkylene group having from 1 to 5 carbon atoms, and more preferably a methylene group or a propylene group. The divalent aromatic ring group is preferably a 1,4-phenylene group, a 1,3-phenylene group, a 1,2-phenylene group or a 1,4-naphthylene group, and more preferably a 1,4-phenylene group.

In the case where $L_5$ is connected to $R_{52}$ to form a ring, the trivalent group represented by $L_5$ preferably includes groups formed by removing one appropriate hydrogen atom from the specific examples of the divalent connecting group represented by $L_5$ described above.

The alkyl group represented by any of $R_{54}$ to $R_{56}$ is preferably an alkyl group having from 1 to 20 carbon atoms, more preferably an alkyl group having from 1 to 10 carbon atoms and particularly preferably an alkyl group having from 1 to 4 carbon atoms, for example, a methyl group, an ethyl group, an n-propyl group, an isopropyl group, an n-butyl group, an isobutyl group or a tert-butyl group.

The cycloalkyl group represented by any of $R_{55}$ and $R_{56}$ is preferably a cycloalkyl group having from 3 to 20 carbon atoms, and may be a monocyclic cycloalkyl group, for example, a cyclopentyl group or a cyclohexyl group, or a polycyclic cycloalkyl group, for example, a norbornyl group, an adamantyl group, a tetracyclodecanyl group or a tetracyclododecanyl group.

Also, the ring formed by connecting $R_{55}$ and $R_{56}$ to each other is preferably a ring having from 3 to 20 carbon atoms, and may be a monocyclic ring, for example, a cyclopentyl group or a cyclohexyl group, or a polycyclic ring, for example, a norbornyl group, an adamantyl group, a tetracyclodecanyl group or a tetracyclododecanyl group. In the case where $R_{55}$ and $R_{56}$ are connected to each other to form a ring, $R_{54}$ is preferably an alkyl group having from 1 to 3 carbon atoms, and more preferably a methyl group or an ethyl group.

The aryl group represented by any of $R_{55}$ and $R_{56}$ is preferably an aryl group having from 6 to 20 carbon atoms, and may be a monocyclic or polycyclic, and may have a substituent. The aryl group include, for example, a phenyl group, a 1-naphthyl group, 2-naphthyl group, 4-methylphenyl group and 4-methoxyphenyl group. When either $R_{55}$ or $R_{56}$ is a hydrogen atom, the other is preferably an aryl group.

The aralkyl group represented by any of $R_{55}$ and $R_{56}$ may be a monocyclic or polycyclic, and may have a substituent. The aralkyl group preferably has from 7 to 21 carbon atoms, and includes a benzyl group and a 1-naphthylmethyl group.

As to a synthesis method of monomer corresponding to the repeating unit represented by formula (V), a common synthesis method of a polymerizable group-containing ester is able to be applied, and the method is not particularly limited.

Specific examples of the repeating unit (a) represented by formula (V) are set forth below, but the invention should not be construed as being limited thereto.

In the specific examples, each of Rx and $Xa_1$ represents a hydrogen atom, $CH_3$, $CF_3$ or $CH_2OH$. Each of Rxa and Rxb independently represents an alkyl group having from 1 to 4 carbon atoms, an aryl group having from 6 to 18 carbon atoms or an aralkyl group having from 7 to 19 carbon atoms. Z represents a substituent. p represents an integer of 0 or a positive integer, and is preferably from 0 to 2, and more preferably 0 or 1. When a plurality of Z are present, each Z may be the same as or different from every other Z. Z preferably includes a group composed of only hydrogen atom and carbon atom, for example, a straight-chain or branched alkyl group or a cycloalkyl group.

[Chem. 11]

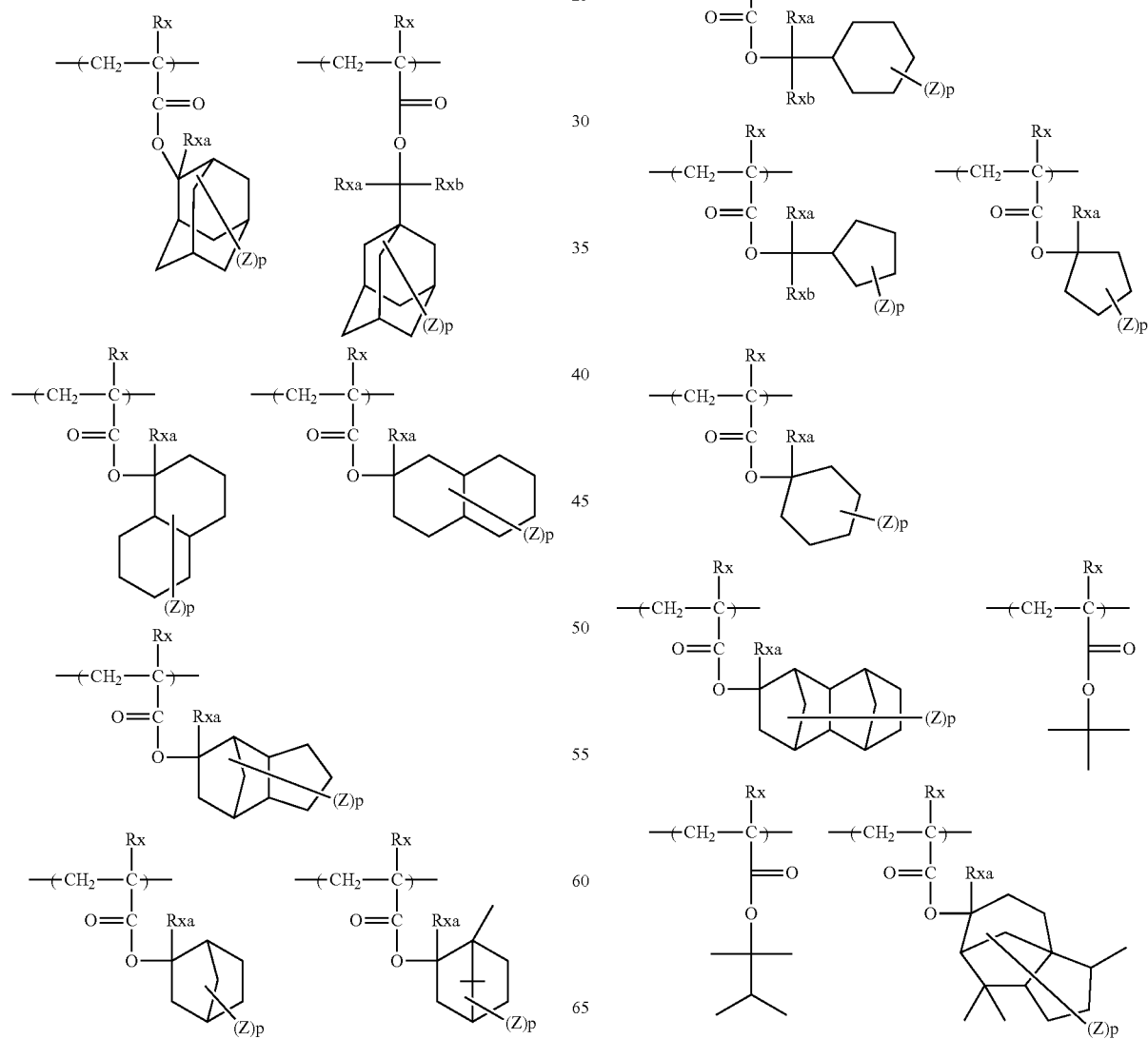

-continued
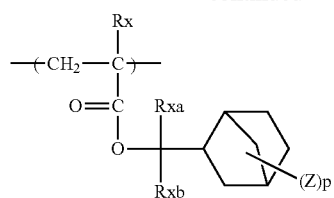
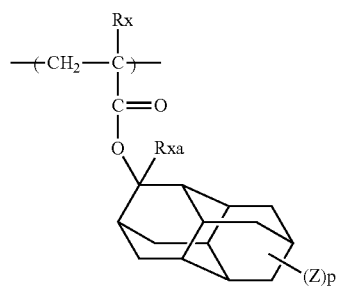
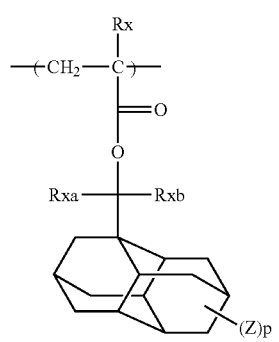
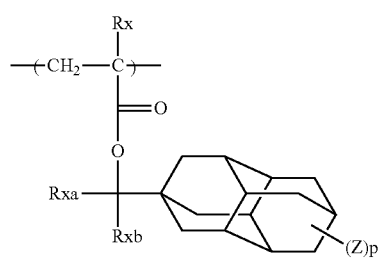
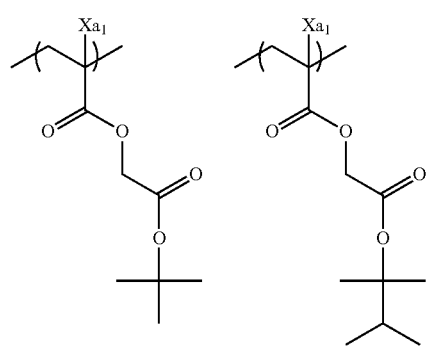
-continued
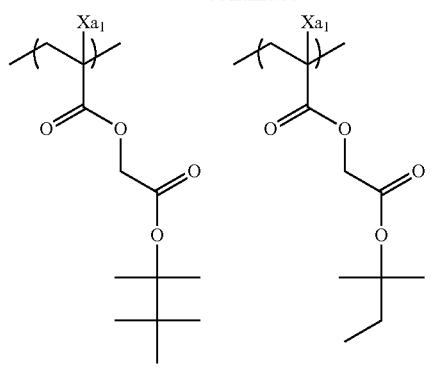
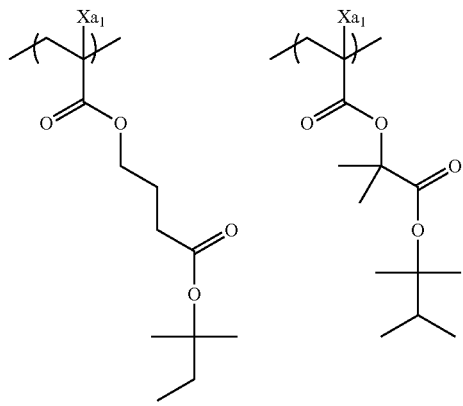
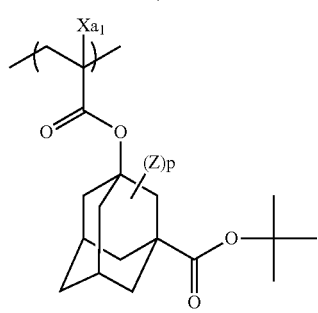
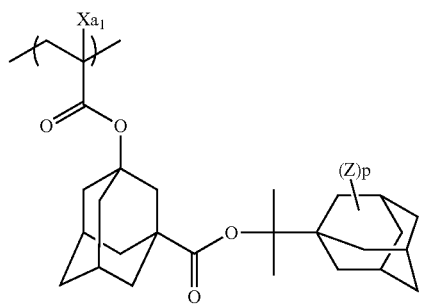
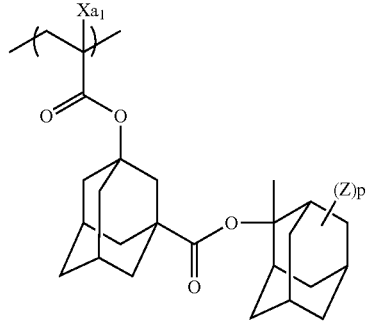
[Chem. 12]

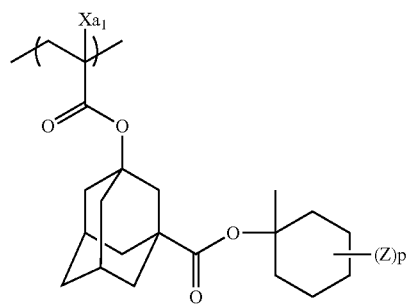
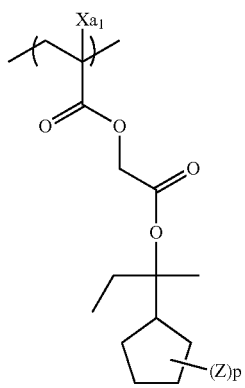
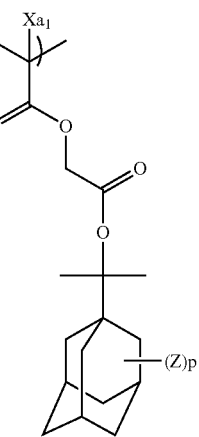
[Chem. 13]
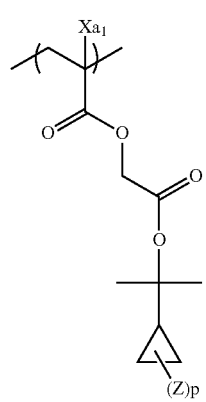
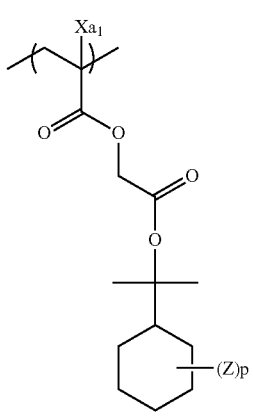
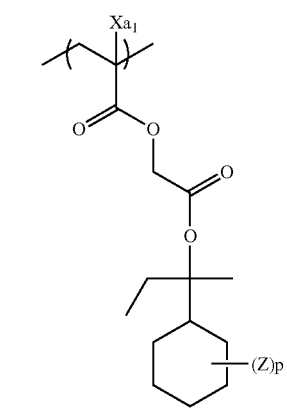
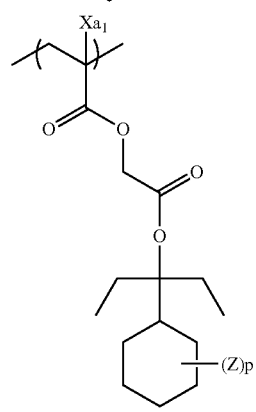
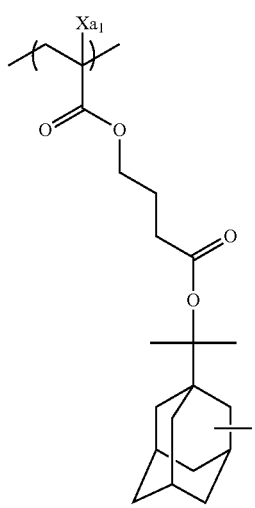
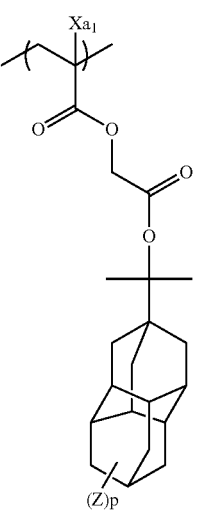
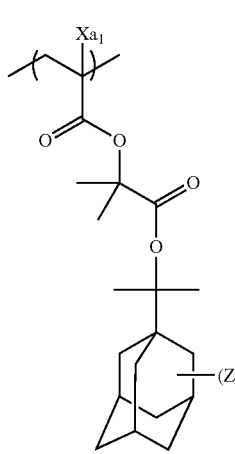
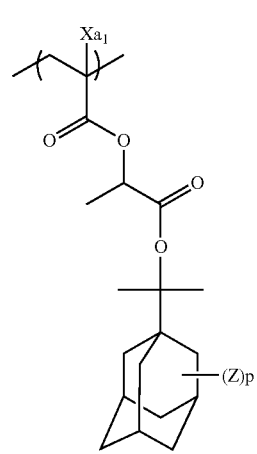

-continued
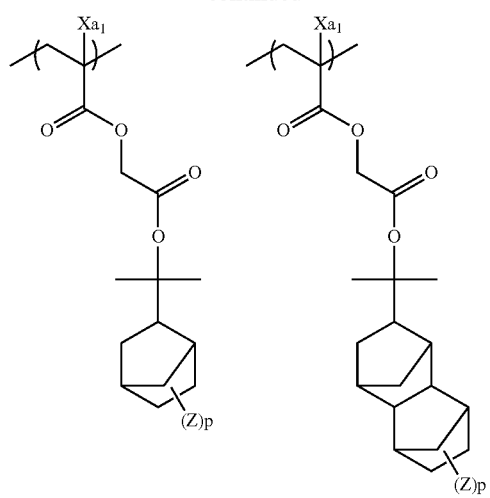
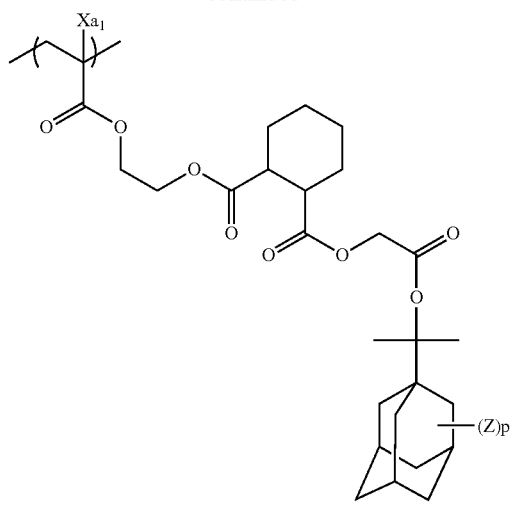
[Chem. 14]
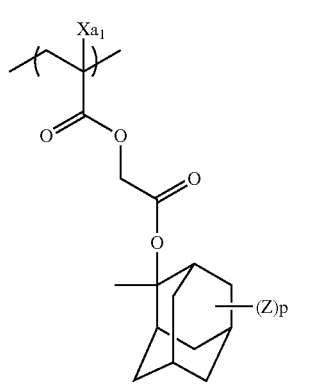
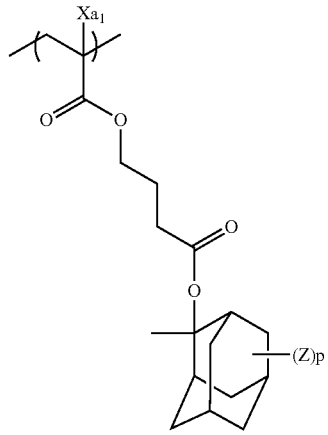
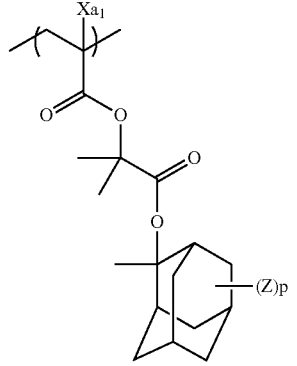

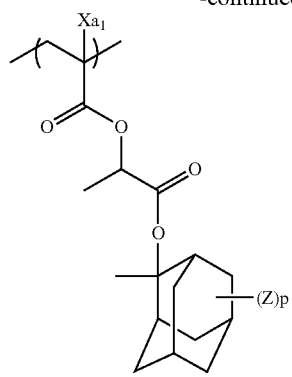
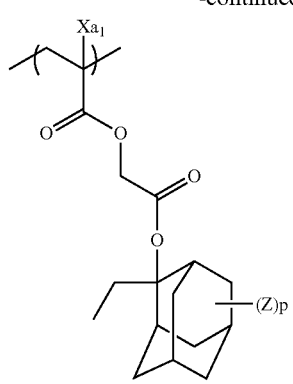
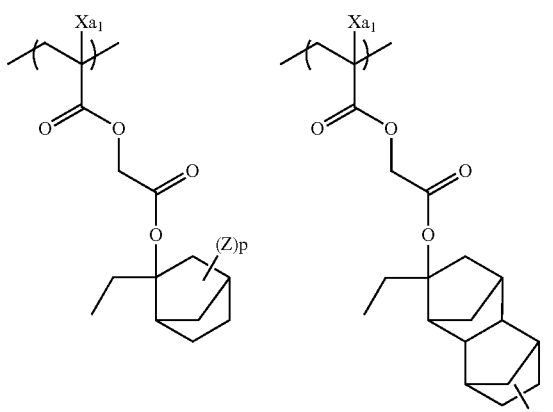
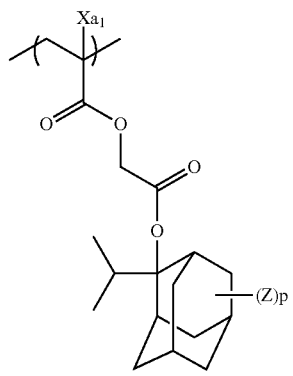
[Chem. 15]
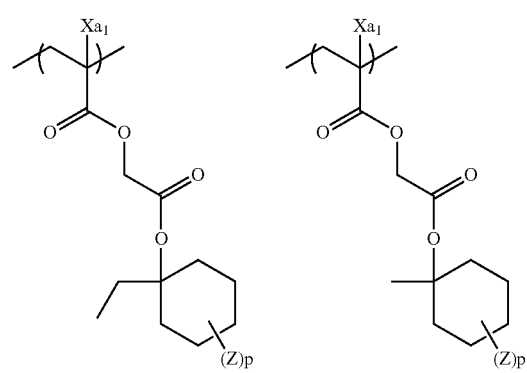
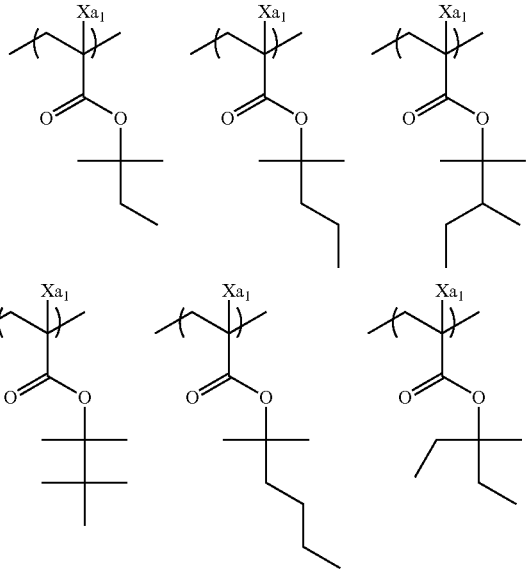
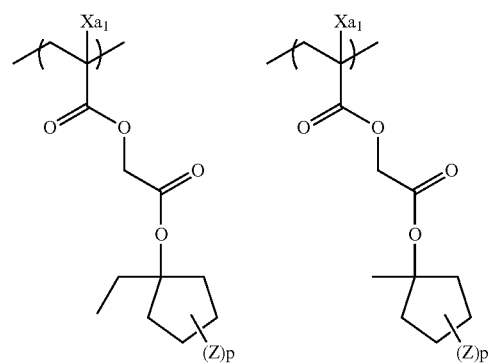

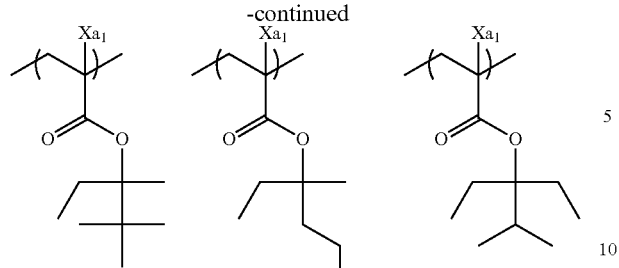
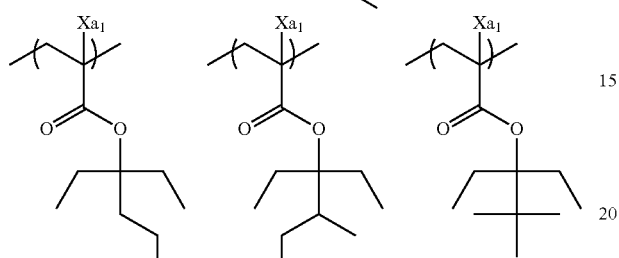
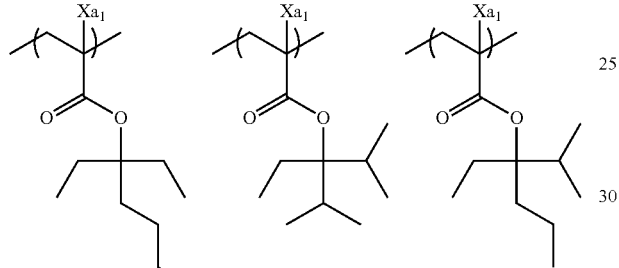
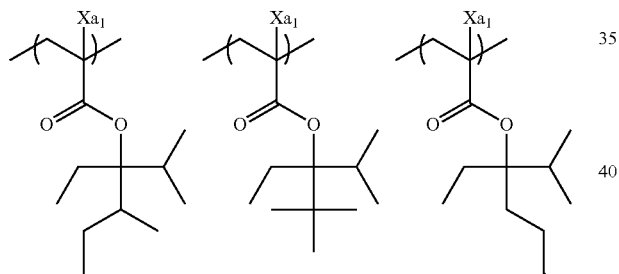
[Chem. 16]
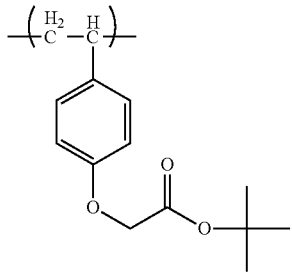
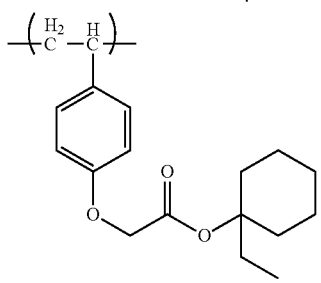
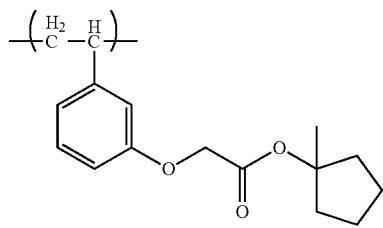
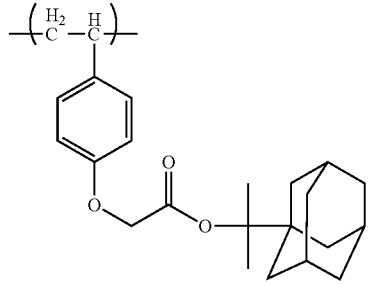
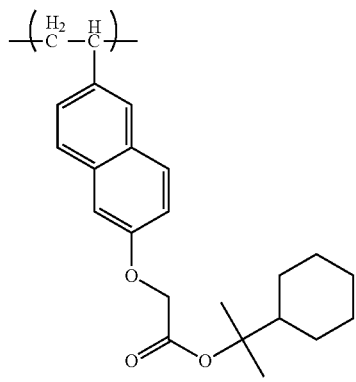
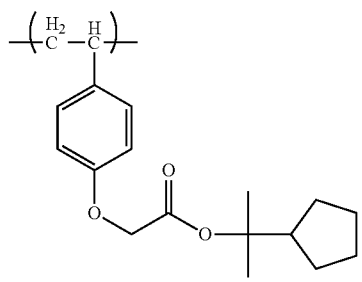
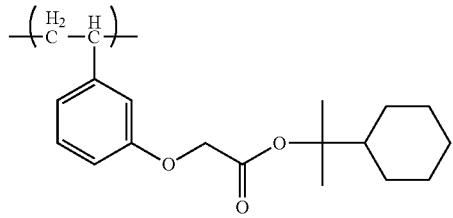
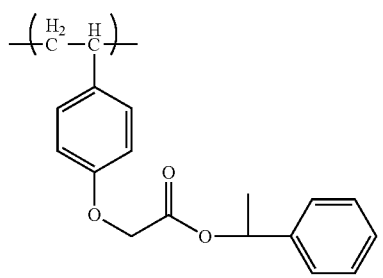

-continued

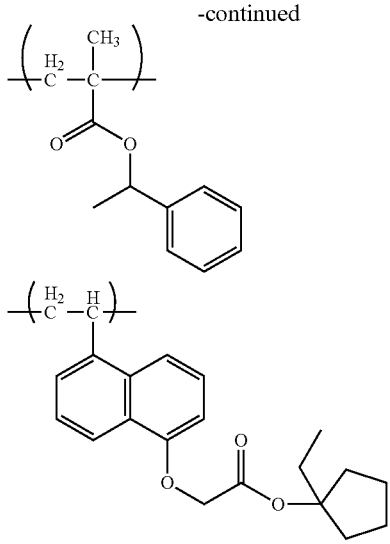

The repeating unit having an acid-decomposable group other than the repeating unit represented by formula (1) described above may be used one kind or in combination of two or more kinds thereof.

The content of the repeating unit having an acid-decomposable group other than the repeating unit represented by formula (1) described above (in the case of containing plural kinds of repeating units, the total thereof) is preferably from 1 to 30% by mole, more preferably from 3 to 20% by mole, still more preferably from 5 to 15% by mole, based on the total repeating units in the resin (A).

(b) Repeating Unit Represented by Formula (3)

The resin (A) according to the invention preferably contains a repeating unit represented by formula (3) shown below.

[Chem. 17]

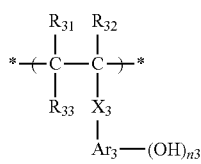

(3)

In formula (3), each of $R_{31}$, $R_{32}$ and $R_{33}$ independently represents a hydrogen atom, an alkyl group, a cycloalkyl group, a halogen atom, a cyano group or an alkoxycarbonyl group, or $R_{33}$ may be connected to $Ar_3$ to form a ring and in this case $R_{33}$ represents an alkylene group.

$X_3$ represents a single bond or a divalent connecting group.

$Ar_3$ represents an (n3+1) valent aromatic ring group, and when $Ar_3$ is connected to $R_{33}$ to form a ring, $Ar_a$ represents an (n3+2) valent aromatic ring group.

n3 represents an integer from 1 to 4.

Specific examples of the alkyl group, cycloalkyl group, halogen atom and alkoxycarbonyl group represented by any of $R_{31}$, $R_{32}$ and $R_{33}$ in formula (3) and the substituents which these groups may have are same as the specific examples described for these groups represented by any of $R_{11}$, $R_{12}$ and $R_{13}$ in formula (1) described above.

$Ar_3$ represents an (n3+1) valent aromatic ring group. In the case where n3 is 1, the divalent aromatic ring group may have a substituent, and preferred examples thereof include an arylene group having from 6 to 18 carbon atoms, for example, a phenylene group, a tolylene group, a naphthylene group or a anthracenyl group, and an aromatic ring group containing a hetero ring, for example, thiophene, furan, pyrrole, benzothiophene, benzofuran, benzopyrrole, triazine, imidazole, benzimidazole, triazole, thiadiazole or thiazole.

Specific examples of the (n3+1) valent aromatic ring group in the case where n3 is an integer of 2 or more preferably include groups formed by removing an (n3-1) number of appropriate hydrogen atoms from the specific examples of the divalent aromatic ring group described above.

The (n3+1) valent aromatic ring group may further has a substituent.

The substituents which the alkylene group and (n3+1) valent aromatic ring group may have include the alkyl group represented by any of $R_{51}$ to $R_{53}$ in formula (V), an alkoxy group, for example, a methoxy group, an ethoxy group, a hydroxyethoxy group, a propoxy group, a hydroxypropoxy group or a butoxy group, and an aryl group, for example, a phenyl group.

The divalent connecting group represented by $X_3$ includes —COO— and —CONR$_{64}$—.

An alkyl group for $R_{64}$ of the —CONR$_{64}$— ($R_{64}$ represents a hydrogen atom or an alkyl group) represented by $X_3$ is the same as the alkyl group represented by any of $R_{61}$ to $R_{63}$.

$X_3$ is preferably a single bond, —COO— or —CONH—, and more preferably a single bond or —COO—.

$Ar_3$ is more preferably an aromatic ring group having from 6 to 18 carbon atoms which may have a substituent, and particularly preferably a benzene ring group, a naphthalene ring group or a biphenylene ring group.

The repeating unit (b) preferably has a hydroxystyrene structure. That is, $Ar_3$ is preferably a benzene ring group.

n3 represents an integer from 1 to 4, preferably 1 or 2, and more preferably 1.

Specific examples of the repeating unit represented by formula (3) are set forth below, but the invention should not be construed as being limited thereto. In the formulae, a represents 1 or 2.

[Chem. 18]

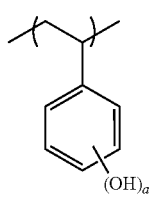

(B-1)

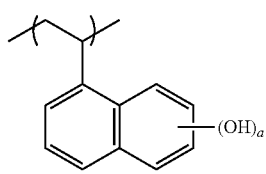

(B-2)

(B-3) 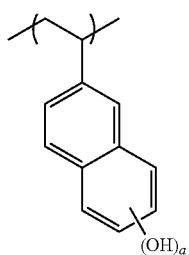
(B-4) 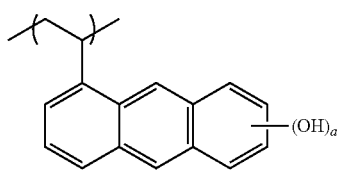
(B-5) 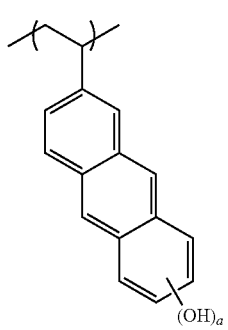
(B-6) 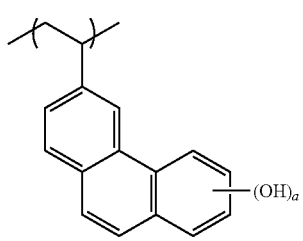
(B-7) 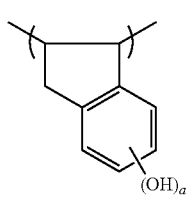
(B-8) 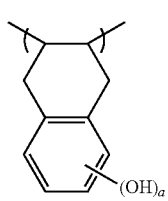
(B-9) 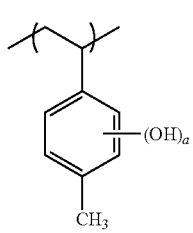
(B-10) 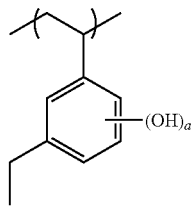
(B-11) 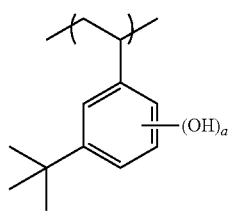
(B-12) 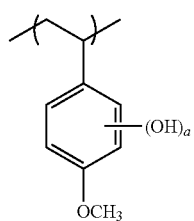
(B-13) 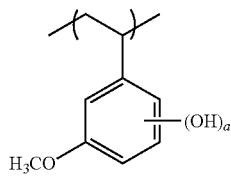
(B-14) 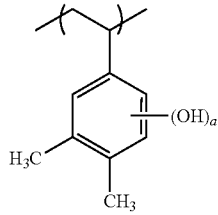
(B-15) 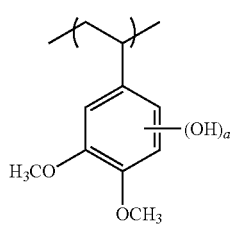
(B-16) 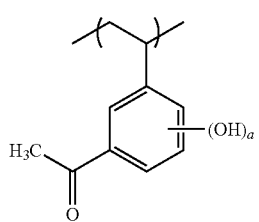

(B-17) 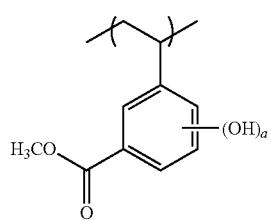
(B-18) 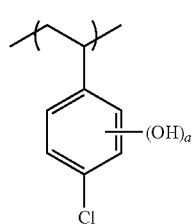
(B-19) 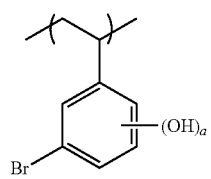
(B-20) 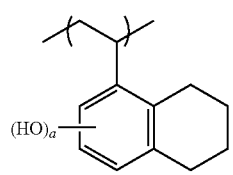
(B-21) 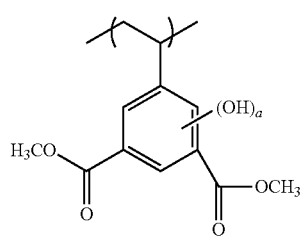
(B-22) 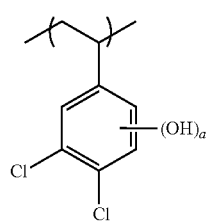
(B-23) 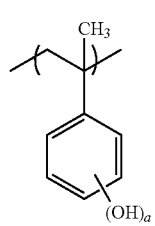
(B-24) 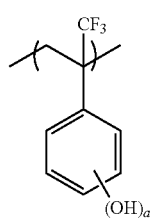
(B-25) 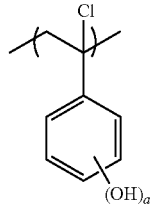
(B-26) 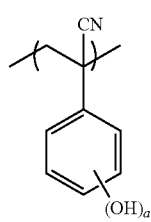
(B-27) 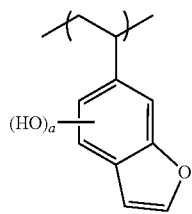
(B-28) 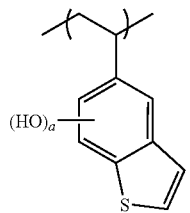
(B-29) 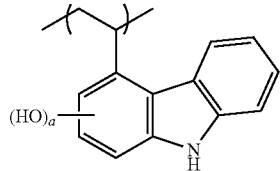
(B-30) 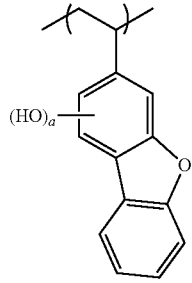

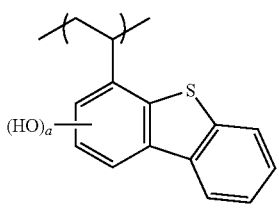
(B-31)

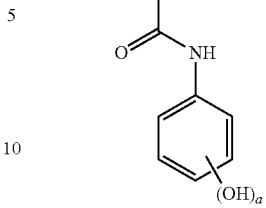
(B-32)

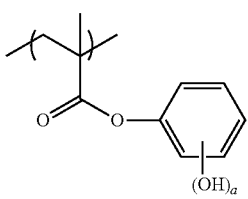
(B-33)

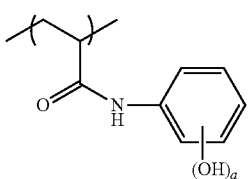
(B-34)

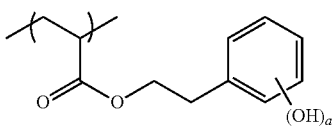
(B-35)

[Chem. 19]

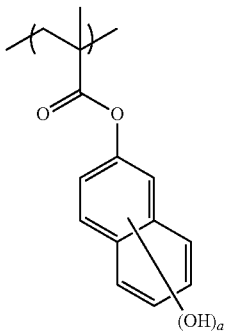
(B-36)

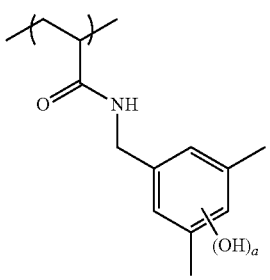
(B-37)

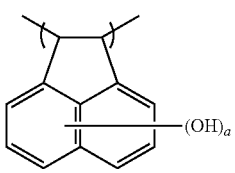
(B-38)

The resin (A) may contain two or more kinds of the repeating units represented by formula (3).

The content of the repeating unit represented by formula (3) (in the case of containing plural kinds of repeating units, the total thereof) is preferably in a range from 3 to 98% by mole, more preferably in a range from 10 to 80% by mole, still more preferably in a range from 25 to 70% by mole, based on the total repeating units in the resin (A).

(c) Repeating Unit Having Polar Group Other than Repeating Unit Represented by Formula (3)

The resin (A) preferably contains (c) a repeating unit having a polar group. By containing the repeating unit (c), for example, the sensitivity of the composition containing the resin can be enhanced. The repeating unit (c) is preferably a non-acid-decomposable repeating unit (that is, has no acid-decomposable group).

The "polar group" which can be contained in the repeating unit (c) includes, for example, the following (1) to (4). In the following, the "electronegativity" means a Pauling's value.

(1) Functional Group Containing a Structure where an Oxygen Atom and an Atom Having an Electronegativity Difference from Oxygen Atom of 1.1 or More are Connected Through a Single Bond Examples of such a polar group include a group containing a structure represented by O—H, for example, a hydroxyl group.

(2) Functional Group Containing a Structure where a Nitrogen Atom and an Atom Having an Electronegativity Difference from Nitrogen Atom of 0.6 or More are Connected Through a Single Bond Examples of such a polar group include a group containing a structure represented by N—H, for example, an amino group.

(3) Functional Group Containing a Structure where Two Atoms Differing in the Electronegativity by 0.5 or More are Connected Through a Double Bond or a Triple Bond Examples of such a polar group include a group containing a structure represented, for example, by C=N, C=O, N=O, S=O or C=N.

(4) Functional Group Having an Ionic Moiety

Examples of such a polar group include a group containing a moiety represented, for example, by $N^+$ or $S^+$.

Specific examples of the partial structure which can be contained in the "polar group" are set forth below.

[Chem. 20]

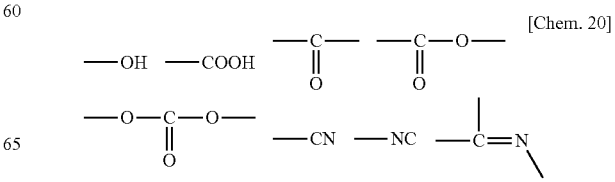

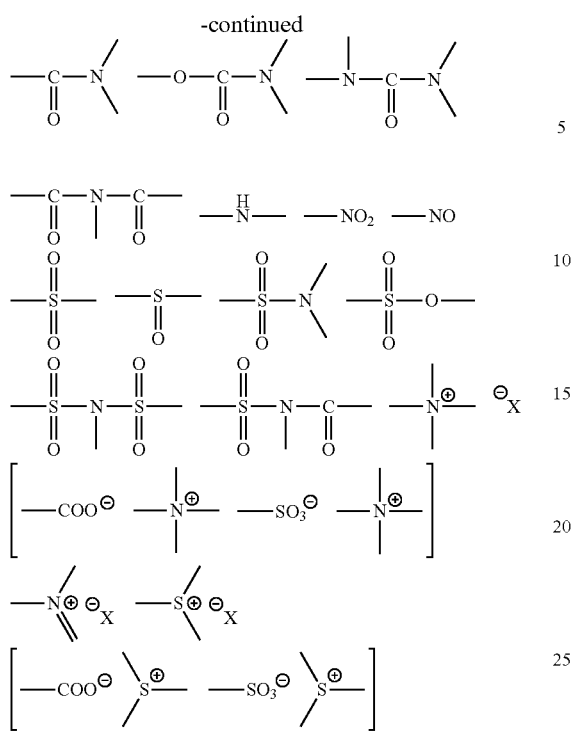

The polar group is preferably selected from a hydroxyl group, a cyano group, a lactone group, a sultone group, a carboxylic acid group, a sulfonic acid group, an amido group, a sulfonamido group, an ammonium group, a sulfonium group, and a group composed of a combination of two or more thereof, and particularly preferably an alcoholic hydroxyl group, a cyano group, a lactone group, a sultone group or a group containing a cyanolactone structure.

When a repeating unit having an alcoholic hydroxyl group is further incorporated into the resin, the exposure latitude (EL) of the composition containing the resin can be more enhanced.

When a repeating unit having a cyano group is further incorporated into the resin, the sensitivity of the composition containing the resin can be more enhanced.

When a repeating unit having a lactone group is further incorporated into the resin, the composition containing the resin can be more improved in the dry etching resistance, coating property and adhesion property to a substrate.

When a repeating unit having a group containing a lactone structure having a cyano group is further incorporated into the resin, the composition containing the resin can be further improved in the sensitivity, dry etching resistance, coating property and adhesion property to a substrate. In addition, a single repeating unit can play functions attributable to a cyano group and a lactone group, respectively, and the degree of freedom in designing the resin can also be more increased.

In the case where the polar group contained in the repeating unit (c) is an alcoholic hydroxyl group, the repeating unit is preferably represented by at least one formula selected from the group consisting of formulae (I-1H) to (I-10H) shown below. In particular, the repeating unit is more preferably represented by at least one formula selected from the group consisting of formulae (I-1H) to (I-3H) shown below, and still more preferably represented by formula (I-1H) shown below.

[Chem. 21]

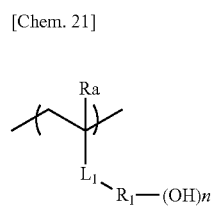
(I-1H)

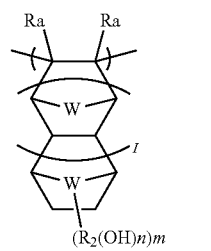
(I-2H)

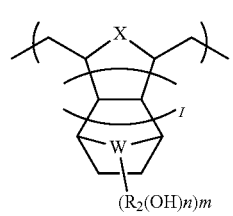
(I-3H)

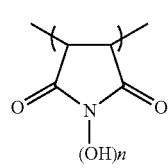
(I-4H)

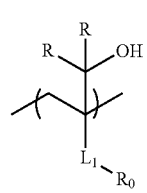
(I-5H)

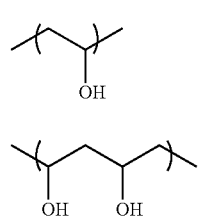
(I-6H)

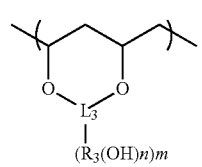
(I-7H)

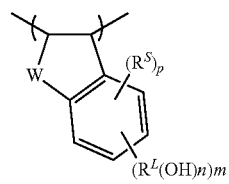
(I-8H)

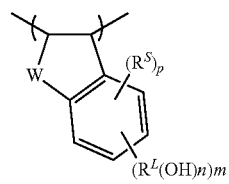
(I-9H)

-continued

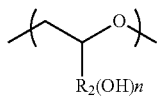
(I-10H)

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents an (n+1) valent organic group.

When m≥2, each $R_2$ independently represents a single bond or an (n+1) valent organic group.

W represents a methylene group, an oxygen atom or a sulfur atom.

Each of n and m represents an integer of 1 or more. In the case where $R_2$ in formula (I-2H), (I-3H) or (I-8H) represents a single bond, n is 1.

l represents an integer of 0 or more.

$L_1$ represents a connecting group represented by —COO—, —OCO—, —CONH—, —O—, -Ar-, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2) valent connecting group.

When m≥2, each $R^L$ independently represents an (n+1) valent connecting group.

When p≥2, each $R^S$ independently represents a substituent, and when p≥2, a plurality of $R^S$ may be connected to each other to form a ring.

p represents an integer from 0 to 3.

Ra represents a hydrogen atom, an alkyl group or a group represented by —$CH_2$—O—$Ra_2$. Ra is preferably a hydrogen atom or an alkyl group having from 1 to 10 carbon atoms, and more preferably a hydrogen or a methyl group.

W represents a methylene group, an oxygen atom or a sulfur atom. W is preferably a methylene group or an oxygen atom.

$R_1$ represents an (n+1) valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1) valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ is a chain hydrocarbon group, the chain hydrocarbon group may be strait-chain or branched. The number of carbon atoms in the chain hydrocarbon group is preferably from 1 to 8. For example, when $R_1$ and/or $R_2$ is an alkylene group, $R_1$ and/or $R_2$ is preferably a methylene group, an ethylene group, an n-propylene group, an isopropylene group, an n-butylene group, an isobutylene group or a sec-butylene group.

In the case where $R_1$ and/or $R_2$ is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The number of carbon atoms in the alicyclic hydrocarbon group is usually 5 or more, preferably from 6 to 30, and more preferably from 7 to 25.

The alicyclic hydrocarbon group includes, for example, those having a partial structure enumerated below. Each of the partial structures may have a substituent. Also, in each of the partial structures, the methylene group (—$CH_2$—) may be replaced with an oxygen atom (—O—), a sulfur atom (—S—), a carbonyl group [—C(=O)—], a sulfonyl group [—S(=O)$_2$—], a sulfinyl group [—S(=O)—] or an imino group [—N(R)—] (wherein R is a hydrogen atom or an alkyl group).

[Chem. 22]

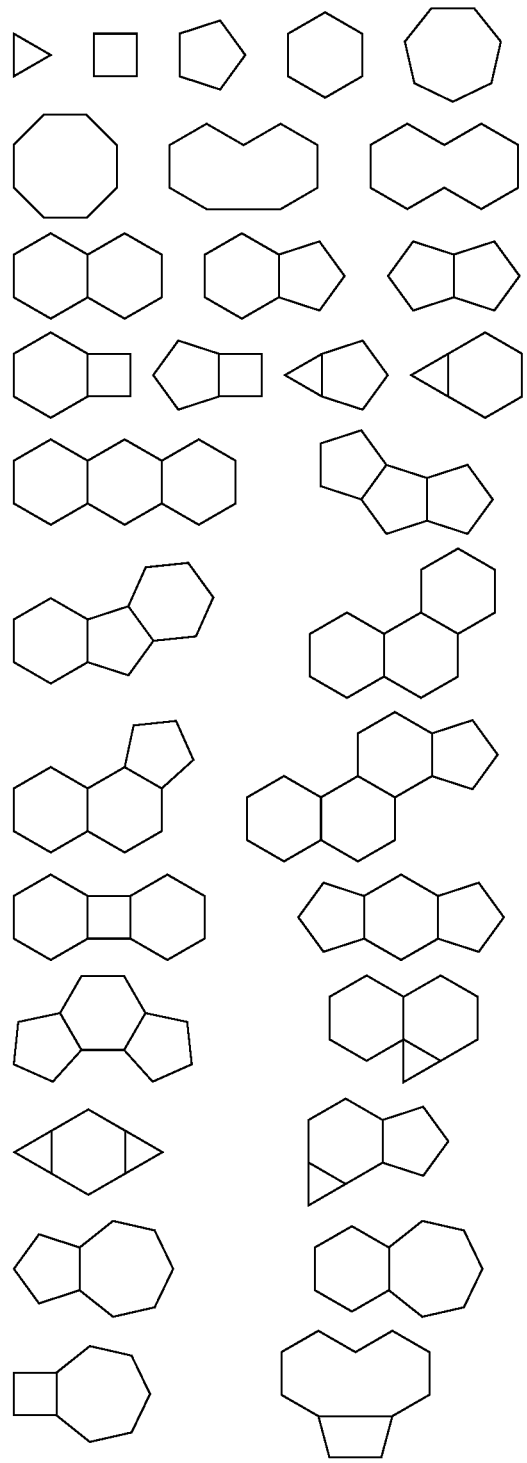

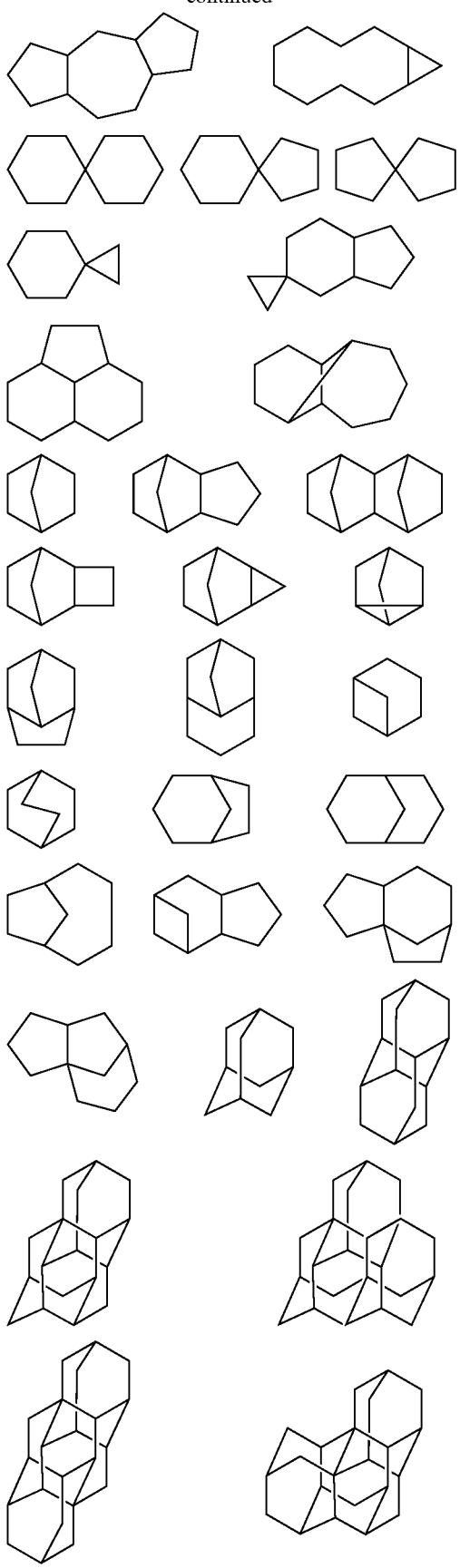
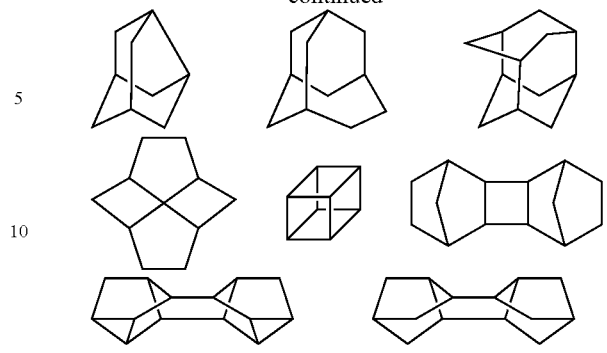

For example, when $R_1$ and/or $R_2$ is a cycloalkylene group, $R_1$ and/or $R_2$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, and more preferably an adamantylene group, a norbornylene group, a cyclohexylene group, a cyclopentylene group, a tetracyclododecanylene group or a tricyclodecanylene group.

The non-aromatic hydrocarbon group for $R_1$ and/or $R_2$ may have a substituent. Examples of the substituent include an alkyl group having from 1 to 4 carbon atoms, a halogen atom, a hydroxyl group, an alkoxy group having from 1 to 4 carbon atoms, a carboxyl group and an alkoxycarbonyl group having from 2 to 6 carbon atoms. The alkyl group, alkoxy group and alkoxycarbonyl group described above may further have a substituent. Examples of the substituent include a hydroxyl group, a halogen atom and an alkoxy group.

$L_1$ represents a connecting group represented by —COO—, —OCO—, —CONH—, —O—, -Ar-, —SO$_3$— or —SO$_2$NH—, wherein Ar represents a divalent aromatic ring group. $L_1$ is preferably a connecting group represented by —COO—, —CONH— or -Ar-, and more preferably a connecting group represented by —COO— or —CONH—.

R represents a hydrogen atom or an alkyl group. The alkyl group may be straight-chain or branched. The number of carbon atoms in the alkyl group is preferably from 1 to 6, and more preferably from 1 to 3. R is preferably a hydrogen atom or a methyl group, and more preferably a hydrogen atom.

$R_O$ represents a hydrogen atom or an organic group. Examples of the organic group include an alkyl group, a cycloalkyl group, an aryl group, an alkynyl group and an alkenyl group. $R_O$ is preferably a hydrogen atom or an alkyl group, and more preferably a hydrogen atom or a methyl group.

$L_3$ represents an (m+2) valent connecting group. That is, $L_3$ represents a trivalent or higher valent connecting group. Examples of such a connecting group include corresponding groups in specific examples described later.

$R^L$ represents an (n+1) valent connecting group. That is, $R^L$ represents a divalent or higher valent connecting group. Examples of such a connecting group include, for example, an alkylene group, a cycloalkylene group and corresponding groups in specific examples described later. $R^L$ may be connected to another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group and a halogen atom.

n is an integer of 1 or more. n is preferably an integer from 1 to 3, and more preferably 1 or 2. Also, when n is an integer of 2 or more, the dissolution contrast for a developer containing an organic solvent can be more enhanced and thus, the limiting resolution and roughness performance can be more improved.

m is an integer of 1 or more. m is preferably an integer from 1 to 3, and more preferably 1 or 2.

l is an integer of 0 or more. l is preferably 0 or 1.

p is an integer from 0 to 3.

When a repeating unit having a group capable of decomposing by the action of an acid to generate an alcoholic hydroxyl group and a repeating unit represented by at least one formula selected from the group consisting of formulae (I-1H) to (I-10H) are used in combination, for example, the acid diffusion is suppressed by the alcoholic hydroxyl group and the sensitivity is increased by the group capable of decomposing by the action of an acid to generate an alcoholic hydroxyl group, so that the exposure latitude (EL) can be improved without deteriorating other performances.

The content of the repeating unit having an alcoholic hydroxyl group is preferably from 1 to 60% by mole, more preferably from 3 to 50% by mole, still more preferably from 5 to 40% by mole, based on the total repeating units in the resin (A).

Specific examples of the repeating unit represented by any one of formulae (I-1H) to (I-10H) are set forth below. In the specific examples, Ra has the same meaning as in formulae (I-1H) to (I-10H).

[Chem. 23]

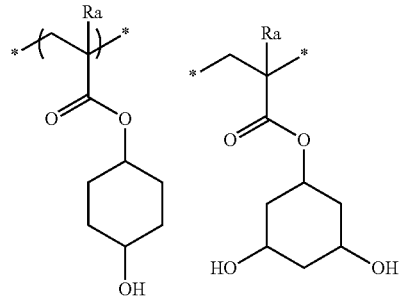
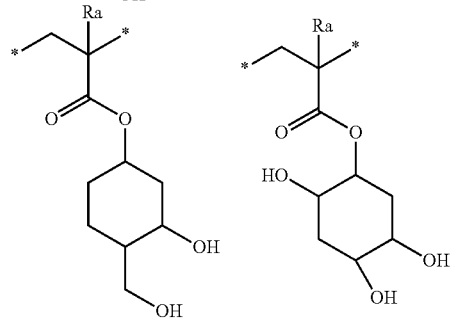
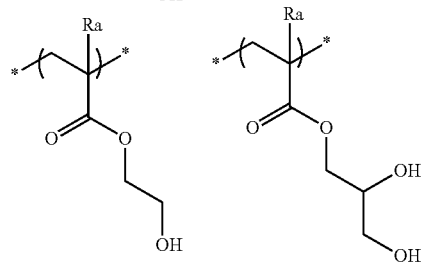
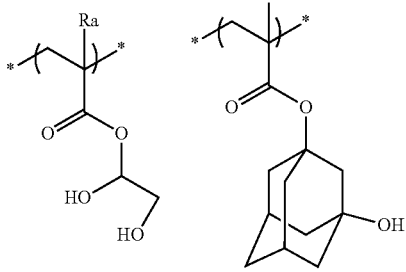
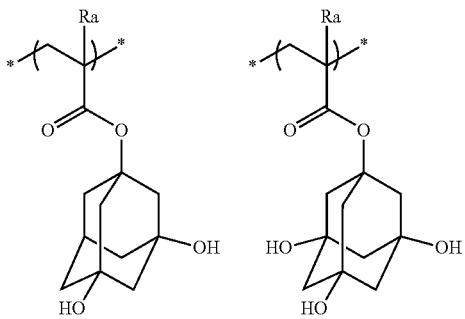
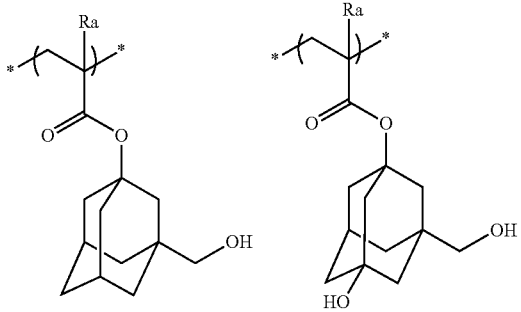
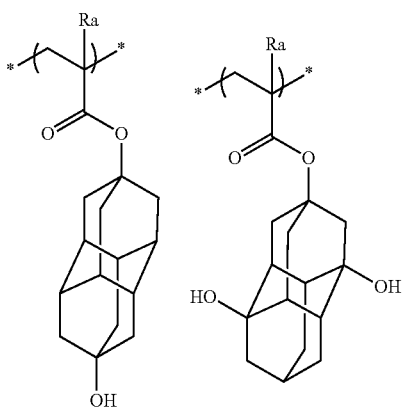
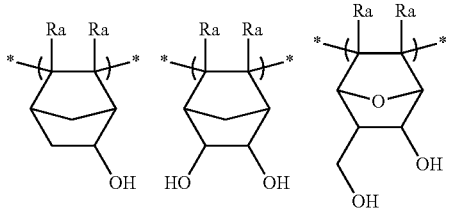

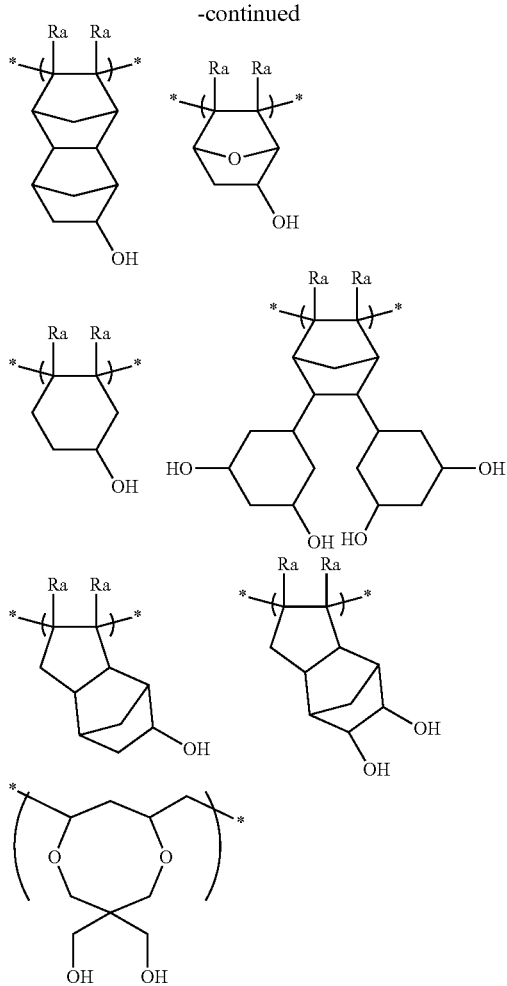

In the case where the polar group contained in the repeating unit (c) is an alcoholic hydroxyl group or a cyano group, one preferred embodiment of the repeating unit is a repeating unit having an alicyclic hydrocarbon structure substituted with a hydroxyl group or a cyano group. At this time, the repeating unit preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by formulae (VIIa) to (VIIc) shown below. By the repeating unit, adhesion property to a substrate and affinity for developer are enhanced.

[Chem. 24]

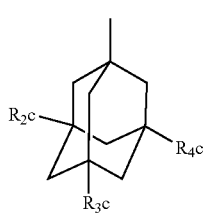
(VIIa)

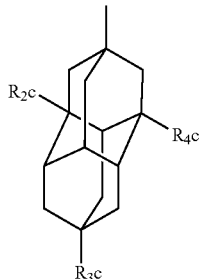
(VIIb)

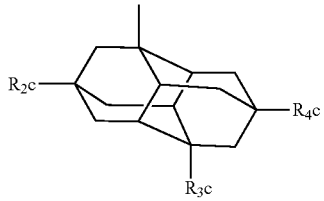
(VIIc)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. Preferably, one or two of $R_2c$ to $R_4c$ are hydroxyl groups and the remainder is a hydrogen atom. In formula (VIIa), it is more preferred that two of $R_2c$ to $R_4c$ are hydroxyl groups and the remainder is a hydrogen atom.

The repeating unit having a partial structure represented by formulae (VIIa) to (VIIc) includes repeating units represented by formulae (AIIa) to (AIIc) shown below.

[Chem. 25]

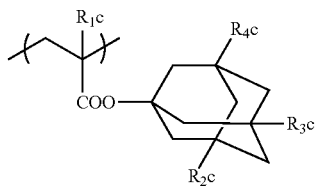
(AIIa)

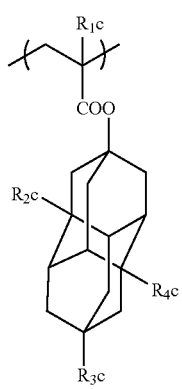
(AIIb)

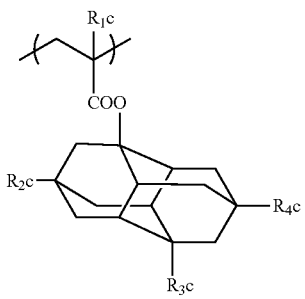

(AIIc)

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIe).

The resin (A) may or may not contain a repeating unit having a hydroxyl group or a cyano group, and in the case of containing the repeating unit having a hydroxyl group or a cyano group, the content thereof is preferably from 1 to 60% by mole, more preferably from 3 to 50% by mole, still more preferably from 5 to 40% by mole, based on the total repeating units in the resin (A).

Specific examples of the repeating unit having a hydroxyl group or a cyano group are set forth below, but the invention should not be construed as being limited thereto.

[Chem. 26]

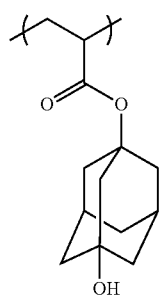
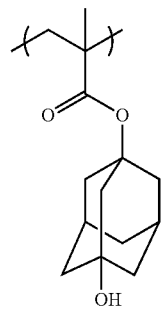
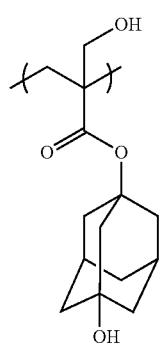
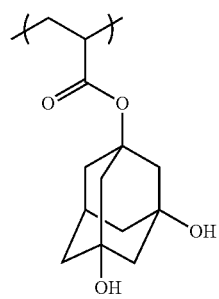
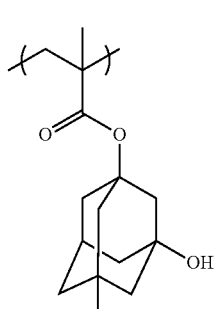
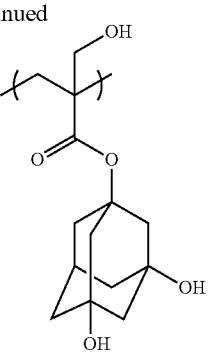
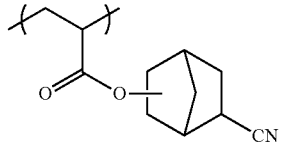
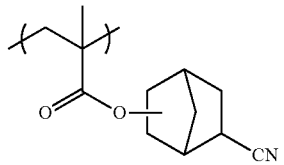
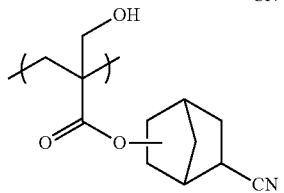
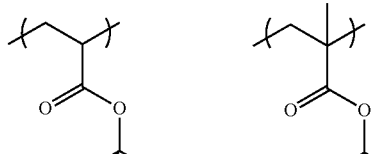

The repeating unit (c) preferably includes a repeating unit having a lactone structure or a sultone (cyclic sulfonic acid ester) structure as the polar group.

As a lactone group or a sultone group, any group can be used as long as it has a lactone structure or a sultone structure, and a 5-membered to 7-membered ring lactone structure or sultone structure is preferred, and a 5-membered to 7-membered ring lactone structure or sultone structure to which another ring structure is fused to form a bicyclo structure or a spiro structure is preferred. It is more preferred to contain a repeating unit having a lactone structure or a sultone structure represented by any one of formulae (LC1-1) to (LC1-17), (SL1-1) and (SL1-2) shown below. The lactone structure or sultone structure may also be directly connected to the main chain. Preferred lactone structures and sultone structures are (LC1-1), (LC1-4), (LC1-5), (LC1-8), and (LC1-4) is more preferred. By using the specific lactone structure or sultone structure, LWR and development defect are improved.

[Chem. 27]

LC1-1
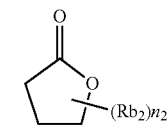

LC1-2
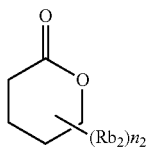

LC1-3
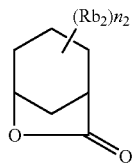

LC1-4
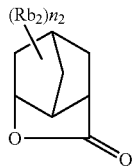

LC1-5
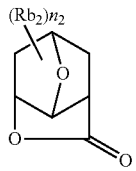

LC1-6
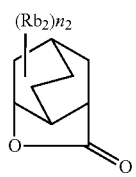

LC1-7
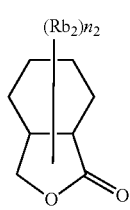

LC1-8
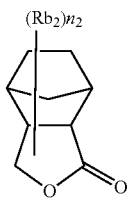

LC1-9
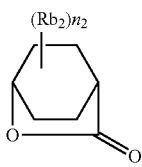

LC1-10
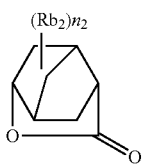

LC1-11
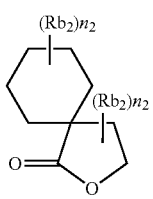

LC1-12
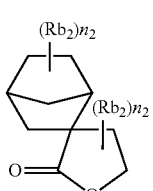

LC1-13
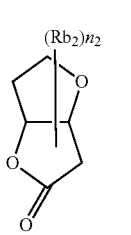

LC1-14
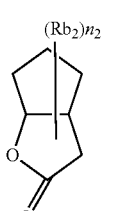

LC1-15
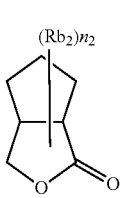

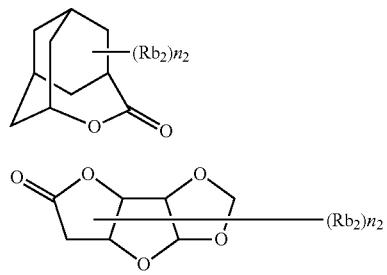

LC1-16

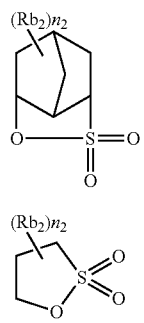

LC1-17

[Chem. 28]

SL1-1

SL1-2

The lactone structure moiety or sultone structure moiety may or may not have a substituent (Rb$_2$). Preferred substituents (Rb$_2$) include, for example, an alkyl group having from 1 to 8 carbon atoms, a cycloalkyl group having from 4 to 7 carbon atoms, an alkoxy group having from 1 to 8 carbon atoms, an alkoxycarbonyl group having from 2 to 8 carbon atoms, a carboxyl group, a halogen atom, a hydroxyl group, a cyano group and an acid-decomposable group. An alkyl group having from 1 to 4 carbon atoms, a cyano group and an acid-decomposable group are more preferred. n$_2$ represents an integer from 0 to 4. When n$_2$ is 2 or more, each of a plurality of substituents (Rb$_2$) may be the same as or different from every other substituents (Rb$_2$) and also, the plurality of substituents (Rb$_2$) may be connected to each other to form a ring.

The resin (A) preferably contains a repeating unit having a lactone structure or a sultone structure represented by formula (III) shown below.

[Chem. 29]

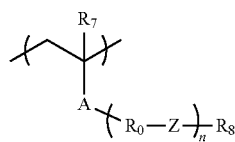

(III)

In formula (III), A represents an ester bond (a group represented by —COO—) or an amide bond (a group represented by —CONH—).

When a plurality of R$_0$ are present, each R$_0$ independently represents an alkylene group, a cycloalkylene group, or a combination thereof.

When a plurality of Z are present, each Z independently represents a single bond, an ether bond, an ester bond, an amide bond, a urethane bond

[Chem. 30]

(a group represented by 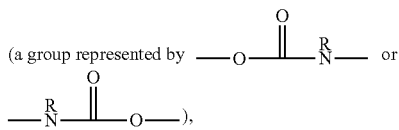 or

), or a urea bond

[Chem. 31]

(a group represented by 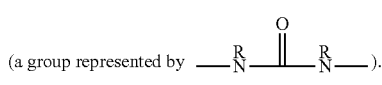 ).

Wherein, each R independently represents a hydrogen atom, an alkyl group, a cycloalkyl group or an aryl group.

R$_8$ represents a monovalent organic group having a lactone structure or a sultone structure.

n is a number of repetitions of the structure represented by —R$_0$—Z— and represents an integer from 0 to 2.

R$_7$ represents a hydrogen atom, a halogen atom or an alkyl group.

The alkylene group or cycloalkylene group for R$_0$ may have a substituent.

Z is preferably an ether bond or an ester bond, and particularly preferably an ester bond.

The alkyl group for R$_7$ is preferably an alkyl group having from 1 to 4 carbon atoms, more preferably a methyl group or an ethyl group, and particularly preferably a methyl group. The alkylene group and cycloalkylene group for R$_0$ and the alkyl group for R$_7$ may be substituted, and examples of the substituent include a halogen atom, for example, a fluorine atom, a chlorine atom or a bromine atom, a mercapto group, a hydroxyl group, an alkoxy group, for example, a methoxy group, an ethoxy group, an isopropoxy group, a tert-butoxy group or a benzyloxy group, and an acetoxy group, for example, an acetyloxy group or a propionyloxy group. R$_7$ is preferably a hydrogen atom, a methyl group, a trifluoromethyl group or a hydroxymethyl group.

The chain alkylene group for R$_0$ is preferably a chain alkylene group having from 1 to 10 carbon atoms, more preferably having from 1 to 5 carbon atoms, and examples thereof include a methylene group, an ethylene group and a propylene group. The cycloalkylene group is preferably a cycloalkylene group having from 3 to 20 carbon atoms, and examples thereof include a cyclohexylene group, a cyclopentylene group, a norbornylene group and an adamantylene group. The chain alkylene group is preferred and a methylene group is particularly preferred from the standpoint of exerting of the effect of the invention.

The monovalent organic group having a lactone structure or a sultone structure represented by R$_8$ is not limited as long as it has a lactone structure or a sultone structure. Specific examples thereof include the lactone structures and sultone structures represented by formulae (LC1-1) to (LC1-17), (SL1-1) and (SL1-2) as described above, and among them, the structure represented by formula (LC1-4) is particularly preferred. Also, in (LC1-1) to (LC1-17), (SL1-1) and (SL1-2), n$_2$ is more preferably 2 or less.

Further, R$_8$ is preferably a monovalent organic group having an unsubstituted lactone structure or sultone structure or a monovalent organic group having a lactone structure or sultone structure substituted with a methyl group, a cyano group or an alkoxycarbonyl group, and more preferably a monovalent organic group having a lactone structure having a cyano group as a substituent (cyanolactone) or a sultone structure having a cyano group as a substituent (cyanosultone).

In formula (III), n is preferably 1 or 2.

Specific examples of the repeating unit having a lactone structure or a sultone structure represented by the formula (III) are set forth below, but the invention should not be construed as being limited thereto.

In the specific examples below, R represents a hydrogen atom, an alkyl group which may have a substituent or a halogen atom, and preferably a hydrogen atom, a methyl group, a hydroxymethyl group or an acetoxymethyl group.

In the formulae below, Me represents a methyl group.

[Chem. 32]

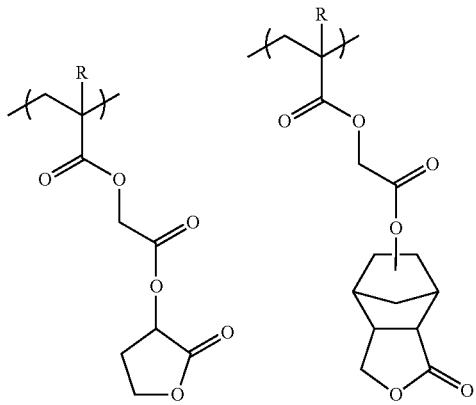

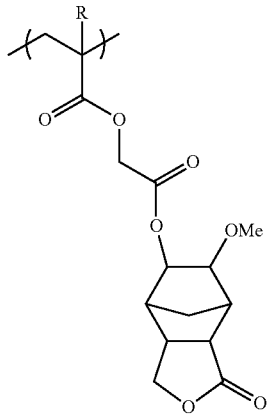

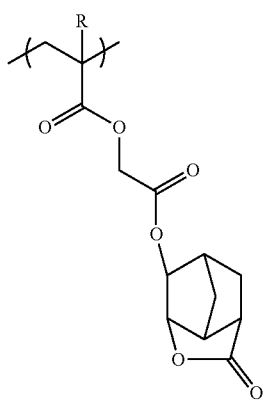

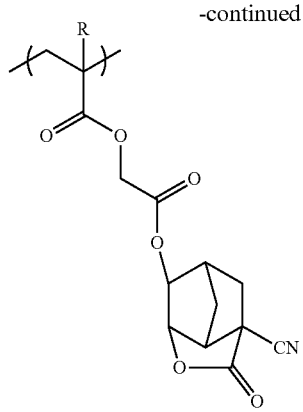

The repeating unit having a lactone structure or a sultone structure is more preferably a repeating unit represented by formula (III-1) or (III-1') shown below.

[Chem. 33]

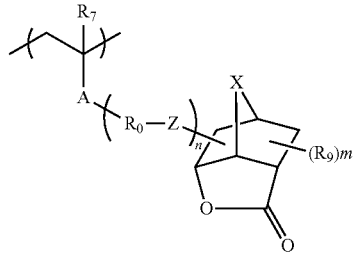

(III-1)

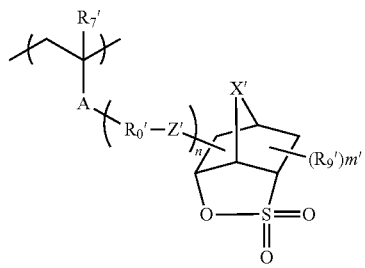

(III-1')

In formula (III-1) or (III-1'), $R_7$, A, $R_0$, Z and n have the same meanings as those in formula (III) above, respectively.

$R_7'$, A', $R_0'$, Z' and n' have the same meanings as $R_7$, A, $R_0$, Z and n in formula (III) above, respectively.

When a plurality of $R_9$ are present, each $R_9$ independently represents an alkyl group, a cycloalkyl group, an alkoxycarbonyl group, a cyano group, a hydroxyl group or an alkoxy group, and a plurality of $R_9$ are present, two $R_9$ may be connected to form a ring.

When a plurality of $R_9'$ are present, each $R_9'$ independently represents an alkyl group, a cycloalkyl group, an alkoxycarbonyl group, a cyano group, a hydroxyl group or an alkoxy group, and a plurality of $R_9'$ are present, two $R_9'$ may be connected to form a ring.

Each of X and X' independently represents an alkylene group, an oxygen atom or a sulfur atom.

Each m and m' is a number of the substituents and represents an integer from 0 to 5. Each of m and m' is preferably 0 or 1.

The alkyl group for any of $R_9$ and $R_9'$ is preferably an alkyl group having from 1 to 4 carbon atoms, more preferably a methyl group or an ethyl group, and most preferably a methyl group. Examples of the cycloalkyl group include a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and examples of the substituent include a hydroxyl group, an alkoxy group, for example, a methoxy group or an ethoxy group, a cyano group and a halogen atom, for example, a fluorine atom. Each of $R_9$ and $R_9'$ is more preferably a methyl group, a cyano group or an alkoxycarbonyl group, and still more preferably a cyano group.

Examples of the alkylene group for any of X and X' include a methylene group and an ethylene group. Each of X and X' is preferably an oxygen atom or a methylene group, and more preferably a methylene group.

When any of m and m' is 1 or more, at least one of $R_9$ and $R_9'$ is preferably substituted on the α-position or β-position of the carbonyl group of the lactone, and particularly preferably substituted on the α-position.

Specific examples of the repeating unit having the lactone structure or the sultone structure represented by formula (III-1) or (III-1') are set forth below, but the invention should not be construed as being limited thereto. In the specific examples below, R represents a hydrogen atom, an alkyl group which may have a substituent or a halogen atom, and preferably a hydrogen atom, a methyl group, a hydroxymethyl group or an acetoxymethyl group.

[Chem. 34]

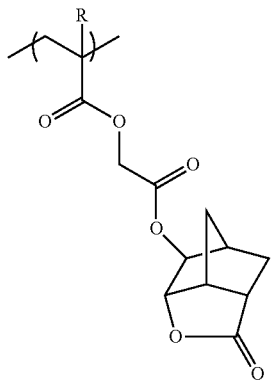

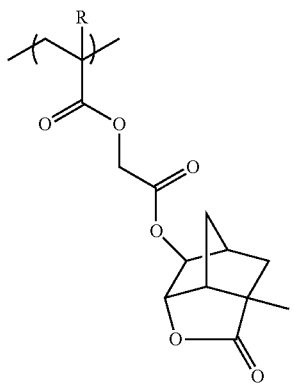

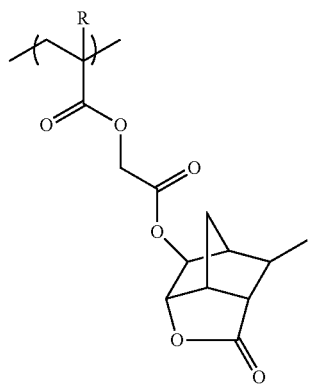

-continued

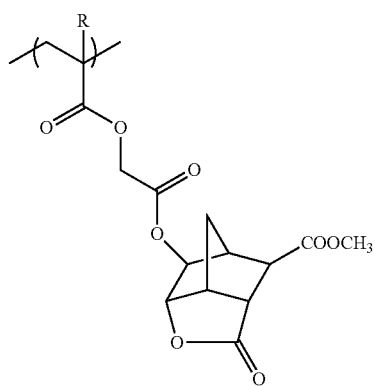

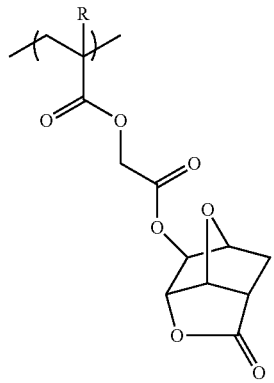

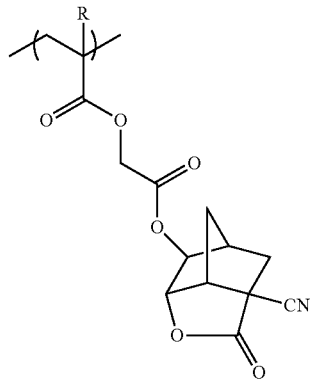

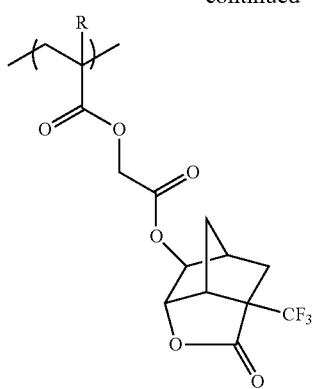
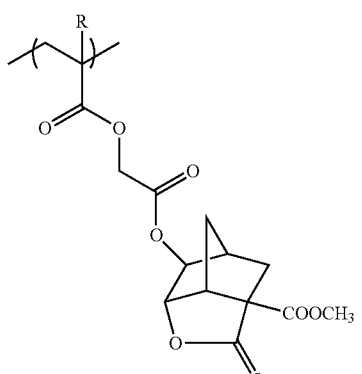
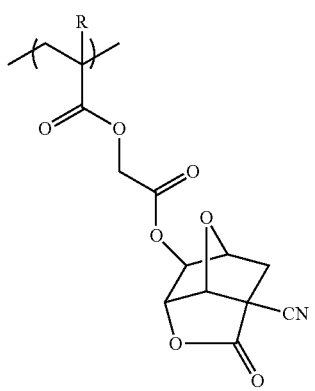
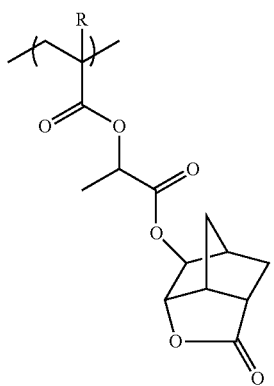
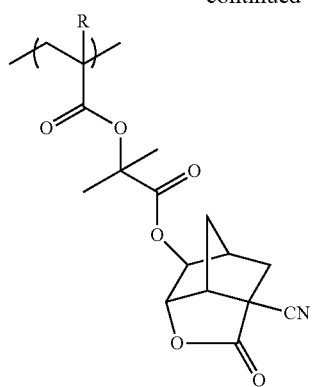
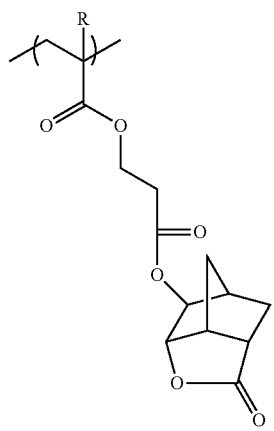
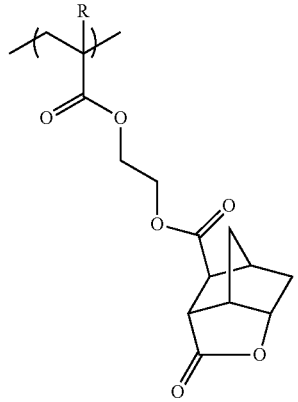
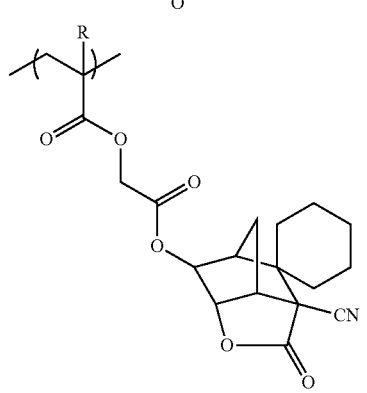

63
-continued
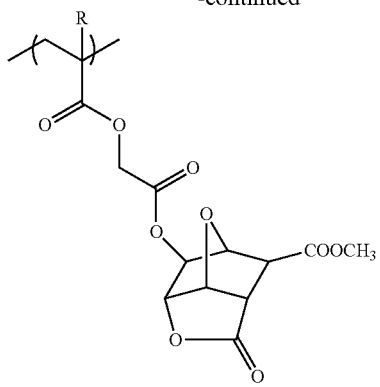
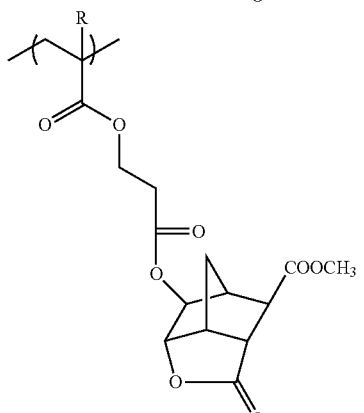
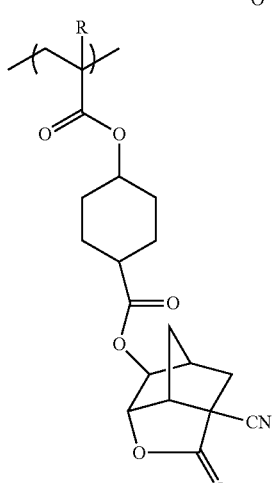
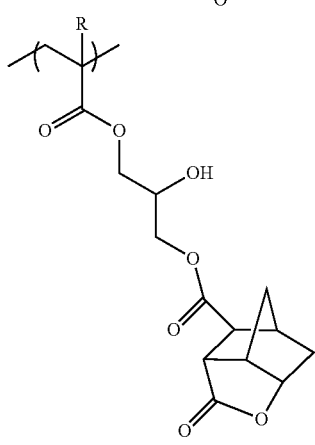
64
-continued
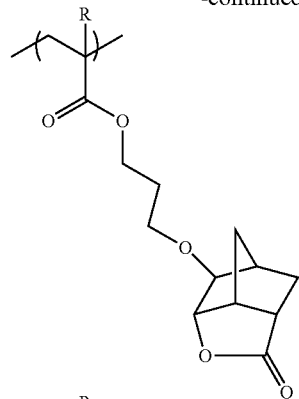
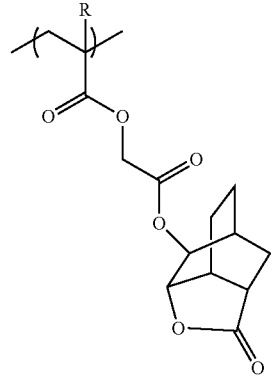
[Chem. 35]
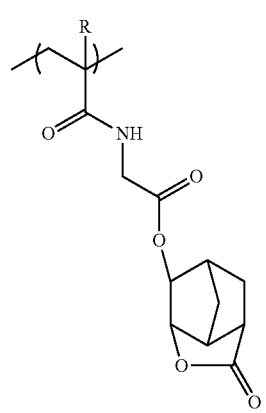
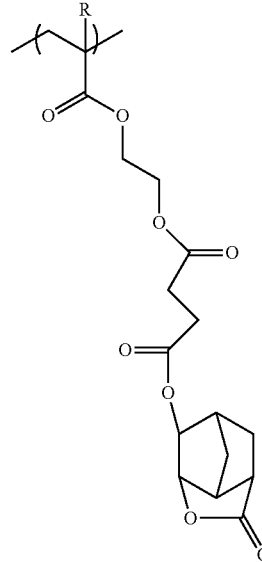

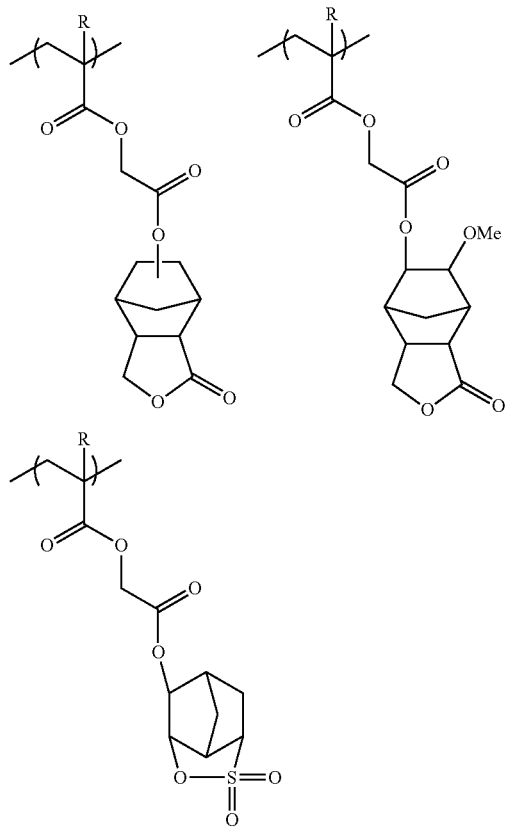

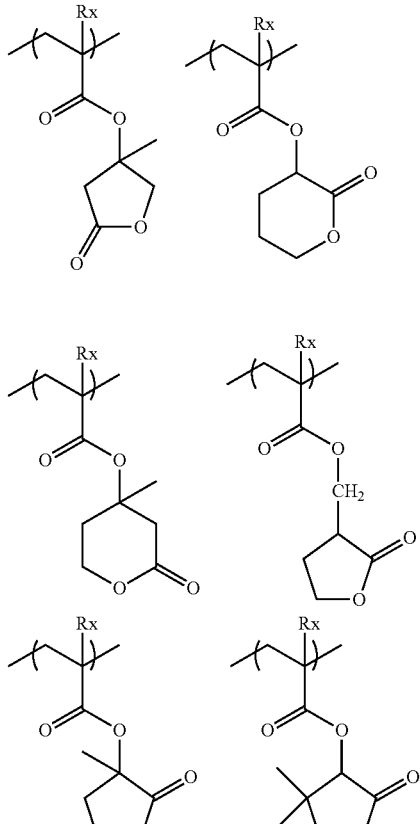

The content of the repeating unit represented by formula (III) (in the case of containing plural kinds of repeating units, the total thereof) is preferably from 15 to 60% by mole, more preferably from 20 to 60% by mole, still more preferably from 30 to 50% by mole, based on the total repeating units in the resin (A).

The resin (A) may also contain a repeating unit having the lactone structure or the sultone structure described above other than the repeating unit represented by formula (III).

Specific examples of the repeating unit having the lactone structure or the sultone structure are set for below, in addition to the specific examples set forth above, but the invention should not be construed as being limited thereto.

(in the formulae, Rx represents H, $CH_3$, $CH_2OH$ or $CF_3$)

[Chem. 36]

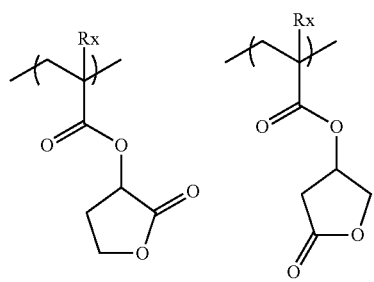

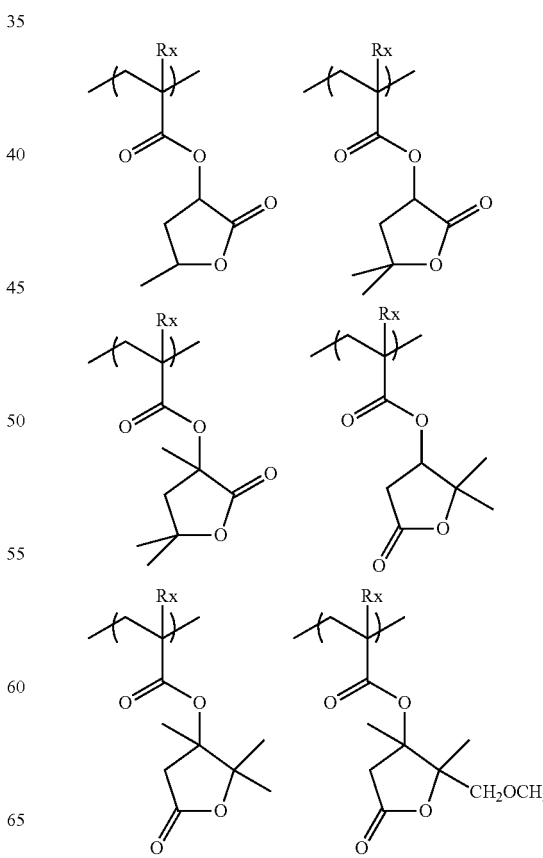

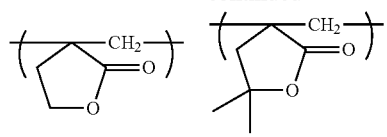
(in the formulae, Rx represents H, CH₃, CH₂OH, or CF₃)
[Chem. 37]
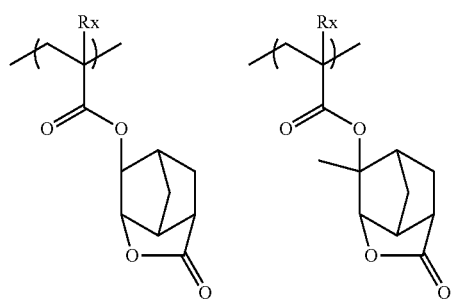
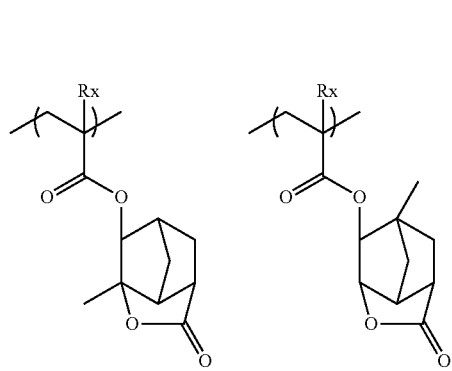
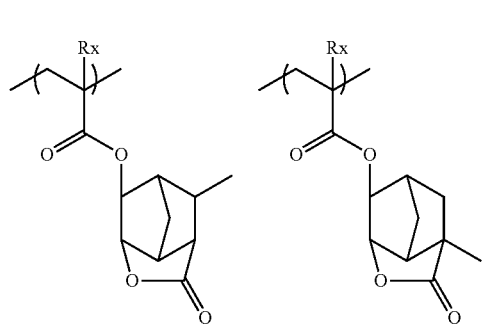
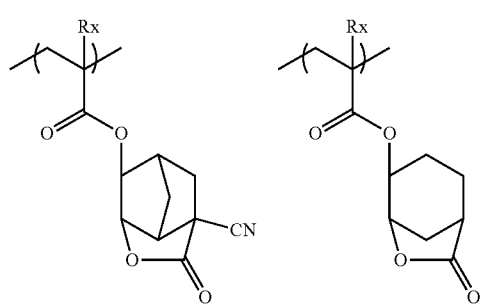
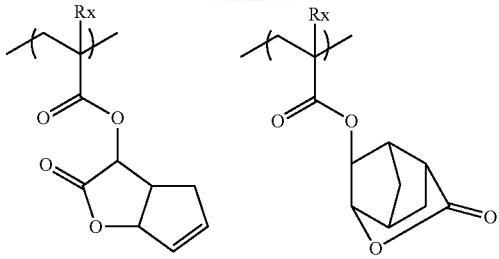
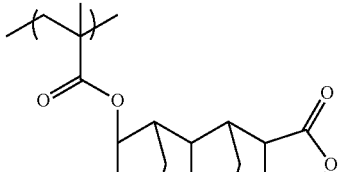
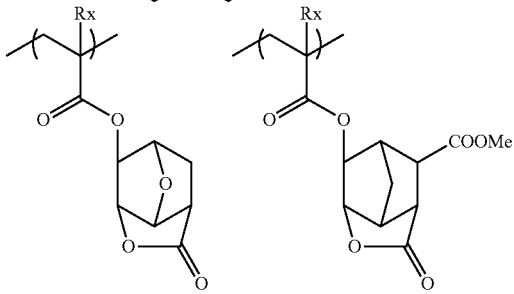
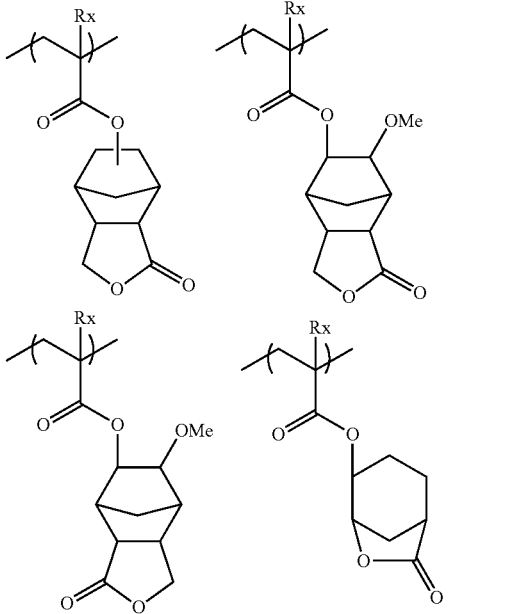
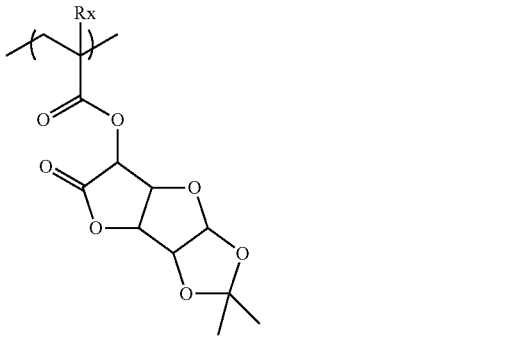

-continued
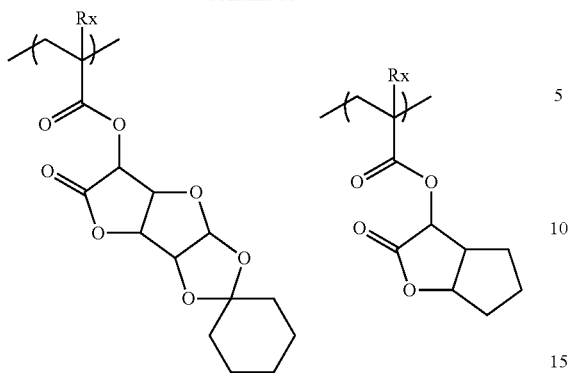
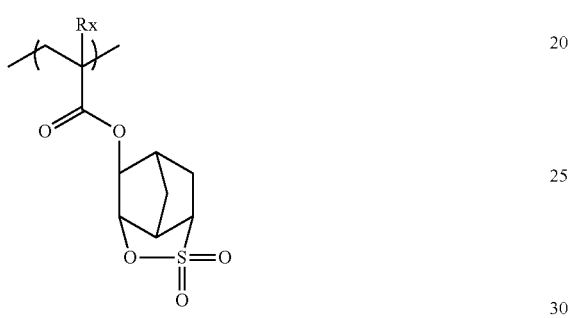
(in the formulae, Rx represents H, CH₃, CH₂OH or CF₃
[Chem. 38]
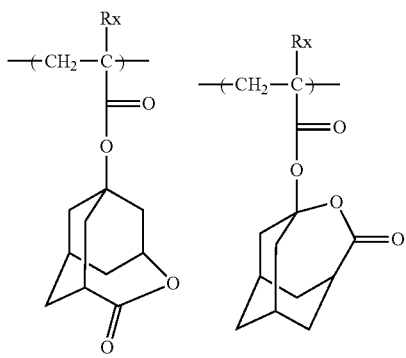
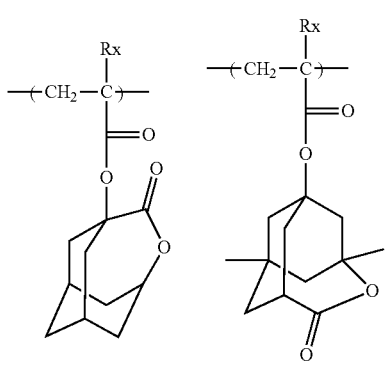
-continued
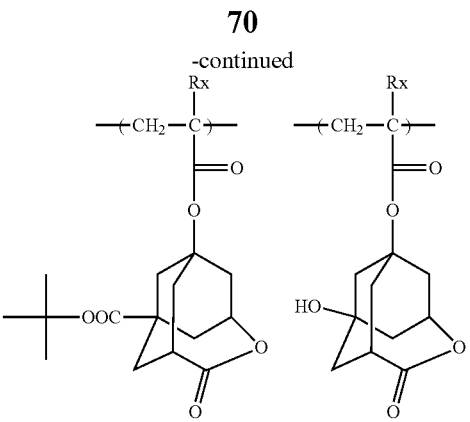
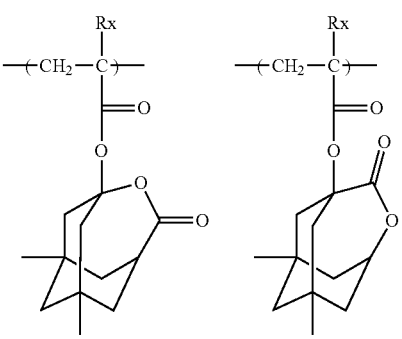
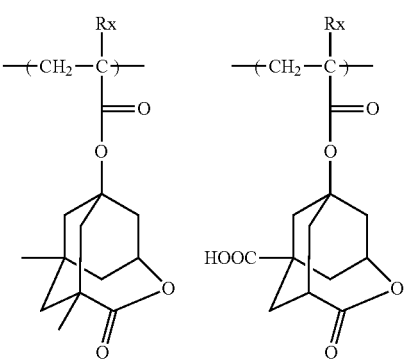
Of the specific examples described above, particularly preferred repeating units include the repeating units set forth below. By selecting an optimal lactone group or sultone group, the pattern profile and iso/dense bias are improved.

(in the formulae, Rx represents H, CH$_3$, CH$_2$OH, or CF$_3$)

[Chem. 39]

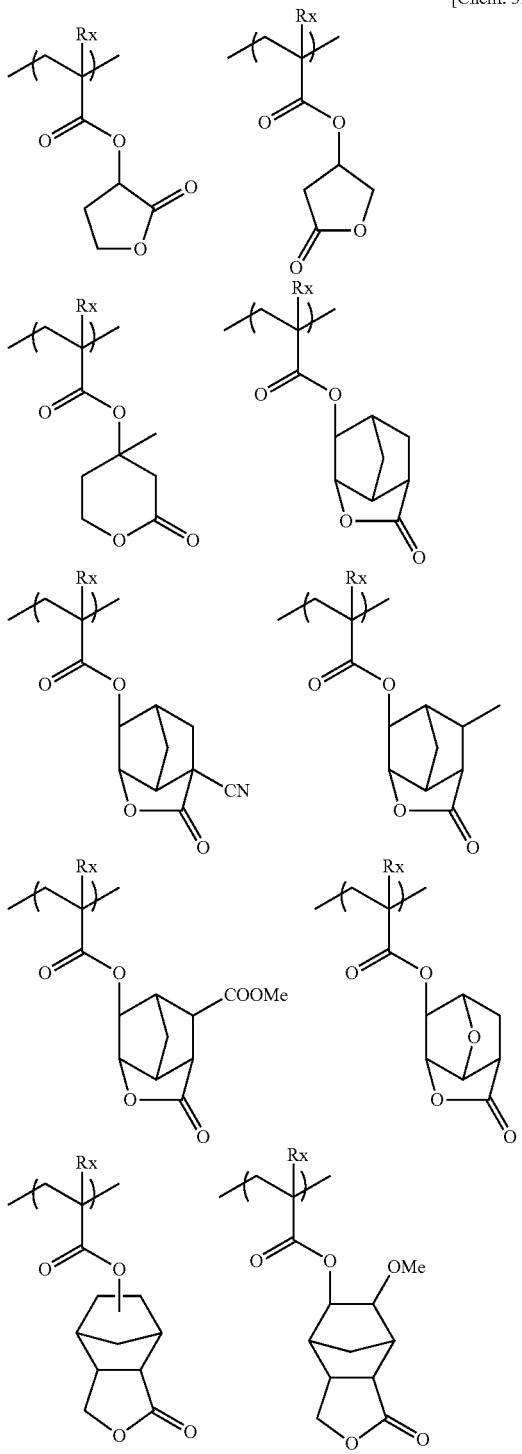

The repeating unit having a lactone group or a sultone group usually has an optical isomer, and any optical isomer may be used. One optical isomer may be used alone, or a plurality of optical isomers may be used as a mixture. In the case of mainly using one optical isomer, the optical purity (ee) thereof is preferably 90% or more, and more preferably 95% or more.

The content of the repeating unit having a lactone structure or a sultone structure other than the repeating unit represented by formula (III) (in the case of containing plural kinds of repeating units, the total thereof) is preferably from 15 to 60% by mole, more preferably from 20 to 50% by mole, still more preferably from 30 to 50% by mole, based on the total repeating units in the resin.

In order to enhance the effect of the invention, it is possible to use two or more kinds of the lactone or sultone repeating unites represented by formula (III) in combination. In the case of using in combination, it is preferred to use in combination by selecting two or more kinds of the lactone or sultone repeating unites wherein n is 1 from the repeating unites represented by formula (III).

It is also one of particularly preferred embodiments that the polar group which can be contained in the repeating unit (c) is an acidic group. Preferred acidic groups include a phenolic hydroxyl group, a carboxylic acid group, a sulfonic acid group, a fluorinated alcohol group (for example, hexafluoroisopropanol group), a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group and a tris(alkylsulfonyl)methylene group. Among them, the repeating unit (c) is more preferably a repeating unit having a carboxyl group. By containing the repeating unit having an acid group, the resolution in the use for contact hall is enhanced. As the repeating unit having an acidic group, any of a repeating unit where an acidic group is directly connected to the main chain of the resin, for example, a repeating unit derived from an acrylic acid or a methacrylic acid, a repeating unit where an acidic group is connected to the main chain of the resin through a connecting group, and a repeating unit where an acidic group is introduced into the terminal of the polymer chain by using an acidic group-containing polymerization initiator or chain transfer agent at the polymerization, is preferred. In particular, a repeating unit derived from an acrylic acid or a methacrylic acid is preferred.

The acidic group which can be contained in the repeating unit (c) may or may not contain an aromatic ring, and in the case of containing an aromatic ring, the acidic group is preferably selected from those other than a phenolic hydroxyl group. In the case where the repeating unit (c) contains an acidic group, the content of the repeating unit having an acidic group is preferably 30% by mole or less, more preferably 20% by mole or less, based on the total repeating units in the resin (A). In the case where the resin (A) contains a repeating unit having an acidic group, the content of the repeating unit having an acidic group in the resin (A) is usually 1% by mole or more.

Specific examples of the repeating unit having an acidic group are set forth below, but the invention should not be construed as being limited thereto.

In the specific examples, Rx represents H, CH$_3$, CH$_2$OH or CF$_3$.

[Chem. 40]

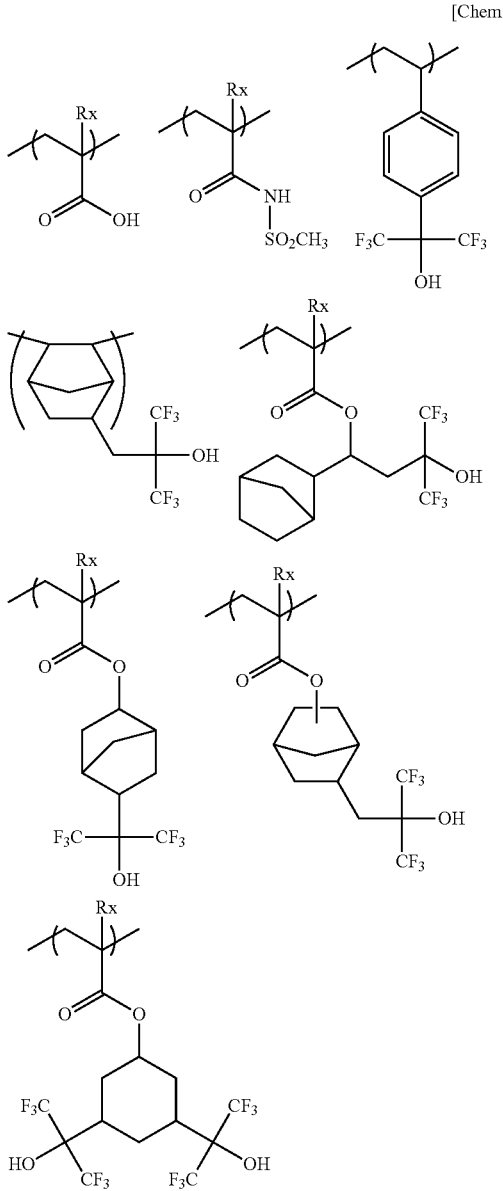

(d) Repeating Unit Having Plurality of Aromatic Rings

The resin (A) may contain a repeating unit (d) having a plurality of aromatic rings represented by formula (c1) shown below.

[Chem. 41]

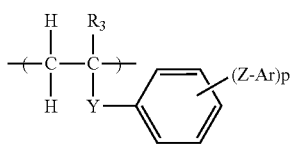

(c1)

In formula (c1), $R_3$ represents a hydrogen atom, an alkyl group, a halogen atom, a cyano group or a nitro group, Y represents a single bond or a divalent connecting group, Z represents a single bond or a divalent connecting group, Ar represents an aromatic ring group, and p represents an integer of 1 or more.

The alkyl group for $R_3$ may be any of straight-chain and branched, and includes, for example, a methyl group, an ethyl group, an n-propyl group, an isopropyl group, an n-butyl group, a sec-butyl group, a tert-butyl group, an n-pentyl group, an n-hexyl group, an n-heptyl group, an n-octyl group, an n-nonyl group, an n-decanyl group and an isobutyl group. The alkyl group may further have a substituent, and a preferred substituent includes, for example, an alkoxy group, a hydroxyl group, a halogen atom and a nitro group. Among them, the alkyl group having a substituent preferably includes a $CF_3$ group, an alkyloxycarbonylmethyl group, an alkylcarbonyloxymethyl group, a hydroxymethyl group and an alkoxymethyl group.

The halogen atom for $R_3$ includes a fluorine atom, a chlorine atom, a bromine atom and an iodine atom, and is particularly preferably a fluorine atom.

Y represents a single bond or a divalent connecting group, and the divalent connecting group includes, for example, an ether group (oxygen atom), a thioether group (sulfur atom), an alkylene group, an arylene group, a carbonyl group, a sulfido group, a sulfone group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO—, —OSO$_2$O—, an amino group (nitrogen atom), an acyl group, an alkylsulfonyl group, —CH=CH—, —C≡C—, an aminocarbonylamino group, a aminosulfonylamino group, and a group composed of a combination of these groups. Y has preferably 15 or less carbon atoms, more preferably 10 or less carbon atoms.

Y is preferably a single bond, a —COO— group, a —COS— group or a —CONH— group, more preferably a —COO— group or a —CONH— group, and particularly preferably a —COO— group.

Z represents a single bond or a divalent connecting group, and the divalent connecting group includes, for example, an ether group (oxygen atom), a thioether group (sulfur atom), an alkylene group, an arylene group, a carbonyl group, a sulfido group, a sulfone group, —COO—, —CONH—, —SO$_2$NH—, an amino group (nitrogen atom), an acyl group, an alkylsulfonyl group, —CH=CH—, an aminocarbonylamino group, a aminosulfonylamino group, and a group composed of a combination of these groups.

Z is preferably a single bond, an ether group, a carbonyl group or —COO—, more preferably a single bond or an ether group, and particularly preferably a single bond.

Ar represents an aromatic ring group, specifically includes, for example, a phenyl group, a naphthyl group, an anthracenyl group, a phenanthrenyl group, a quinolinyl group, a furanyl group, a thiophenyl group, a fluorenyl-9-on-yl group, an anthraquinonyl group, a phenanthraquinonyl group and a pyrrole group, and is preferably a phenyl group. The aromatic ring group may have a substituent, and a preferred substituent includes, for example, an alkyl group, an alkoxy group, a hydroxyl group, a halogen atom, a nitro group, an acyl group, an acyloxy group, an acylamino group, a sulfonylamino group, an aryl group, for example, a phenyl group, an aryloxy group, an arylcarbonyl group and a heterocyclic residue. Among them, a phenyl group is preferred from the standpoint of suppressing the deterioration of exposure latitude and pattern profile resulting from the out-of-band light.

p is an integer of 1 or more, and is preferably an integer from 1 to 3.

The repeating unit (d) is more preferably a repeating unit represented by formula (c2) shown below.

[Chem. 42]

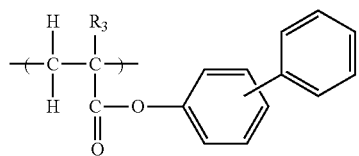

(c2)

In formula (c2), R$_3$ represents a hydrogen atom or an alkyl group. Preferred examples of the alkyl group represented by R$_3$ are same as those in formula (c1).

Here, with respect to the extreme ultraviolet ray (EUV light) exposure, leakage light (out-of-band light) occurred in the ultraviolet region having a wavelength from 100 to 400 nm deteriorates the surface roughness and as a result, the resolution and LWR performance tend to be decreased due to bridge between patterns or disconnection of pattern.

However, the aromatic ring in repeating unit (d) functions as an internal filter capable of absorbing the out-of-band light described above. Therefore, from the standpoint of high resolution and low LWR, it is preferred that the resin (A) contains the repeating unit (d).

Here, it is preferred that the repeating unit (d) does not contain a phenolic hydroxyl group (a hydroxyl group directly connected to the aromatic ring) from the standpoint of obtaining the high resolution.

Specific examples of the repeating unit (d) are set forth below, but the invention should not be construed as being limited thereto.

[Chem. 43]

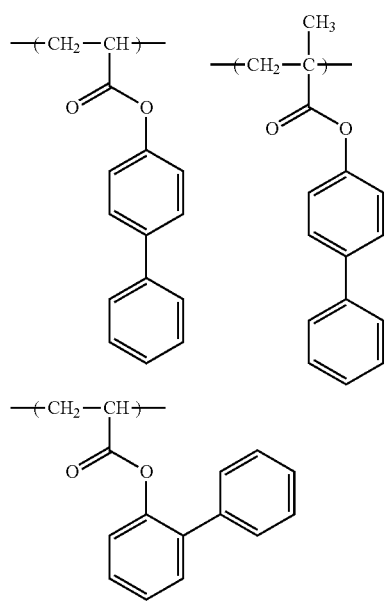

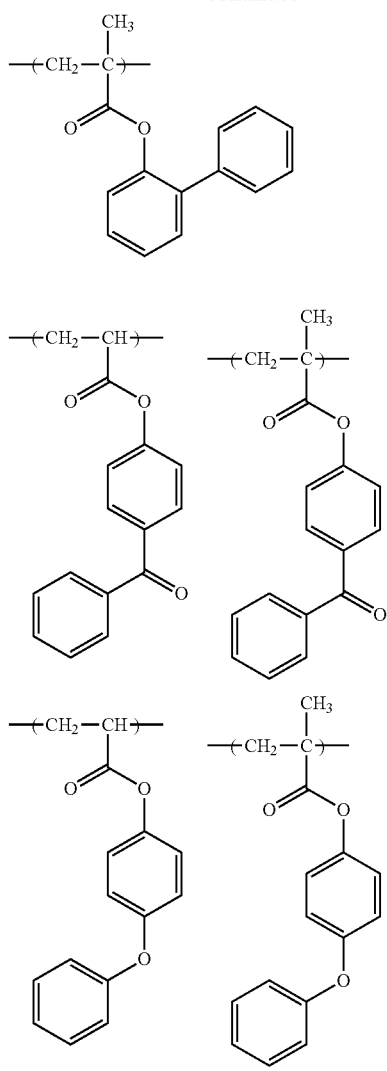

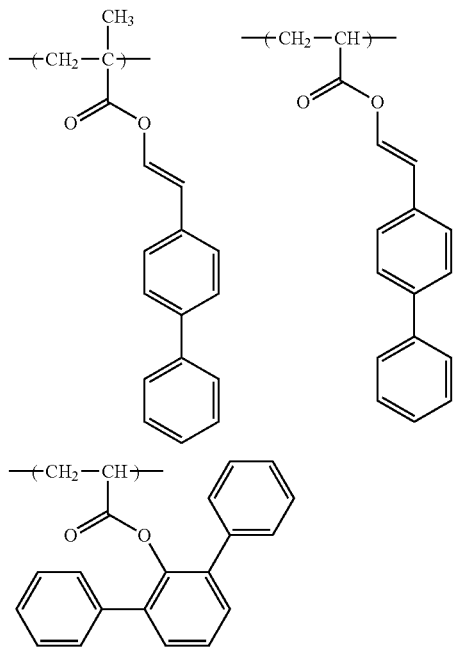

77
-continued
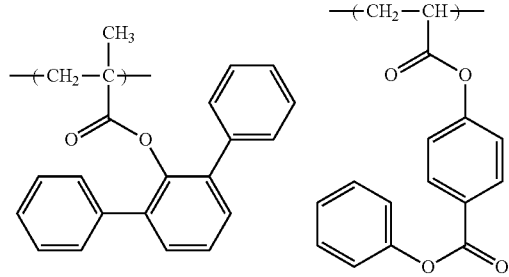
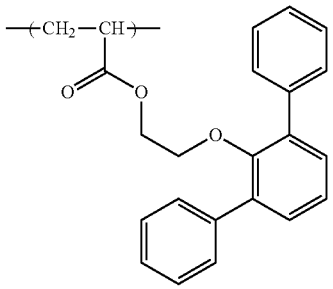
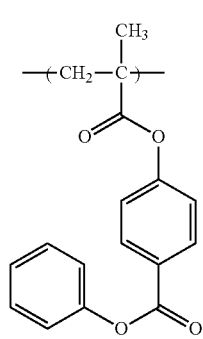
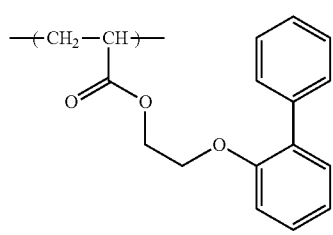
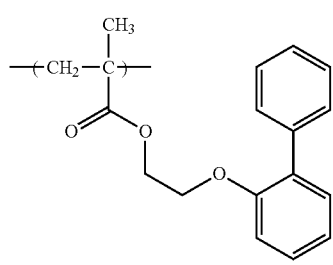
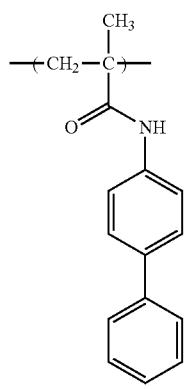
78
-continued
[Chem. 44]
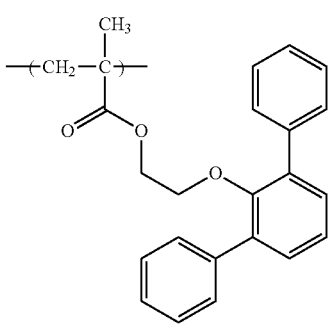
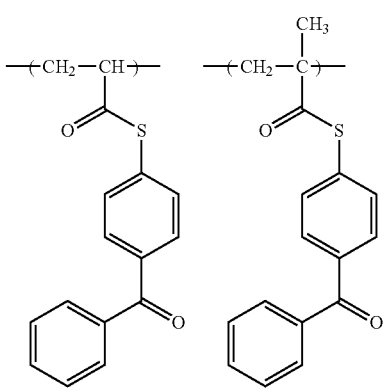
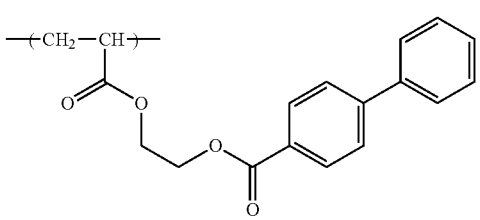
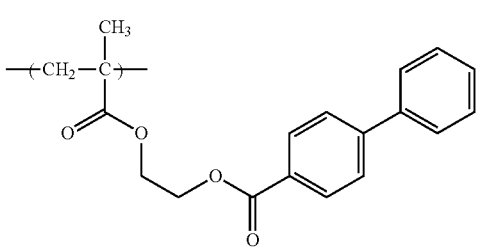

79
-continued
80
-continued
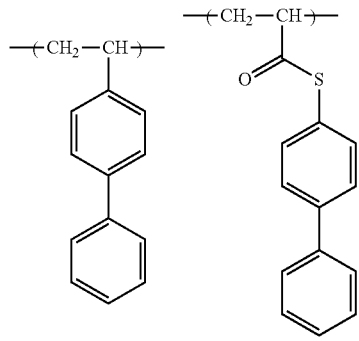
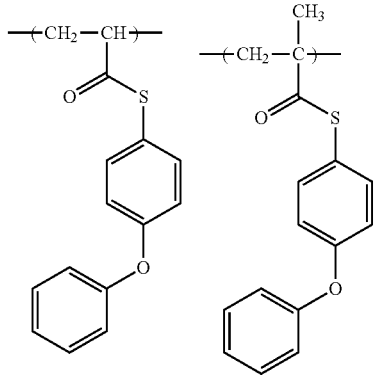
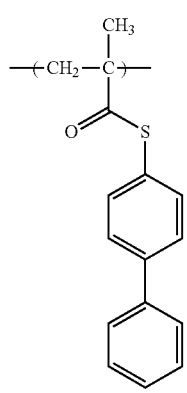
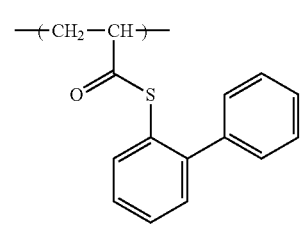
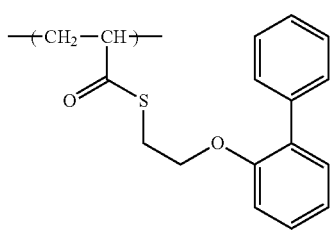
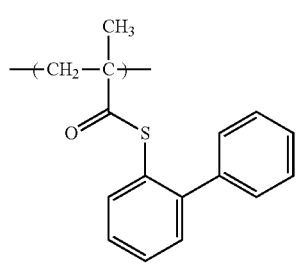
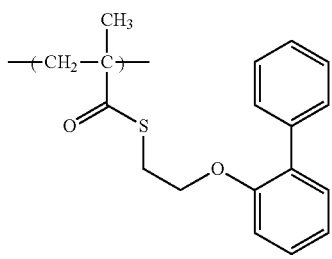
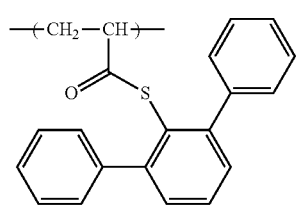
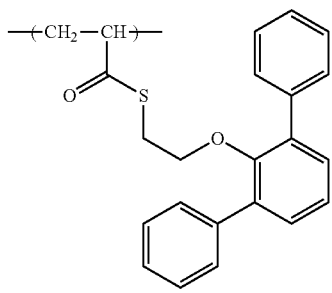
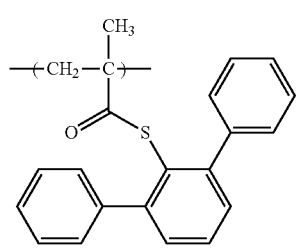
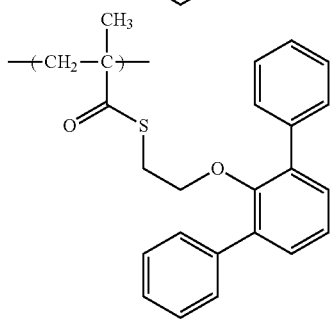

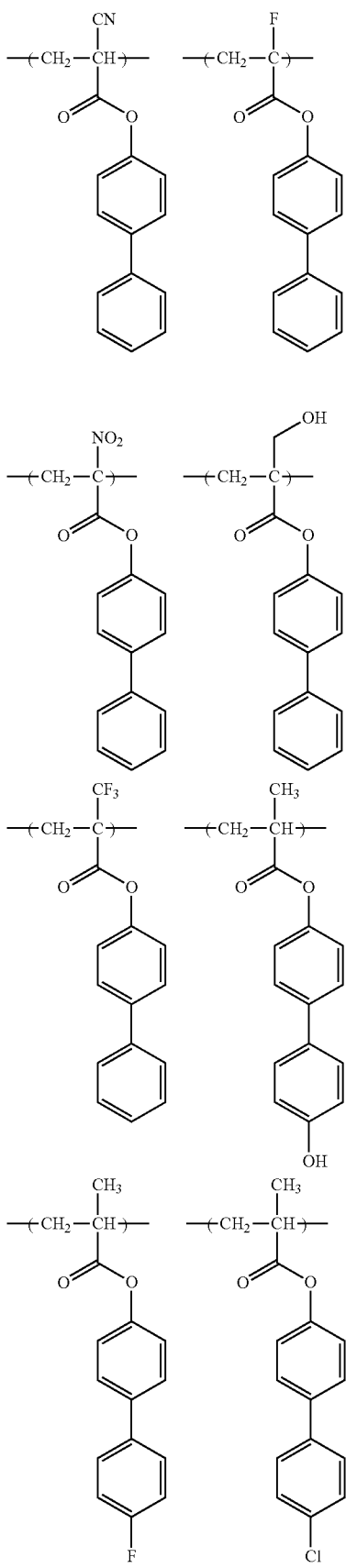

[Chem. 45]

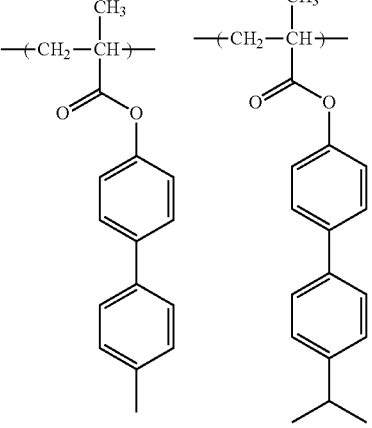

The resin (A) may or may not contain the repeating unit (d), and in the case of containing the repeating unit (d), the content thereof is preferably in a range from 1 to 30% by mole, more preferably in a range from 1 to 20% by mole, still more preferably in a range from 1 to 15% by mole, based on the total repeating units in the resin (A). As to the repeating unit (d) contained in the resin (A), two or more kinds of the repeating units may be contained in combination.

The resin (A) according to the invention may appropriately contain a repeating unit other than the repeating units (a) to (d) described above. As an example of such a repeating unit, the resin can further contain a repeating unit having an alicyclic hydrocarbon structure having no polar group (for example, the acid group, hydroxyl group or cyano group described above) and not exhibiting acid decomposability. Thus, the solubility of the resin at the development using a developer containing an organic solvent can be adequately adjusted. Such a repeating unit includes a repeating unit represented by formula (IV).

[Chem. 46]

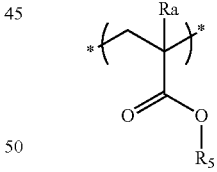

(IV)

In formula (IV), $R_5$ represents a hydrocarbon group having at least one cyclic structure and having no polar group. Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having from 3 to 12 carbon atoms, for example, a cyclopentyl group, a cyclohexyl group, cycloheptyl group or cyclooctyl group, and a cycloalkenyl group having from 3 to 12 carbon atoms, for example, a cyclohexenyl group. The monocyclic hydrocarbon group is preferably a monocyclic hydrocarbon group having from 3 to 7 carbon atoms, and more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring, for example, a pinane ring, a bornane ring, a norpinane ring, a norbornane ring or a bicyclooctane ring (for example, a bicyclo[2.2.2]octane ring or a bicyclo[3.2.1]octane ring), a tricyclic hydrocarbon ring, for example, a homobledane ring, an adamantane ring, a tricyclo[5.2.1.0$^{2,6}$]decane ring or a tricyclo[4.3.1.1$^{2,5}$]undecane ring, and a tetracyclic hydrocarbon ring, for example, a tetracyclo[4.4.0.1$^{2,5}$.1$^{7,10}$]dodecane ring or a perhydro-1,4-methano-5,8-methanonaphthalene ring. Also, the crosslinked cyclic hydrocarbon ring includes a condensed cyclic hydrocarbon ring, for example, a condensed ring formed by fusing a plurality of 5-membered to 8-membered cycloalkane rings, for example, a perhydronaphthalene (decalin) ring, a perhydroanthracene ring, a perhydrophenathrene ring, a perhydroacenaphthene ring, a perhydrofluorene ring, a perhydroindene ring or a perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. More referred examples of the crosslinked cyclic hydrocarbon ring include a norbornyl group and an adamantyl group.

Such an alicyclic hydrocarbon group may have a substituent, and preferred examples of the substituent include a halogen atom, an alkyl group, a hydroxyl group in which the hydrogen atom is substituted, and an amino group in which the hydrogen atom is substituted. The halogen atom preferably includes a bromine atom, a chlorine atom and a fluorine atom. The alkyl group preferably includes a methyl group, an ethyl group, a butyl group and a tert-butyl group. The alkyl group may further have a substituent, and the substituent which may be further substituted on the alkyl group includes a halogen atom, an alkyl group, a hydroxyl group in which the hydrogen atom is substituted, and an amino group in which the hydrogen atom is substituted.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group preferably includes an alkyl group having from 1 to 4 carbon atoms; the substituted methyl group preferably includes a methoxymethyl group, a methoxythiomethyl group, a benzyloxymethyl group, a tert-butoxymethyl group and a 2-methoxyethoxymethyl group; the substituted ethyl group preferably includes a 1-ethoxyethyl group and a 1-methyl-1-methoxyethyl group; the acyl group preferably includes an aliphatic acyl group having from 1 to 6 carbon atoms, for example, a formyl group, an acetyl group, a propionyl group, a butyryl group, an isobutyryl group, a valeryl group or a pivaloyl group; and the alkoxycarbonyl group preferably includes, for example, an alkoxycarbonyl group having from 1 to 4 carbon atoms.

The resin (A) may or may not contain a repeating unit having an alicyclic hydrocarbon structure having no polar group and not exhibiting acid decomposability, and in the case of containing the repeating unit, the content the repeating unit is preferably from 1 to 20% by mole, more preferably from 5 to 15% by mole, based on the total repeating units in the resin (A).

Specific examples of the repeating unit having an alicyclic hydrocarbon structure having no polar group and not exhibiting acid decomposability are set forth below, but the invention should not be construed as being limited thereto. In the formulae, Ra represents H, CH$_3$, CH$_2$OH or CF$_3$.

[Chem. 47]

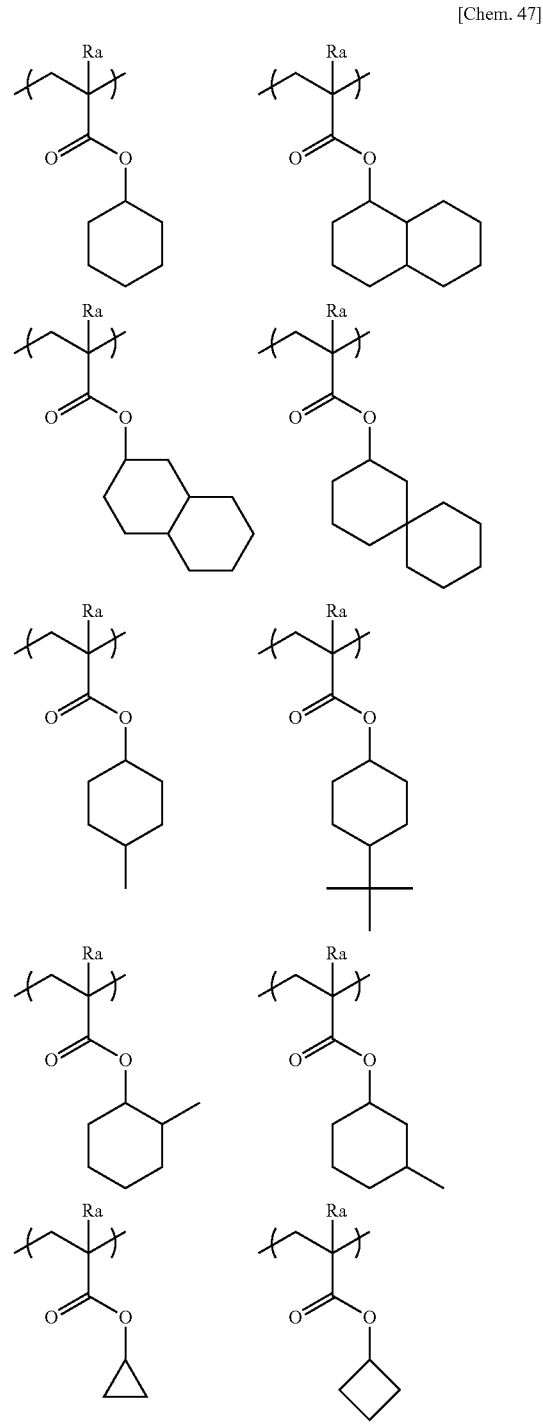

-continued

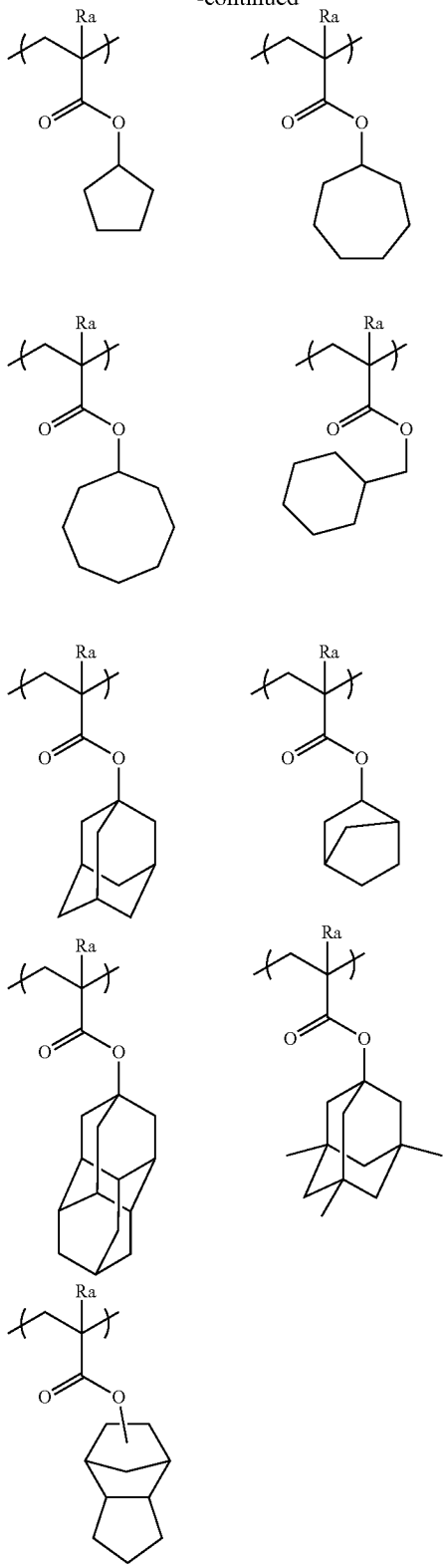

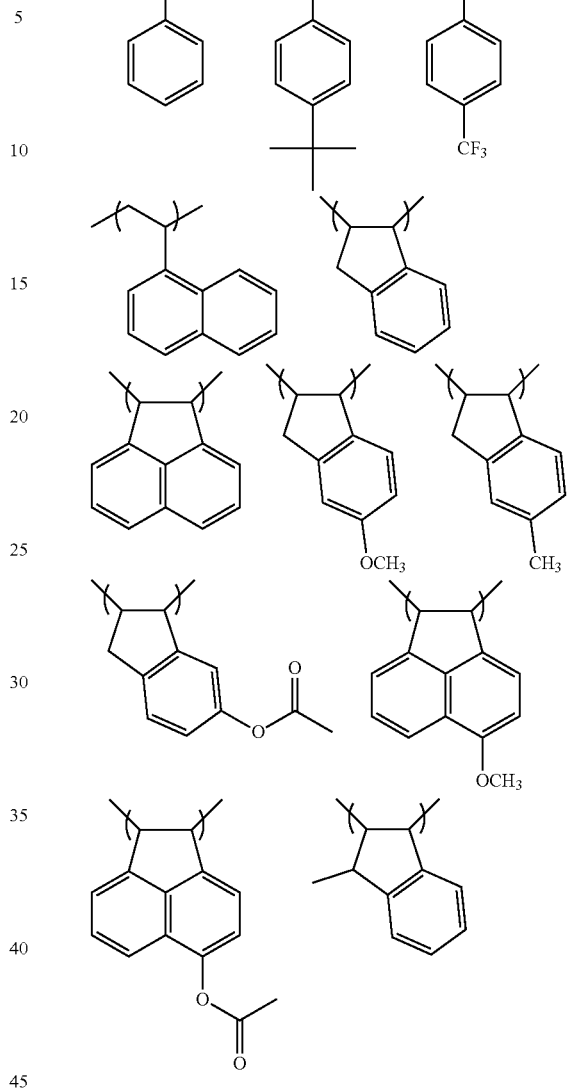

Also, the resin (A) may contain a monomer component shown below, from the standpoint of enhancing Tg, increasing dry etching resistance and achieving the effect, for example, internal filter for the out-of-band light described above.

In the resin (A) for use in the composition according to the invention, the molar ratio of respective repeating structural units contained is appropriately set to control the dry etching resistance or suitability for standard developer of a resist, the adhesion property to a substrate, the resist profile and further the performances commonly required of a resist, for example, resolution, heat resistance and sensitivity.

The form of the resin (A) according to the invention may be any of a random type, a block type, a comb type and a star type.

The resin (A) can be synthesized, for example, by radical, cationic or anionic polymerization of unsaturated monomers corresponding to the respective structures. It is also possible to obtain the desired resin by polymerizing unsaturated monomers corresponding to precursors of the respective structures and then performing a polymer reaction.

Examples of the common synthesis method include a batch polymerization method of dissolving unsaturated monomers and a polymerization initiator in a solvent and heating the solution to perform the polymerization, and a dropping polymerization method of adding dropwise a solution containing unsaturated monomers and a polymerization initiator to a solvent heated over a period from 1 to 10 hours. The dropping polymerization method is preferred.

The solvent used for the polymerization includes, for example, a solvent which can be used in the preparation of the actinic ray-sensitive or radiation-sensitive resin composition described later, and it is more preferred to perform the polymerization by using the same solvent as the solvent used in the composition according to the invention. Thus, generation of particles during storage can be suppressed.

The polymerization reaction is preferably performed in an inert gas atmosphere, for example, nitrogen or argon. As to the polymerization initiator, the polymerization is started using a commercially available radical initiator (for example, an azo initiator or a peroxide). The radical initiator is preferably an azo initiator, and an azo initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). If desired, the polymerization may be performed in the presence of a chain transfer agent (for example, an alkylmercaptan).

The concentration in the reaction is from 5 to 70% by mass, and preferably from 10 to 50% by mass. The reaction temperature is usually from 10 to 150° C., preferably from 30 to 120° C., and more preferably from 40 to 100° C.

The reaction time is usually from 1 to 48 hours, preferably from 1 to 24 hours, and more preferably from 1 to 12 hours.

After the completion of the reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution state, for example, ultrafiltration of removing by extraction of only compounds having a molecular weight lower than a specific molecular weight, a reprecipitation method of adding dropwise the resin solution to a poor solvent to solidify the resin in the poor solvent, thereby removing residual monomers or the like, or a purification method in a solid state, for example, washing of the resin slurry separated by filtration with a poor solvent, may be applied. For example, the resin is precipitated as a solid by contacting the reaction solution with a solvent in which the resin is sparingly soluble or insoluble (poor solvent) and which is in a volume amount of 10 times or less, preferably in a volume amount from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents and the like, according to the kind of the polymer. Of the solvents, a solvent containing at least an alcohol (particularly, methanol or the like) or water is preferred as the precipitation or reprecipitation solvent.

The amount of the precipitation or reprecipitation solvent used can be appropriately selected by taking into consideration the efficiency, yield and the like, and in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation can be appropriately selected by taking into consideration the efficiency or operability, and is usually approximately from 0 to 50° C., preferably in the vicinity of room temperature (for example, approximately from 20 to 35° C.). The precipitation or reprecipitation operation can be performed by a known method, for example, a batch system or a continuous system using a mixing vessel in common use, for example, a stirring tank.

The polymer precipitated or reprecipitated is usually subjected to solid-liquid separation in common use, for example, filtration or centrifugation, and dried to be used. The filtration is performed using a solvent-resistant filter element preferably under pressure. The drying is performed under an atmospheric pressure or a reduced pressure (preferably under a reduced pressure) at a temperature of approximately from 30 to 100° C., preferably approximately from 30 to 50° C.

After the resin is once precipitated and separated, the resin may be again dissolved in a solvent and then put into contact with a solvent in which the resin is sparingly soluble or insoluble. Specifically, there may be used a method including, after the completion of the radical polymerization reaction described above, bringing the polymer into contact with a solvent in which the polymer is sparingly soluble or insoluble, to precipitate a resin (step a), separating the resin from the solution (step b), anew dissolving the resin in a solvent to prepare resin solution A (step c), bringing the resin solution A into contact with a solvent in which the resin is sparingly soluble or insoluble and which is in a volume amount of less than 10 times (preferably in a volume amount of 5 times or less) the resin solution A, to precipitate a resin solid (step d), and separating the resin precipitated (step e).

The polymerization reaction is preferably performed in an inert gas atmosphere, for example, nitrogen or argon. As to the polymerization initiator, the polymerization is started using a commercially available radical initiator (for example, an azo initiator or a peroxide). The radical initiator is preferably an azo initiator, and an azo initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). The initiator is added additionally or separately, if desired. After the completion of the reaction, the reaction product is poured in a solvent, and the desired polymer is recovered, for example, by a method for powder or solid recovery. The concentration in the reaction is from 5 to 50% by mass, and preferably from 10 to 30% by mass. The reaction temperature is usually from 10 to 150° C., preferably from 30 to 120° C., and more preferably from 60 to 100° C.

The molecular weight of the resin (A) according to the invention is not particularly limited, and the weight average molecular weight is preferably in a range from 1,000 to 100,000, more preferably in a range from 1,500 to 60,000, and particularly preferably in a range from 2,000 to 30,000. When the weight average molecular weight is in a range from 1,000 to 100,000, the deterioration of heat resistance and dry etching resistance can be prevented and also, the deterioration of developing property and the deterioration of film-forming property due to increase in the viscosity can be prevented. Here, the weight average molecular weight of the resin is indicated as a molecular weight calculated in terms of polystyrene measured by GPC (carrier: THF or N-methyl-2-pyrrolidone (NMP)).

The polydispersity (Mw/Mn) is preferably from 1.00 to 5.00, more preferably from 1.00 to 3.50, and still more preferably from 1.00 to 2.50. As the molecular weight distribution is narrower, the resolution and resist profile are more excellent, the side wall of the resist pattern is smoother, and the roughness performance is more excellent.

The resin (A) according to the invention can be used one kind alone or in combination of two or more kinds thereof. The content of the resin (A) is preferably from 20 to 99% by mass, more preferably from 30 to 99% by mass, still more preferably from 40 to 99% by mass, based on the total solid content of the actinic ray-sensitive or radiation-sensitive resin composition according to the invention.

[2] Ionic Compound Represented by Formula (2) (B)

The actinic ray-sensitive or radiation-sensitive resin composition according to the invention contains an ionic compound represented by formula (2) (B) shown below.

[Chem. 49]

$$(Rx)_{n2}X^{\oplus}\text{-}L\text{-}A^{\ominus} \quad (2)$$

In formula (2) above, $A^-$ represents an organic acid anion, L represents a single bond or a divalent connecting group, cation $X^+$ represents a nitrogen cation or a sulfur cation, each Rx independently represents an alkyl group or an aryl group. A plurality of Rx may be connected to each other to from a ring, and the ring formed may contain a nitrogen atom, an oxygen atom or a sulfur atom, as a ring member.

n2 represents 3, when $X^+$ is a nitrogen cation, and n2 represents 2, when $X^+$ is a sulfur cation.

In formula (2) above, a conjugate base structure of organic acid anion $A^-$ is not particularly limited and includes a conjugate base structure, for example, a carboxylic acid group, a sulfonic acid group, a hydroxyl group, a mercapto group, an imido group, a sulfonamido group, a sulfonimido group, a methylene compound (for example, a malonic acid derivative, an acetoacetic acid derivative, a cyanoacetic acid derivative, a malononitrile derivative, a cyclopentadiene derivative or a bissulfonylmethane derivative), and a nitrogen-containing aromatic compound (for example, an imidazole derivative, an indole derivative or an isocyanuric acid derivative). Among them, a carboxylic acid group or a sulfonic acid group is preferred, and a carboxylic acid group is particularly preferred.

The organic acid anion $A^-$ is not particularly limited, and is preferably a carboxylic acid anion or a sulfonic acid anion, and particularly preferably a carboxylic acid anion.

The cation $X^+$ represents any of a nitrogen cation or a sulfur cation, and is preferably a nitrogen cation.

The divalent connecting group for L includes, for example, an alkylene group (for example, a methylene group, an ethylene group, a propylene group, a butylene group, a hexylene group or an octylene group), a cycloalkylene group (for example, a cyclopentylene group, a cyclohexylene group or an adamantylene group), an arylene group (for example, a phenylene group, a tolylene group or a naphthylene group), an alkenylene group (for example, an ethenylene group, a propenylene group or a butenylene group), —COO—, —OCO—, —CO—, —O—, —S—, —SO—, —SO$_2$—, and a group composed of a combination of these two or more groups, and is preferably an alkylene group, a cycloalkylene group, an arylene group or a group composed of a combination of these two or more groups, more preferably an alkylene group, a cycloalkylene group or an arylene group.

The divalent connecting group for L may have a substituent.

The substituent which the divalent connecting group for L may have includes, for example, an alkoxy group (preferably having from 1 to 15 carbon atoms), an alkylthio group (preferably having from 1 to 15 carbon atoms), an alkylcarbonylamino group (preferably having from 1 to 15 carbon atoms), a hydroxyl group, an alkyl group (preferably having from 1 to 15 carbon atoms), a cycloalkyl group (preferably having from 3 to 15 carbon atoms), an aryl group (preferably having from 6 to 14 carbon atoms), a halogen atom, an acyl group (preferably having from 2 to 15 carbon atoms), an acyloxy group (preferably having from 2 to 15 carbon atoms), an alkoxycarbonyl group (preferably having from 2 to 15 carbon atoms), a cyano group and a nitro group.

Rx represents an alkyl group, a cycloalkyl group, an aryl group, an aralkyl group or a heterocyclic group.

The alkyl group for Rx includes a strait chain or branched alkyl group having 20 or less carbon atoms, for example, a methyl group, an ethyl group, a propyl group, an isopropyl group, an n-butyl group, a sec-butyl group, a pentyl group, a cyclopentyl group, a hexyl group, a cyclohexyl group, a 2-ethylhexyl group, an octyl group or a dodecyl group. Since as the number of the carbon atoms around the nitrogen atom in the ionic compound represented by formula (2) above increases, the hydrophobicity is able to be increased, the total number of the carbon atoms in a n2 number of the alkyl groups for Rx is preferably from 3 to 30, more preferably from 4 to 25, and particularly preferably from 5 to 20.

The cycloalkyl group for Rx may be a monocyclic type or a polycyclic type, and is preferably a cycloalkyl group having from 3 to 15 carbon atoms, more preferably a cycloalkyl group having from 3 to 10 carbon atoms, and still more preferably a cycloalkyl group having from 3 to 6 carbon atoms. Specific examples of the cycloalkyl group for Rx include a cyclopropyl group, a cyclobutyl group, a cyclopentyl group or a cyclohexyl group, a cycloheptyl group, a cyclooctyl group, a decahydronaphthyl group, a cyclodecyl group, a 1-adamantyl group, a 2-adamantyl group, a 1-norbornyl group and a 2-norbornyl group. The cycloalkyl group for Rx is preferably a cyclopropyl group, a cyclopentyl group or a cyclohexyl group.

The aryl group for Rx includes an aryl group having from 6 to 18 carbon atoms, for example, a phenyl group or a naphthyl group, and is more preferably an aryl group having from 6 to 10 carbon atoms.

The aralkyl group for Rx is preferably an aralkyl group having from 6 to 20 carbon atoms, and more preferably an aralkyl group having from 7 to 12 carbon atoms. Specific examples of the aralkyl group for Rx include a benzyl group, a phenethyl group, a naphthylmethyl group and a naphthylmethyl group.

The heterocyclic group for Rx is preferably a heterocyclic group having from 6 to 20 carbon atoms, and more preferably a heterocyclic group having from 6 to 12 carbon atoms. Specific examples of the heterocyclic group for Rx include a pyridyl group, pirazyl group, a tetrahydrofuranyl group, a tetrahydropyranyl group, a tetrahydrothiophenyl group, a piperidyl group, a piperazyl group, a furanyl group, a pyrenyl group and a chromanyl group.

The alkyl group, cycloalkyl group, aryl group, aralkyl group and heterocyclic group for Rx may further have a substituent.

Specific examples and preferred examples of the substituent which the alkyl group, cycloalkyl group, aryl group, aralkyl group and heterocyclic group for Rx may further have include the same groups as the specific examples and preferred examples of the substituent which the divalent connecting group represented by L may have described above.

A plurality of Rx may be connected to each other to from a ring, and the ring formed may contain a nitrogen atom, an oxygen atom or a sulfur atom, as a ring member.

The ring formed includes, for example, a cyclopentane ring, a cyclohexane rung, an adamantane ring, a norbornene ring and a norbornane ring. The ring may have a substituent, and specific examples of the substituent which the ring may have include the respective groups described above as the specific examples of the substituent which the divalent connecting group represented by L may have described above.

The ionic compound represented by formula (2) above can be synthesized by a known method. For example, it can be synthesized in accordance with methods described, for example, in Hiroshi Horiguchi, Gosei Kaimen Kasseizai <Augmented Edition>, Sankyo Publishing Co., Ltd., 1969 or Kaimen Kasseizai Hyoka•Shikenho Henshuiinkai, Kaimen Kasseizai Hyoka•Shikenho, Gihodo Shuppan Co., Ltd., 2002.

Specific examples of the ionic compound represented by formula (2) are set forth below, but the invention should not be construed as being limited thereto.

[Chem. 50]

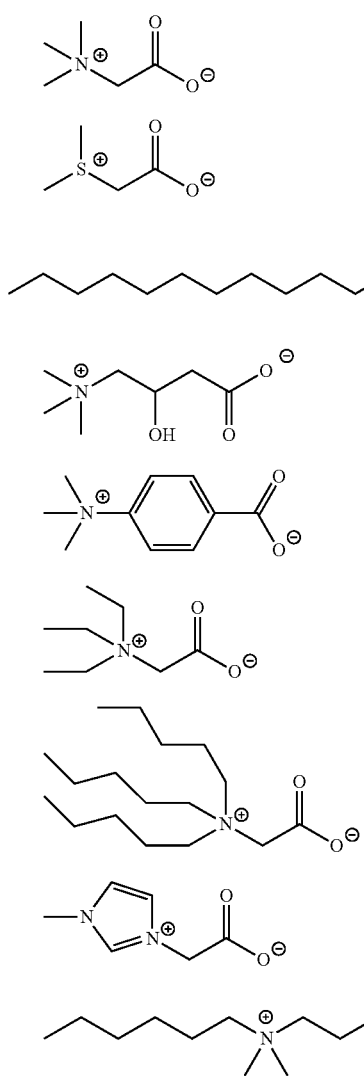

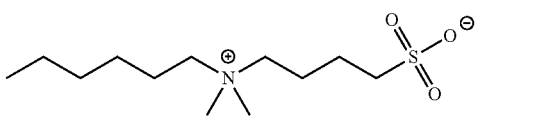
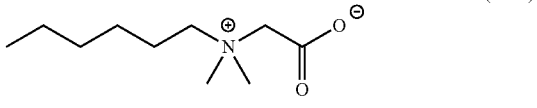
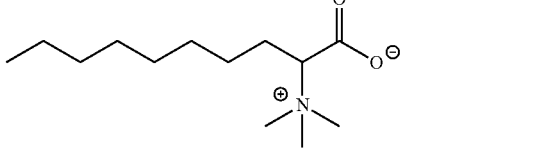
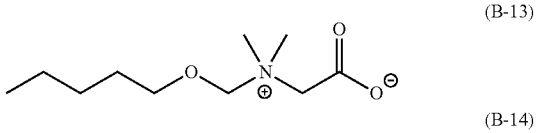
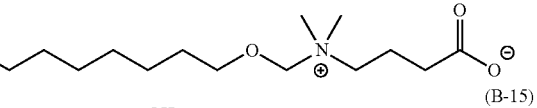
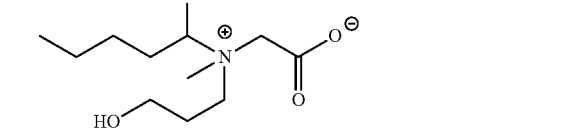
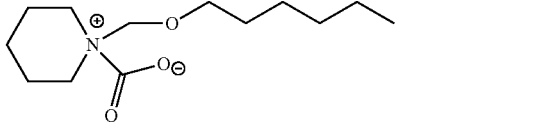
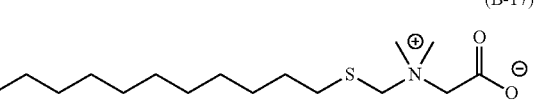
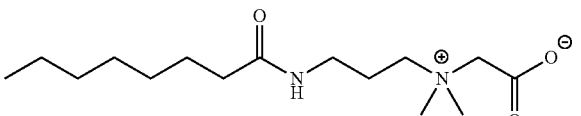
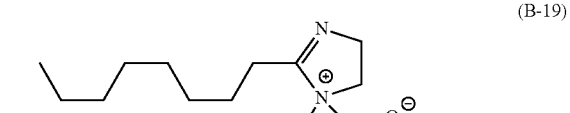
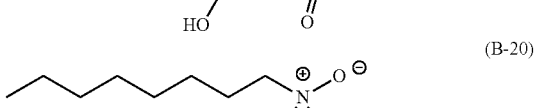
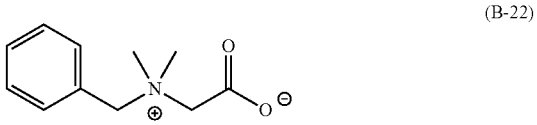

-continued (B-23)

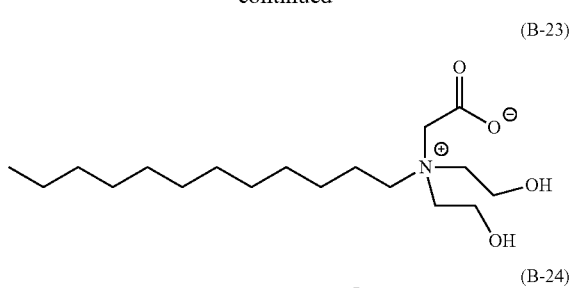

(B-24)

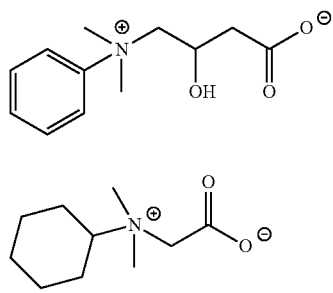

(B-25)

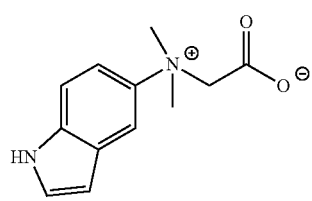

(B-26)

The ionic compound represented by formula (2) can be used one kind alone or in combination of two or more kinds thereof. The content of the ionic compound represented by formula (2) is preferably from 0.001 to 10% by mass, particularly preferably from 0.01 to 5% by mass, based on the total solid content of the actinic ray-sensitive or radiation-sensitive resin composition according to the invention.

[3] Compound Capable of Generating Acid Upon Irradiation with Actinic Ray or Radiation (C)

The composition according to the invention usually contains a compound capable of generating an acid upon irradiation with an actinic ray or radiation (hereinafter, also referred to as an "acid generator").

The acid generator is not particularly limited as long as it is a known acid generator, and a compound capable of generating an organic acid, for example, at least any one of a sulfonic acid, a bis(alkylsulfonyl)imide and a tris(alkylsulfonyl)methide, upon irradiation with an actinic ray or radiation is preferred.

More preferred acid generators include compounds represented by formulae (ZI), (ZII) and (ZIII) shown below.

[Chem. 51]

(ZI)

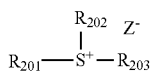

(ZII)

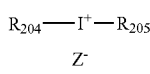

-continued (ZIII)

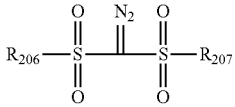

In formula (ZI), each of $R_{201}$, $R_{202}$ and $R_{203}$ independently represents an organic group.

The number of carbon atoms in the organic group for any of $R_{201}$, $R_{202}$ and $R_{203}$ is ordinarily from 1 to 30, and preferably from 1 to 20.

Also, two of $R_{201}$ to $R_{203}$ may be connected to form a ring structure, and the ring may contain therein an oxygen atom, a sulfur atom, an ester bond, an amide bond or a carbonyl group. The group formed by combining two of $R_{201}$ to $R_{203}$ includes an alkylene group (for example, a butylene group or a pentylene group).

$Z^-$ represents a non-nucleophilic anion (an anion having an extremely low ability of causing a nucleophilic reaction).

Examples of the non-nucleophilic anion include a sulfonic acid anion (for example, an aliphatic sulfonic acid anion, an aromatic sulfonic acid anion or camphorsulfonic acid anion), a carboxylic acid anion (for example, an aliphatic carboxylic acid anion, an aromatic carboxylic acid anion or an aralkylcarboxylic acid anion), a sulfonylimide anion, a bis(alkylsulfonyl)imide anion and a tris(alkylsulfonyl)methide anion.

The aliphatic moiety in the aliphatic sulfonic acid anion and aliphatic carboxylic acid anion may be an alkyl group or a cycloalkyl group, and preferably includes a straight-chain or branched alkyl group having from 1 to 30 carbon atoms and a cycloalkyl group having from 3 to 30 carbon atoms.

The aromatic group in the aromatic sulfonic acid anion and aromatic carboxylic acid anion preferably includes an aryl group having from 6 to 14 carbon atoms, for example, a phenyl group, a tolyl group or a naphthyl group.

The alkyl group, cycloalkyl group and aryl group described above may have a substituent. Specific examples of the substituent include a nitro group, a halogen atom, for example, a fluorine atom, a carboxyl group, a hydroxyl group, an amino group, a cyano group, an alkoxy group (preferably having from 1 to 15 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms), an alkylthio group (preferably having from 1 to 15 carbon atoms), an alkylsulfonyl group (preferably having from 1 to 15 carbon atoms), an alkyliminosulfonyl group (preferably having from 1 to 15 carbon atoms), an aryloxysulfonyl group (preferably having from 6 to 20 carbon atoms), an alkylaryloxysulfonyl group (preferably having from 7 to 20 carbon atoms), a cycloalkylaryloxysulfonyl group (preferably having from 10 to 20 carbon atoms), an alkyloxyalkyloxy group (preferably having from 5 to 20 carbon atoms) and a cycloalkylalkyloxyalkyloxy group (preferably having from 8 to 20 carbon atoms). The aryl group or ring structure, which each group has, may further have an alkyl group (preferably having from 1 to 15 carbon atoms) as a substituent.

The aralkyl group in the aralkylcarboxylic acid anion preferably includes an aralkyl group having from 7 to 12 carbon atoms, for example, a benzyl group, a phenethyl group, a naphthylmethyl group, a naphthylethyl group or a naphthylbutyl group.

The sulfonylimide anion includes, for example, a saccharin anion.

The alkyl group in the bis(alkylsulfonyl)imide anion and tris(alkylsulfonyl)methide anion is preferably an alkyl group having from 1 to 5 carbon atoms. A substituent on the alkyl group includes, for example, a halogen atom, an alkyl group substituted with a halogen atom, an alkoxy group, an alkylthio group, an alkyloxysulfonyl group, an aryloxysulfonyl group and a cycloalkylaryloxysulfonyl group, and is preferably a fluorine atom or an alkyl group substituted with a fluorine atom.

Also, the alkyl groups in the bis(alkylsulfonyl)imide anion may be connected to each other to form a ring structure. In this case, the acid strength is increased.

Other examples of the non-nucleophilic anion include fluorinated phosphorus (for example, $PF_6^-$), fluorinated boron (for example, $BF_4^-$) and fluorinated antimony (for example, $SbF_6^-$).

The non-nucleophilic anion is preferably an aliphatic sulfonic acid anion substituted with a fluorine atom at least at the α-position of the sulfonic acid, an aromatic sulfonic acid anion substituted with a fluorine atom or a fluorine atom-containing group, a bis(alkylsulfonyl)imide anion in which the alkyl group is substituted with a fluorine atom or a tris(alkylsulfonyl)methide anion in which the alkyl group is substituted with a fluorine atom. The non-nucleophilic anion is more preferably a perfluoroaliphatic sulfonic acid anion (still more preferably having from 4 to 8 carbon atoms) or a fluorine atom-containing benzenesulfonic acid anion, and still more preferably a nonafluorobutanesulfonic acid anion, a perfluorooctanesulfonic acid anion, a pentafluorobenzenesulfonic acid anion or a 3,5-bis(trifluoromethyl)benzenesulfonic acid anion.

From the standpoint of acid strength, the pKa of the acid generated is preferably −1 or less for increasing the sensitivity.

An anion represented by formula (AN1) shown below is also a preferred embodiment of the non-nucleophilic anion.

[Chem. 52]

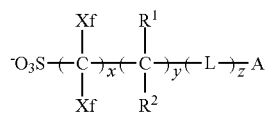

(AN1)

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$ and $R^2$ are present, each $R^1$ and $R^2$ may be the same as or different from every other $R^1$ and $R^2$.

L represents a divalent connecting group, and when a plurality of are present, each L may be the same as or different from every other L.

A represents a cyclic organic group.

x represents an integer from 1 to 20, y represents an integer from 0 to 10, and z represents an integer from 0 to 10.

Formula (AN1) is described in more detail.

The alkyl group in the alkyl group substituted with a fluorine atom for Xf is preferably an alkyl group having from 1 to 10 carbon atoms, and more preferably an alkyl group having from 1 to 4 carbon atoms. Also, the alkyl group substituted with a fluorine atom for Xf is preferably a perfluoroalkyl group.

Xf is preferably a fluorine atom or a perfluoroalkyl group having from 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, a fluorine atom and $CF_3$ are preferred. In particular, it is preferred that both Xf are fluorine atoms.

The alkyl group for any of $R^1$ and $R^2$ may have a substituent (preferably a fluorine atom) and is preferably an alkyl group having from 1 to 4 carbon atoms, and more preferably a perfluoroalkyl group having from 1 to 4 carbon atoms. Specific examples of the alkyl group having a substituent for any of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, $CF_3$ is preferred.

Each of $R^1$ and $R^2$ is preferably a fluorine atom or $CF_3$.

x is preferably from 1 to 10, and more preferably from 1 to 5.

y is preferably from 0 to 4, and more preferably 0.

z is preferably from 0 to 5, and more preferably from 0 to 3.

The divalent connecting group for L is not particularly limited, includes, for example, —COO—, —OCO—, —CO—, —O—, —S—, —SO—, —SO₂—, an alkylene group, a cycloalkylene group, an alkenylene group and a connecting group composed of a combination of a plurality thereof, and is preferably a connecting group having a total number of carbon atoms of 12 or less. Among them, —COO—, —OCO—, —CO— and —O— are preferred, and —COO— and —OCO— are more preferred.

The cyclic organic group for A is not particularly limited as long as it has a cyclic structure, and includes, for example, an alicyclic group, an aryl group and a heterocyclic group (including not only those having aromaticity but also those having no aromaticity).

The alicyclic group may be monocyclic or polycyclic, and is preferably a monocyclic cycloalkyl group, for example, a cyclopentyl group, a cyclohexyl group or a cyclooctyl group, or a polycyclic cycloalkyl group, for example, a norbornyl group, a tricyclodecanyl group, a tetracyclodecanyl group, a tetracyclododecanyl group or an adamantyl group. Among them, an alicyclic group having 7 or more carbon atoms containing a bulky structure, for example, a norbornyl group, a tricyclodecanyl group, a tetracyclodecanyl group, a tetracyclododecanyl group or adamantyl group is preferred from the standpoint that the diffusion in the film during a heating step after exposure can be suppressed and MEEF can be improved.

The aryl group includes a benzene ring, a naphthalene ring, a phenanthrene ring and an anthracene ring.

The heterocyclic group includes those derived from a furan ring, a thiophene ring, a benzofuran ring, a benzothiophene ring, a dibenzofuran ring, a dibenzothiophene ring and a pyridine ring. Among them, heterocyclic groups derived from a furan ring, a thiophene ring and a pyridine ring are preferred.

The cyclic organic group also includes a lactone structure. Specific examples thereof include the lactone structures represented by formulae (LC1-1) to (LC1-17) which may be contained in the resin (A) described above.

The cyclic organic group may have a substituent, and the substituent includes, for example, an alkyl group (may be any of straight-chain, branched or cyclic, preferably having from 1 to 12 carbon atoms), a cycloalkyl group (may be any of monocyclic, polycyclic or spirocyclic, preferably having from 3 to 20 carbon atoms), an aryl group (preferably having from 6 to 14 carbon atoms), a hydroxyl group, an alkoxy group, an ester group, an amido group, a urethane group, a ureido group, a thioether group, a sulfonamido group, and a sulfonic acid ester group. The carbon constituting the cyclic organic group (the carbon contributing to ring formation) may be a carbonyl carbon.

The organic group for any of $R_{201}$, $R_{202}$ and $R_{203}$ includes, for example, an aryl group, an alkyl group and a cycloalkyl group.

At least one of $R_{201}$, $R_{202}$ and $R_{203}$ is preferably an aryl group, and it is more preferred that all three of $R_{201}$, $R_{202}$ and $R_{203}$ are aryl groups. The aryl group may be a heteroaryl group, for example, an indole residue or a pyrrole residue, other than a phenyl group, a naphthyl group and the like. The alkyl group and cycloalkyl group for any of $R_{201}$, $R_{202}$ and $R_{203}$ preferably includes a straight-chain or branched alkyl group having from 1 to 10 carbon atoms and a cycloalkyl group having from 3 to 10 carbon atoms. The alkyl group more preferably includes, for example, a methyl group, an ethyl group, an n-propyl group, an isopropyl group and an n-butyl group. The cycloalkyl group more preferably includes, for example, a cyclopropyl group, a cyclobutyl group, a cyclopentyl group, a cyclohexyl group and a cycloheptyl group. These groups may further have a substituent. The substituent includes, for example, a nitro group, a halogen atom, for example, a fluorine atom, a carboxyl group, a hydroxyl group, an amino group, a cyano group, an alkoxy group (preferably having from 1 to 15 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms) and an alkoxycarbonyloxy group (preferably having from 2 to 7 carbon atoms), but it should not be construed as being limited thereto.

In the case where two of $R_{201}$ to $R_{203}$ are connected to form a ring structure, the ring structure is preferably a structure represented by formula (A1) shown below.

[Chem. 53]

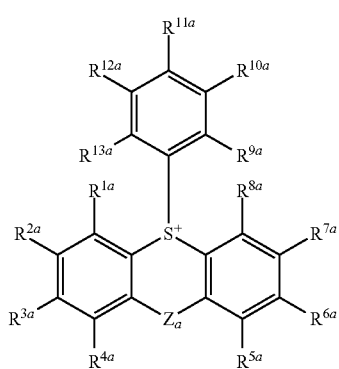

(A1)

In formula (A1), each of $R^{1a}$ to $R^{13a}$ independently represents a hydrogen atom or a substituent.

It is preferred that from 1 to 3 of $R^{1a}$ to $R^{13a}$ are not hydrogen atoms, and it is more preferred that any one of $R^{9a}$ to $R^{13a}$ is not a hydrogen atom.

Za represents a single bond or a divalent connecting group.

$X^-$ has the same meaning as $Z^-$ in formula (ZI).

Specific examples of $R^{1a}$ to $R^{13a}$ when these are not hydrogen atoms include a halogen atom, a straight-chain, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

In the case where $R^{1a}$ to $R^{13a}$ are not hydrogen atoms, a straight-chain, branched or cyclic alkyl group substituted with a hydroxyl group is preferred.

The divalent connecting group for Za includes, for example, an alkylene group, an arylene group, a carbonyl group, a sulfonyl group, a carbonyloxy group, a carbonylamino group, a sulfonylamido group, an ether bond, a thioether bond, an amino group, a disulfide group, —(CH$_2$)$_n$—CO—, —(CH$_2$)$_n$—SO$_2$—, —CH=CH—, an aminocarbonylamino group and an aminosulfonylamino group (n is an integer from 1 to 3).

When at least one of $R_{201}$, $R_{202}$ and $R_{203}$ is not an aryl group, preferred structures include cation structures, for example, in compounds described in paragraphs 0046 to 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group for any of $R_{204}$ to $R_{207}$ are the same as the aryl group described for the aryl group, alkyl group and cycloalkyl group for any of $R_{201}$ to $R_{203}$ in the compound (ZI) described above.

The aryl group, alkyl group and cycloalkyl group for any of $R_{204}$ to $R_{207}$ may have a substituent. The substituent also include those which the aryl group, alkyl group and cycloalkyl group for any of $R_{201}$ to $R_{203}$ in the compound (ZI) described above may have.

$Z^-$ represents a non-nucleophilic anion, and includes the same as those of the non-nucleophilic anion for $Z^-$ in formula (ZI).

The acid generator further includes compounds represented by formulae (ZIV), (ZV) and (ZVI) shown below.

[Chem. 54]

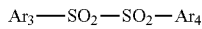
(ZIV)

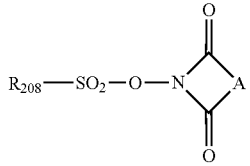
(ZV)

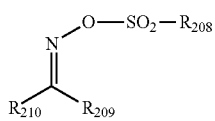
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group for any of $Ar_3$, $Ar_4$, $R_{208}$, $R_{209}$ and $R_{210}$ are the same as the specific examples of the aryl group for any of $R_{201}$, $R_{202}$ and $R_{203}$ in formula (ZI) described above.

Specific examples of the alkyl group and cycloalkyl group for any of $R_{208}$, $R_{209}$ and $R_{210}$ are the same as the specific examples of the alkyl group and cycloalkyl group for any of $R_{201}$, $R_{202}$ and $R_{203}$ in formula (ZI) described above.

The alkylene group for A includes an alkylene group having from 1 to 12 carbon atoms (for example, a methylene group, an ethylene group, a propylene group, an isopropylene group, a butylene group or an isobutylene group), the alkenylene group for A includes an alkenylene group having from 2 to 12 carbon atoms (for example, an ethenylene group, a propenylene group or a butenylene group), and the arylene group for A includes an arylene group having from 6 to 10 carbon atoms (for example, a phenylene group, a tolylene group or a naphthylene group).

Of the acid generators, particularly preferred examples are set forth below.

[Chem. 55]

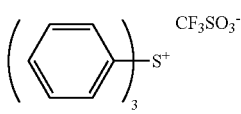
(z1)

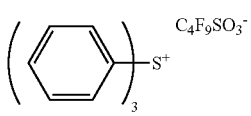
(z2)

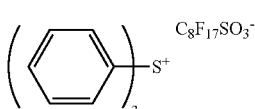
(z3)

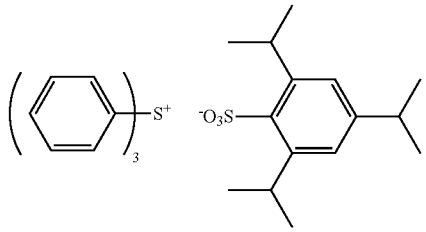
(z4)

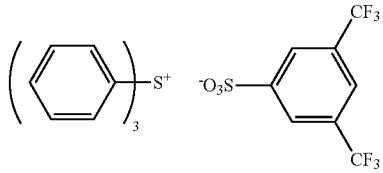
(z5)

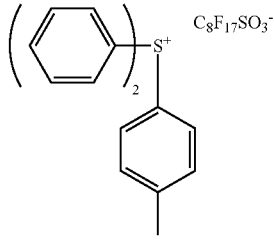
(z6)

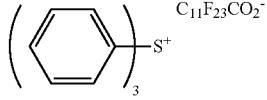
(z7)

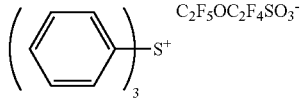
(z8)

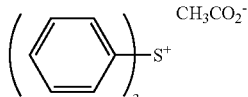
(z9)

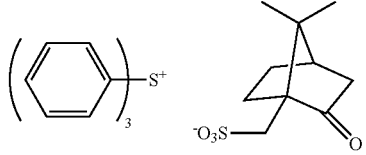
(z10)

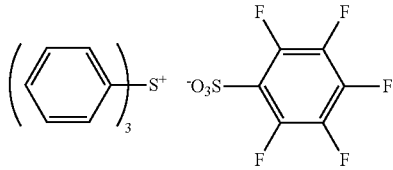
(z11)

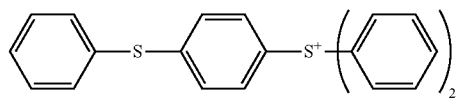
(z12)

101
-continued
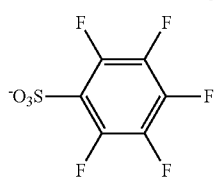
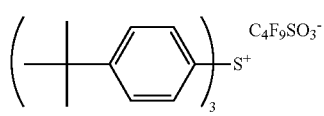 (z13)
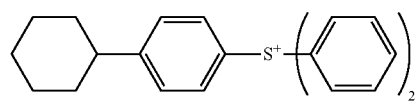 (z14)
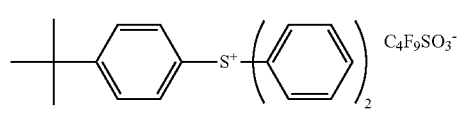 (z15)
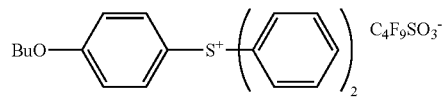 (z16)
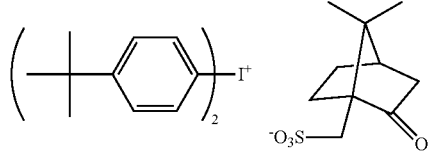 (z17)
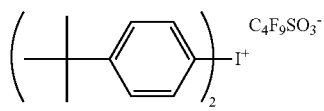 (z18)
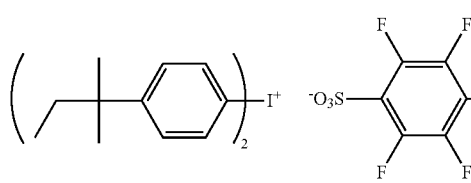 (z19)
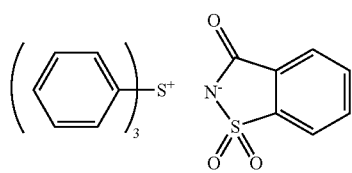 (z20)
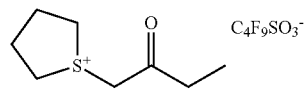 (z21)
102
-continued
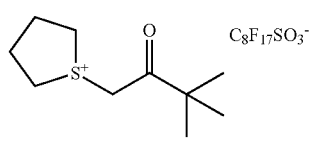 (z22)
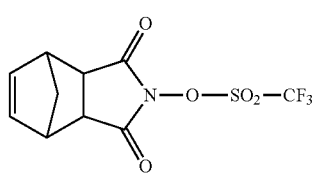 (z23)
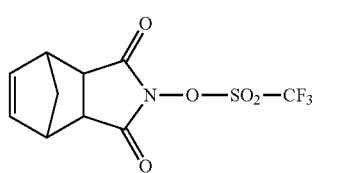 (z24)
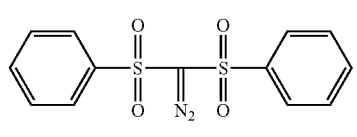 (z25)
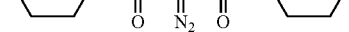 (z26)
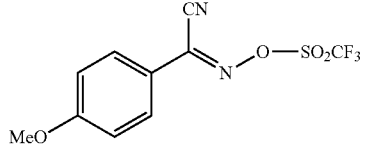 (z27)
 (z28)
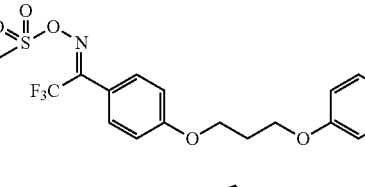 (z29)
 (z30)
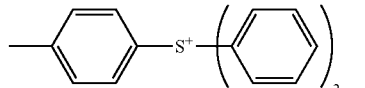 (z31)
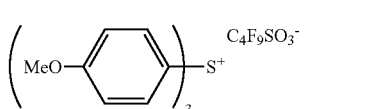

-continued
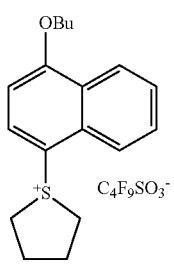 (z32)
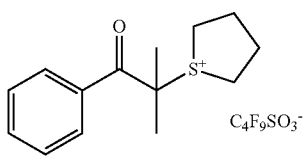 (z33)
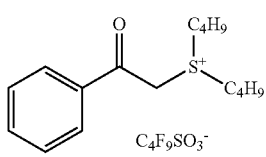 (z34)
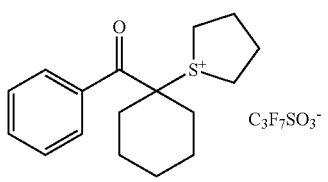 (z35)
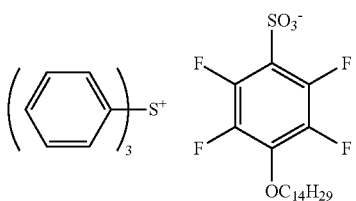 (z36)
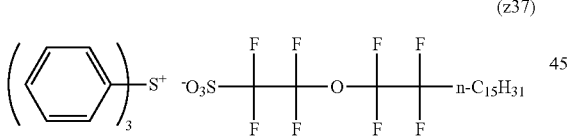 (z37)
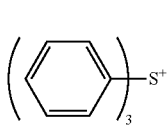 (z38)
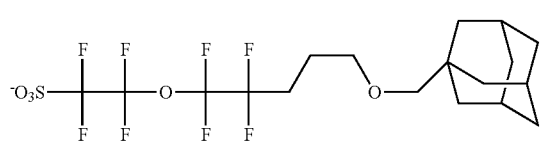
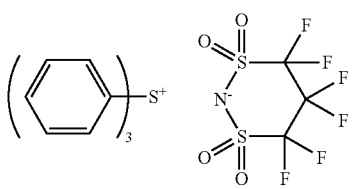 (z39)
-continued
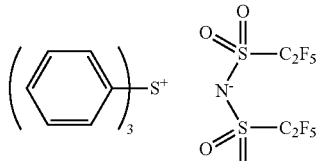 (z40)
[Chem. 56]
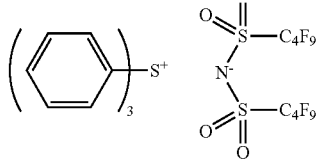 (z41)
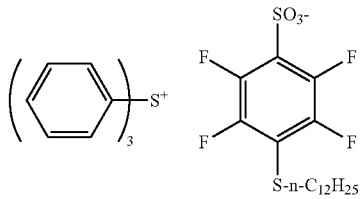 (z42)
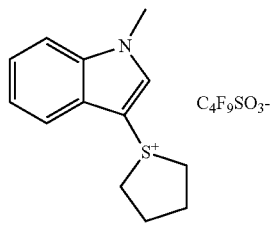 (z43)
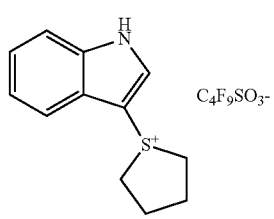 (z44)
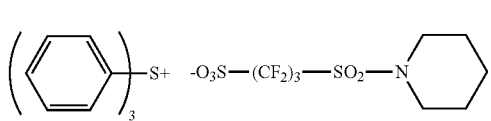 (z45)
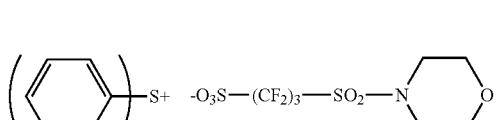 (z46)
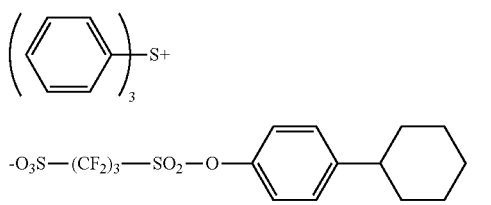 (z47)

-continued
(z48) 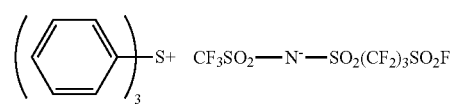 CF₃SO₂—N⁻—SO₂(CF₂)₃SO₂F
(z49) 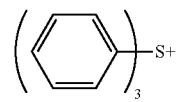
(z50) CF₃SO₂—N⁻—SO₂—(CF₂)₃—SO₂—O— 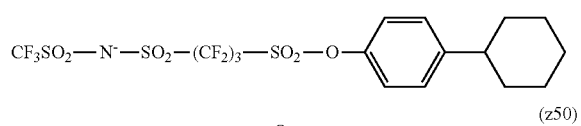
(z51) 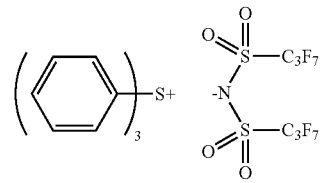
(z52) 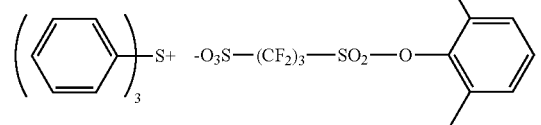
(z53) 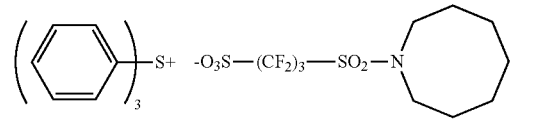
(z54) 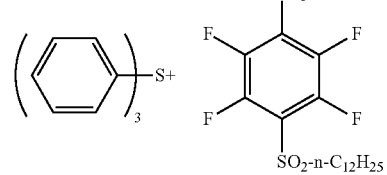 C⁻—(SO₂C₃F₇)₃
(z55) 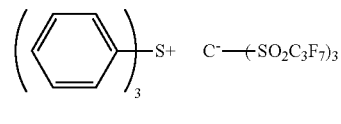 C⁻—(SO₂C₂F₅)₃
(z56) 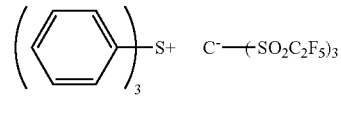 C⁻—(SO₂CF₃)₃
-continued
(z57) 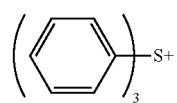
⁻O₃S—(CF₂)₃—SO₂—O— 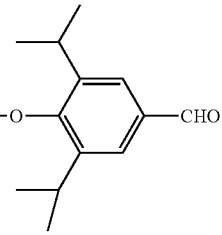
(z58) 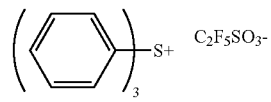 C₂F₅SO₃⁻
(z59) 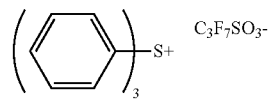 C₃F₇SO₃⁻
(z60) 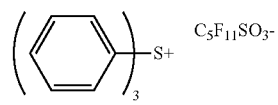 C₅F₁₁SO₃⁻
(z61) 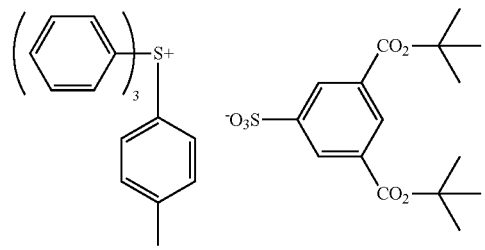
(z62) 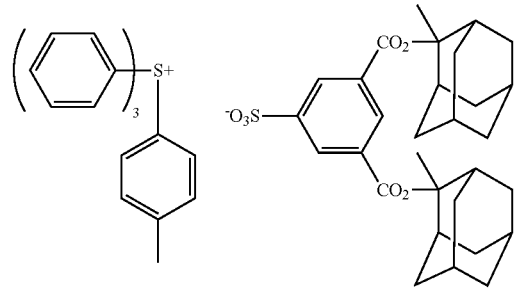
(z63) 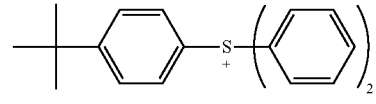
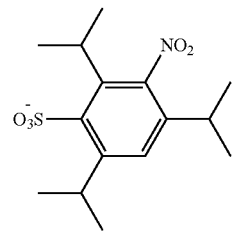

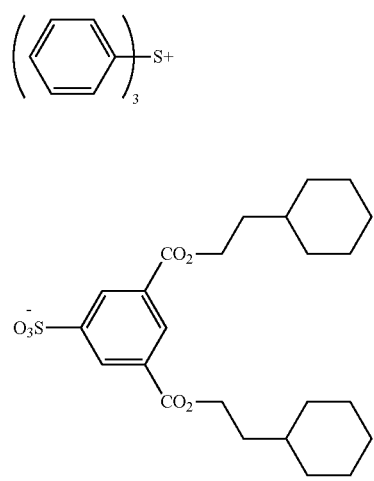
(z64)
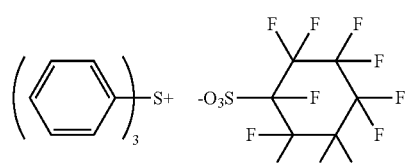
(z65)
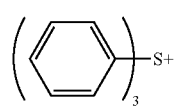
(z66)
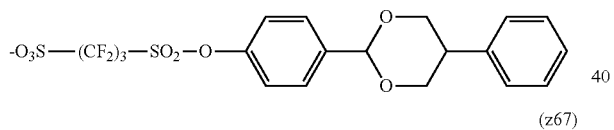
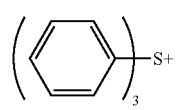
(z67)
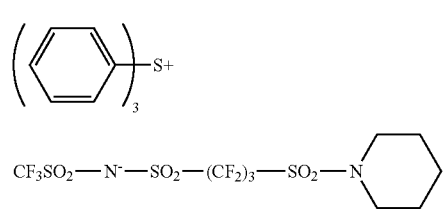
(z68)
(z69)
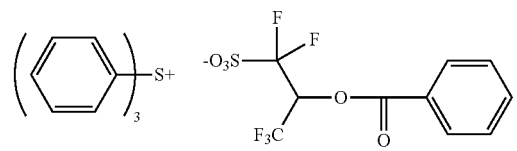
(z70)
[Chem. 57]
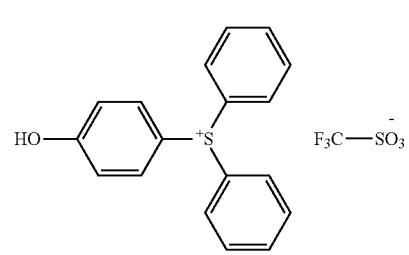
(z71)
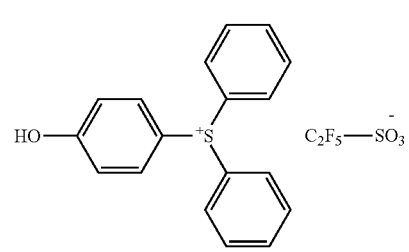
(z72)
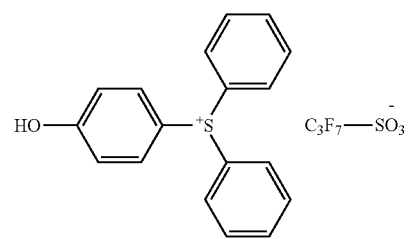
(z73)
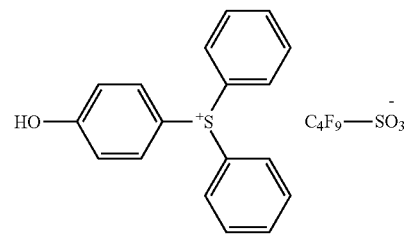
(z74)
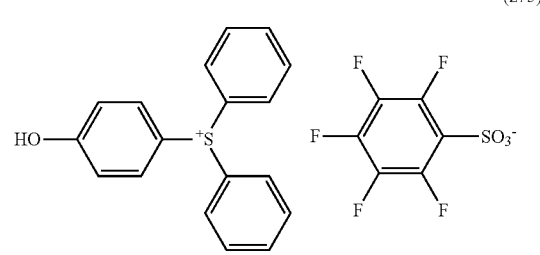
(z75)

(z76) 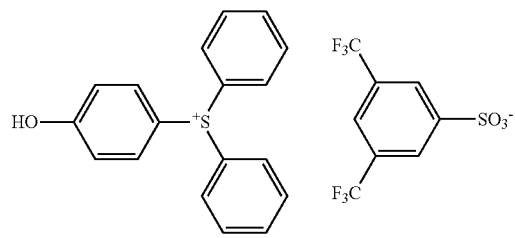
(z77) 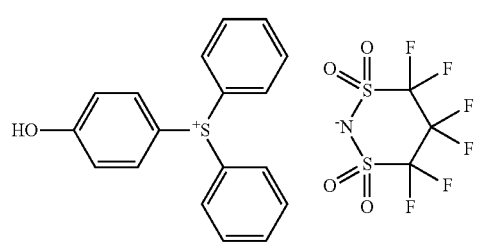
(z78) 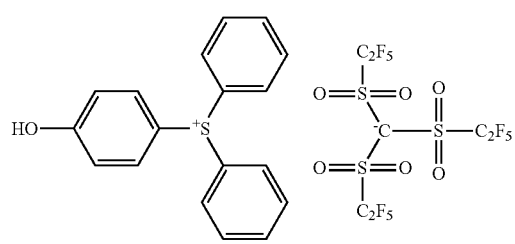
(z79) 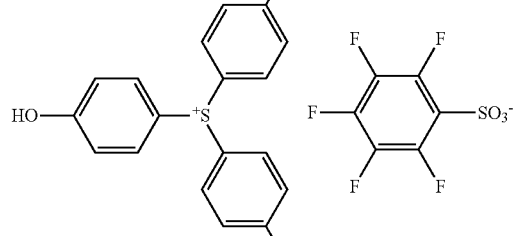
(z80) 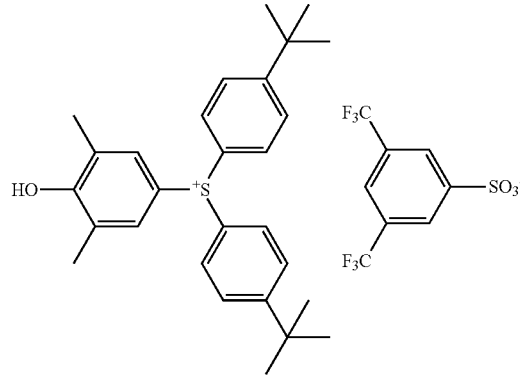
(z81) 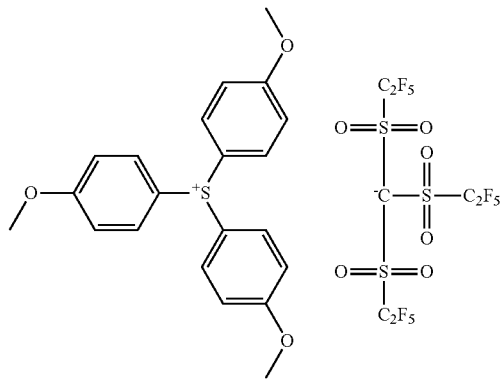
[Chem. 58]
(z82) 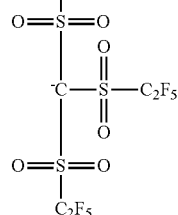
(z83) 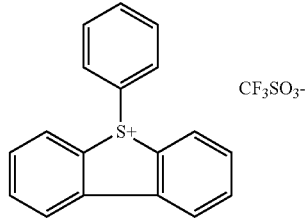
(z84) 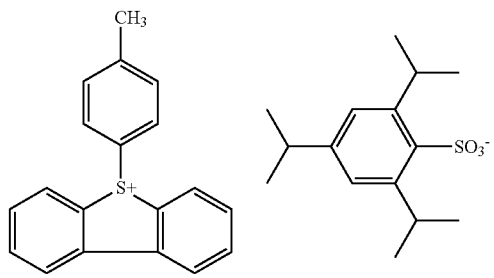
(z85) 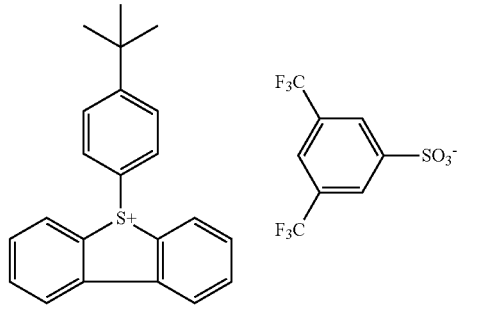
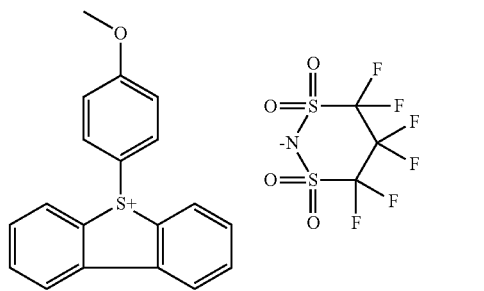

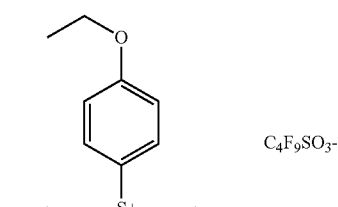 (z86)
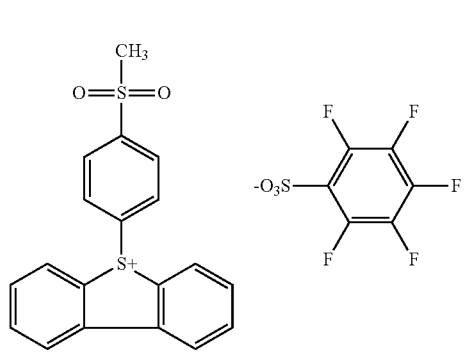 (z87)
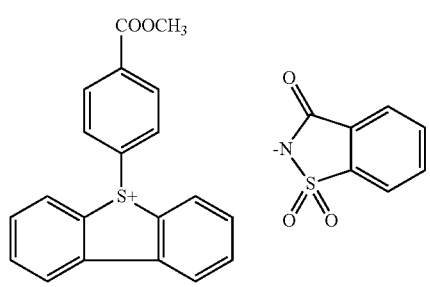 (z88)
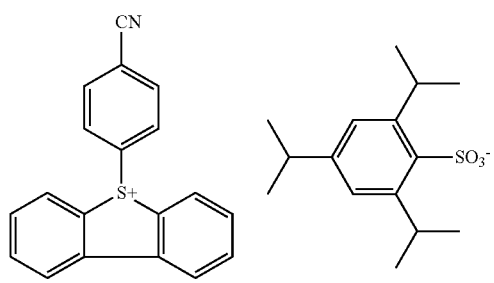 (z89)
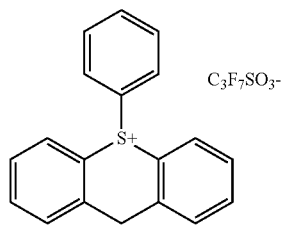 (z90)
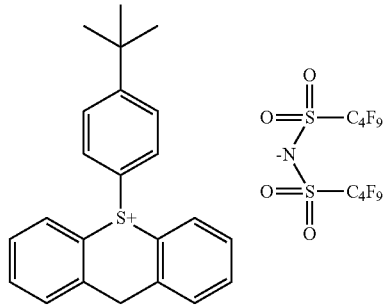 (z91)
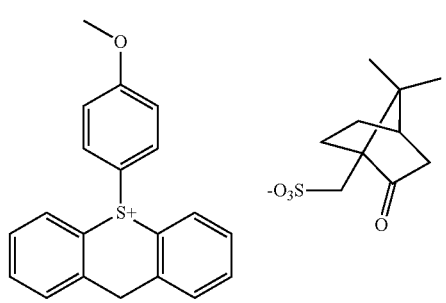 (z92)
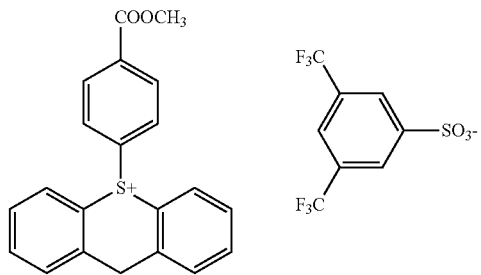 (z93)
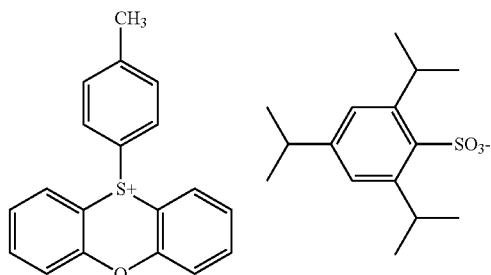 (z94)
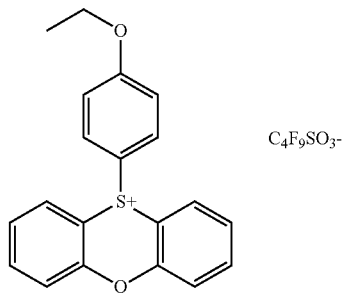 (z95)

-continued
(z96)
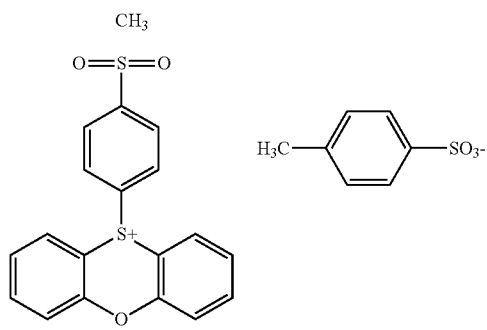
(z100)
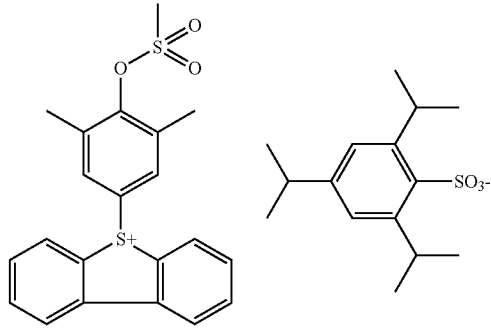
[Chem. 59]
(z97)
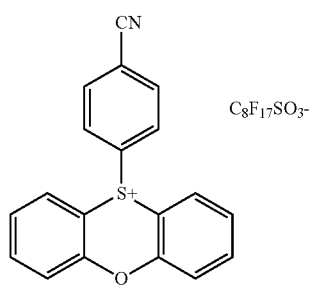
(z101)
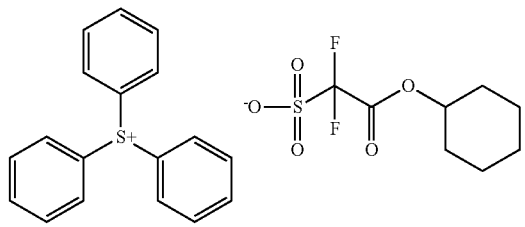
(z102)
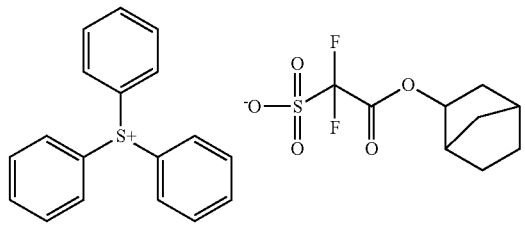
(z98)
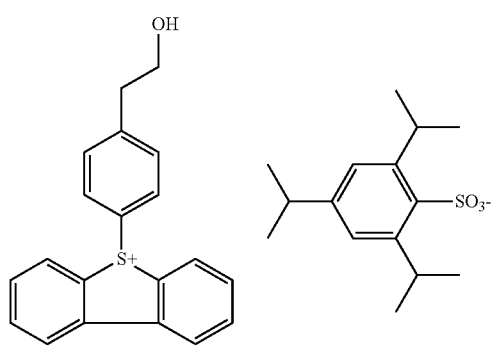
(z103)
(z104)
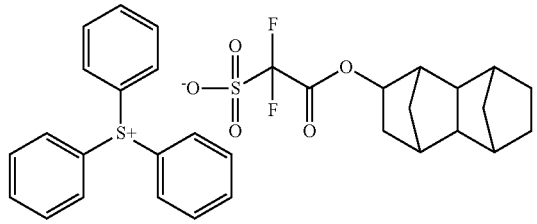
(z99)
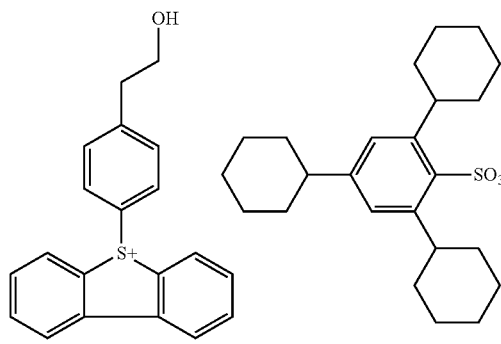
(z105)
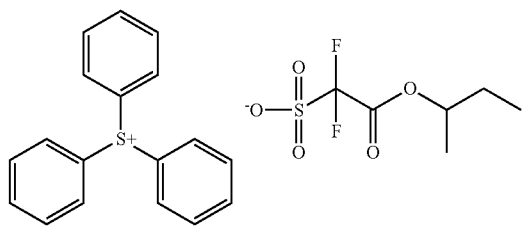

(z106)
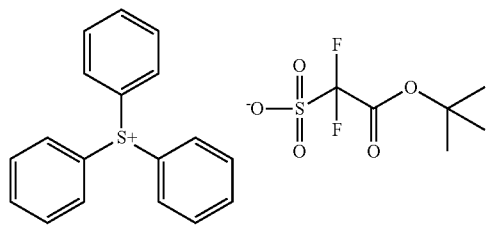
(z107)
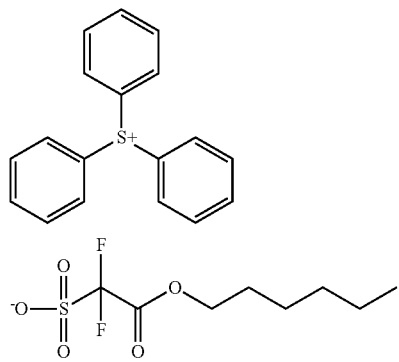
(z108)
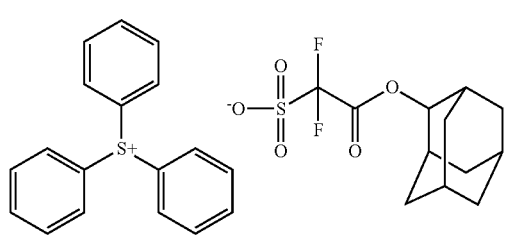
(z109)
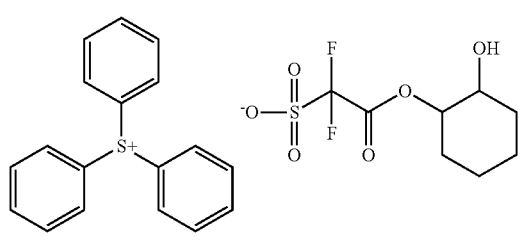
(z110)
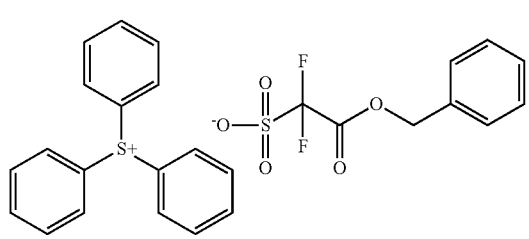
(z111)
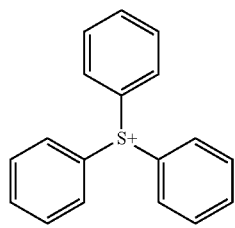
(zized)
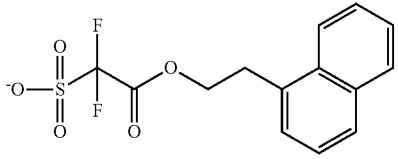
[Chem. 60]
(z112)
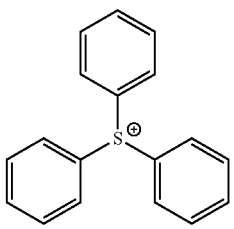
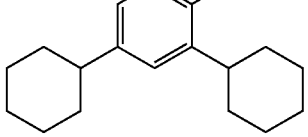
(z113)
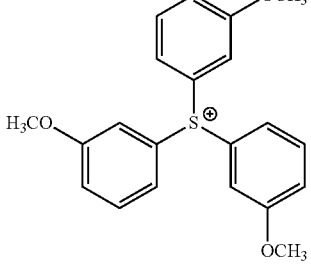
(z114)
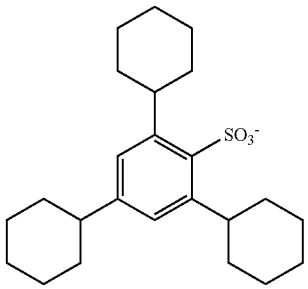
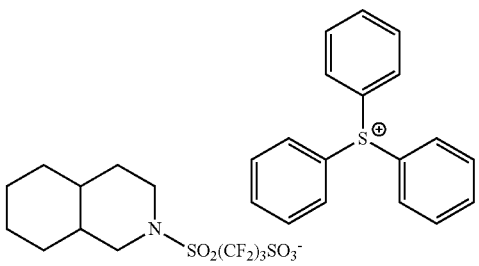

-continued
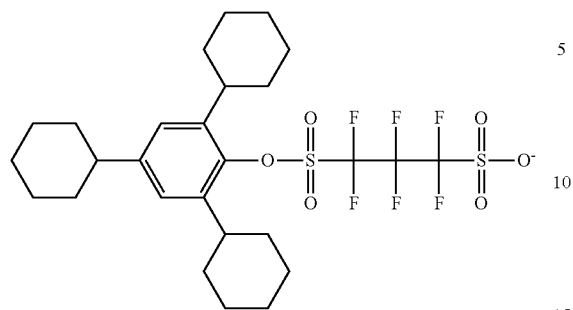
(z115)
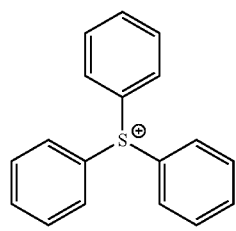
(z116)
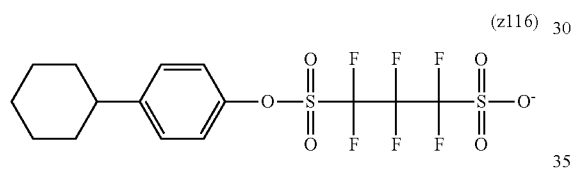
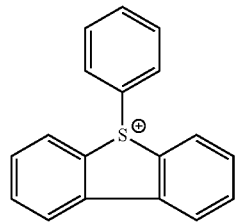
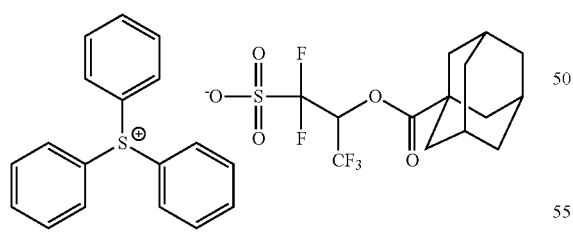
(z117)
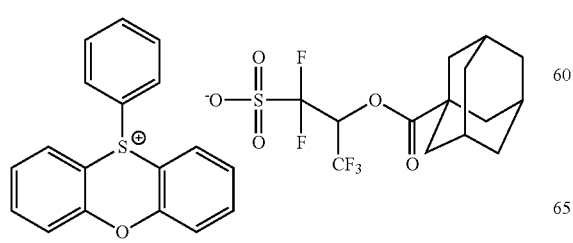
(z118)
-continued
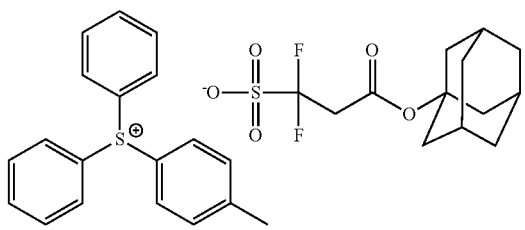
(z119)
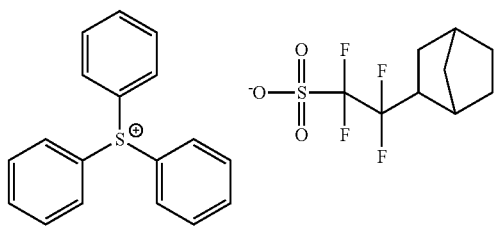
(z120)
[Chem. 61]
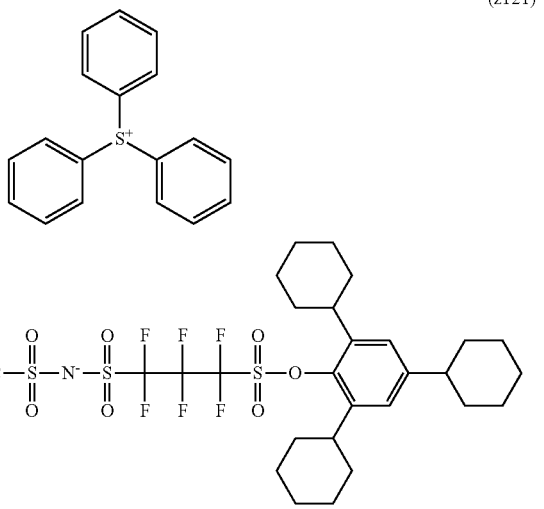
(z121)
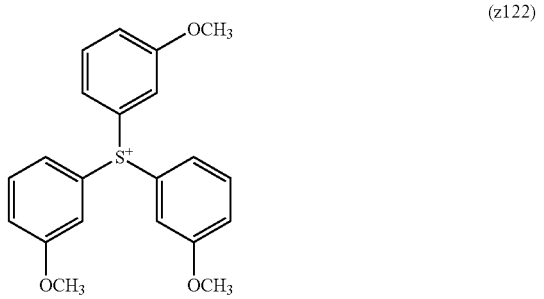
(z122)
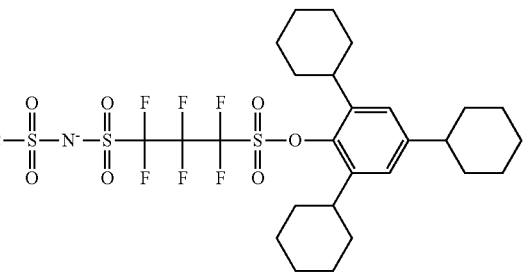

-continued
(z123)
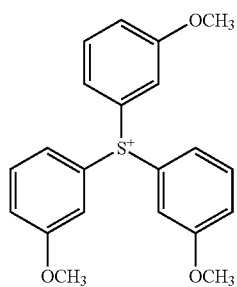
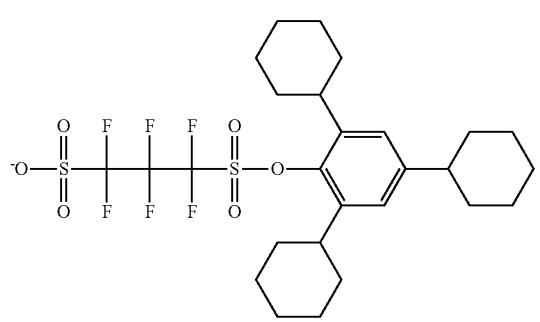
(z124)
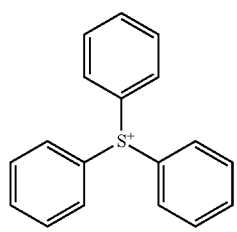
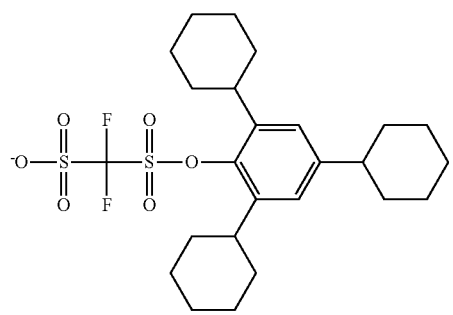
(z125)
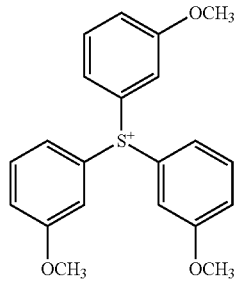
-continued
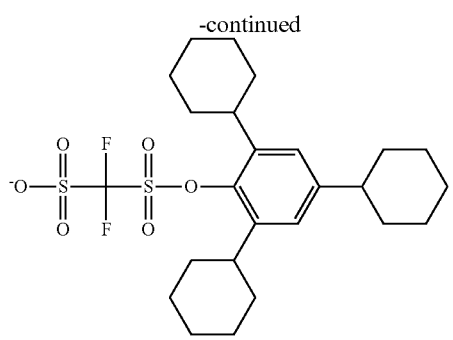
(z126)
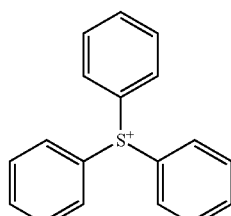
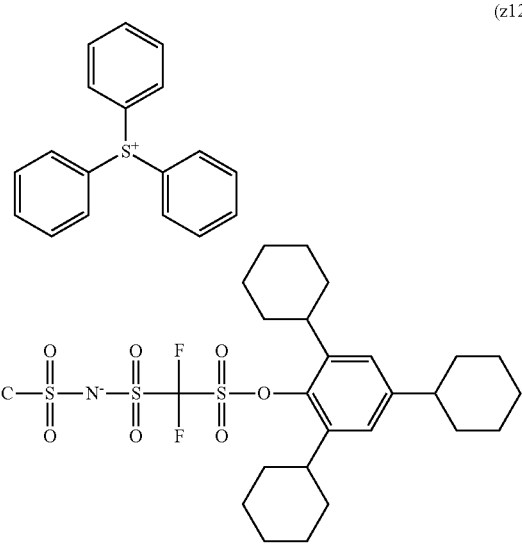
(z127)
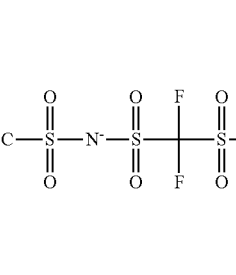
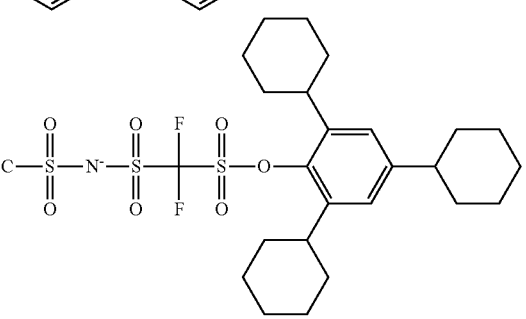
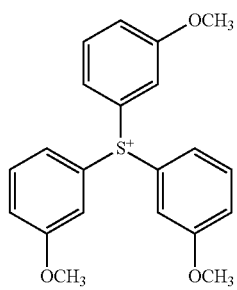
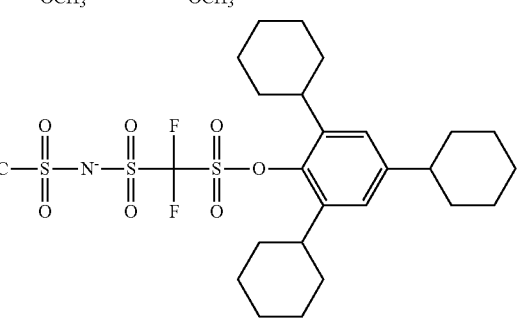
(z128)
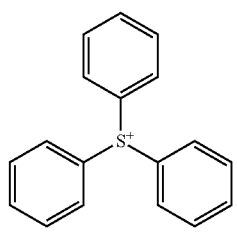

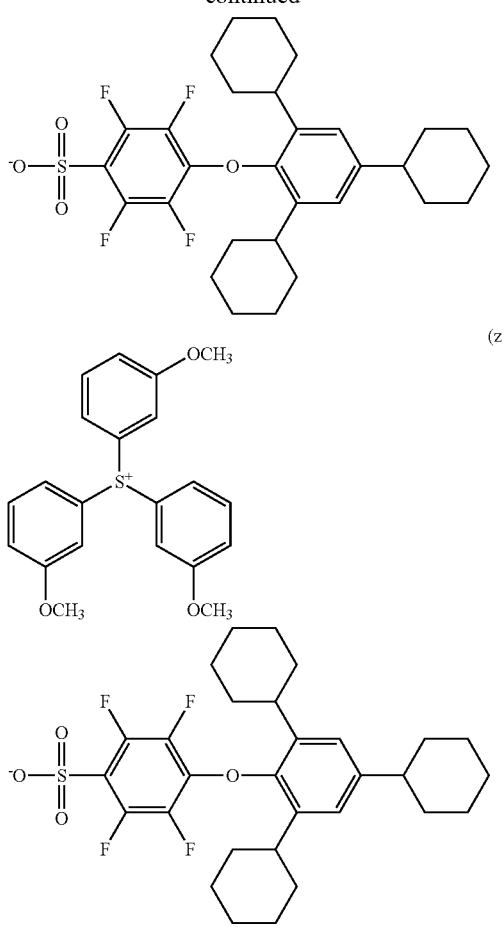

(z129)

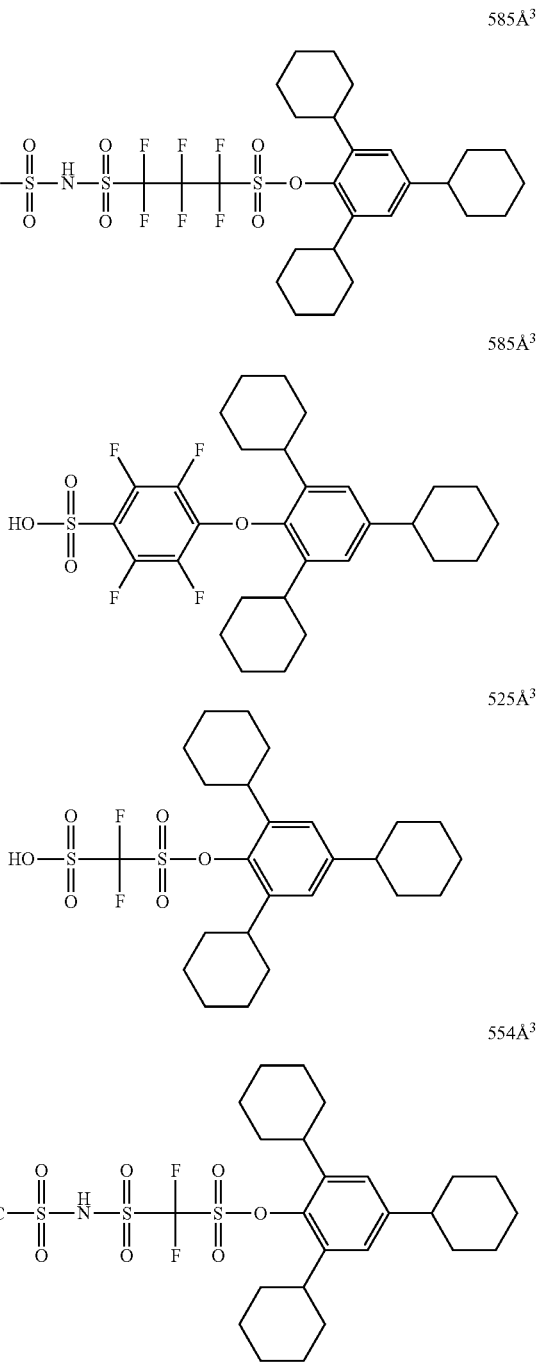

In the invention, from the standpoint of improving the resolution by preventing the acid generated upon exposure from diffusing into the unexposed area, the compound capable of generating an acid (C) is preferably a compound capable of generating an acid having a size of 240 Å$^3$ or more in volume upon irradiation with an actinic ray or radiation, more preferably a compound capable of generating an acid having a size of 300 Å$^3$ or more in volume, still more preferably a compound capable of generating an acid having a size of 350 Å$^3$ or more in volume, and particularly preferably a compound capable of generating an acid having a size of 400 Å$^3$ or more in volume. However, from the standpoint of sensitivity and solubility in a coating solvent, the volume above is preferably 2,000 Å$^3$ or less, and more preferably 1,500 Å$^3$ or less. The value of the volume is determined using "WinMOPAC" produced by Fujitsu Ltd. More specifically, first, the chemical structure of the acid according to each example is input, and next, using this structure as the initial structure, the most stable conformation of each acid is determined by molecular force field calculation using an MM3 method. Then, with respect to the most stable conformation, molecular orbital calculation is performed using a PM3 method, whereby the "accessible volume" of each acid can be computed.

Examples of the acid generator particularly preferred in the invention are set forth below. In some of the examples, a computed value of volume (unit: Å$^3$) is shown together. The computed value determined here is a volume value of an acid in which a proton is connected to the anion moiety.

123
-continued
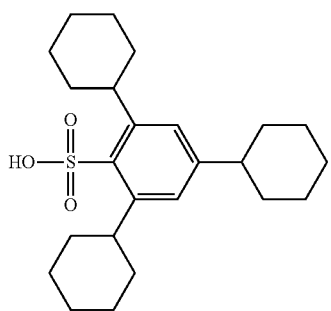
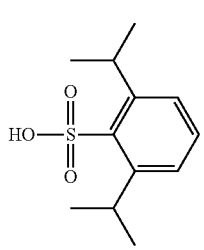
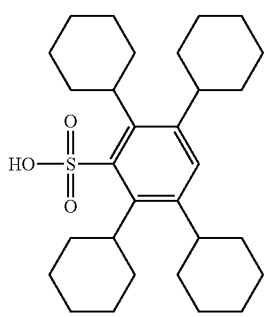
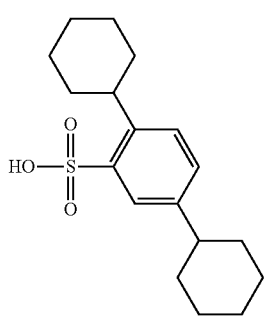
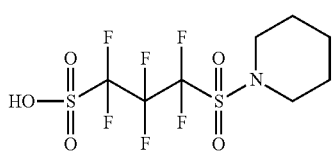
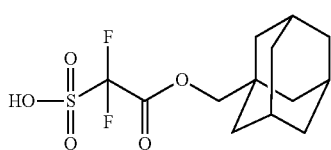
124
-continued
437Å³
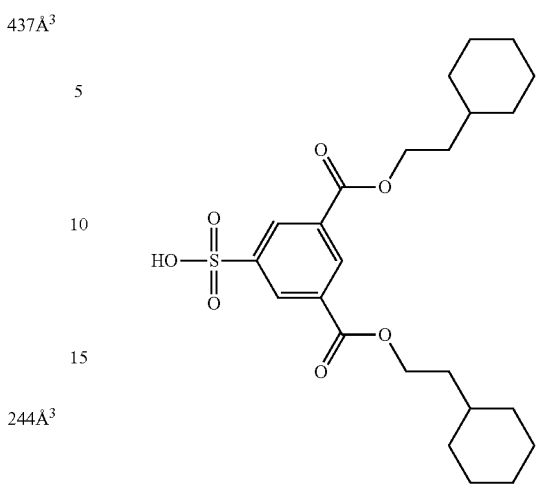
511Å³
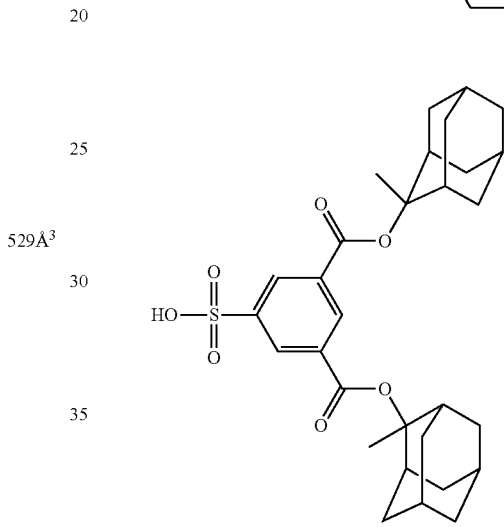
311Å³
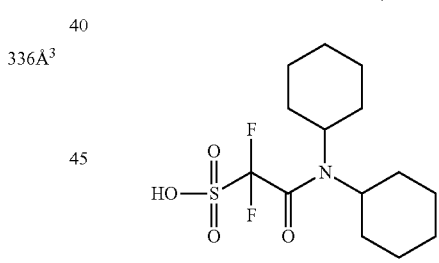
280Å³
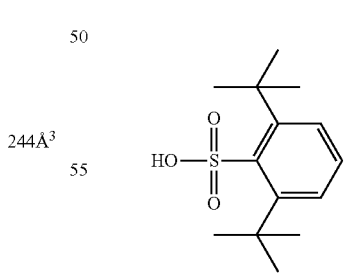
266Å³
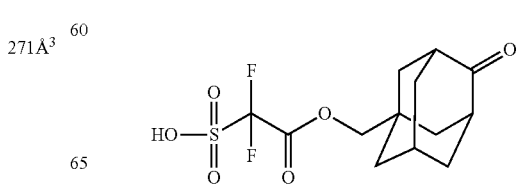
457Å³
529Å³
336Å³
244Å³
271Å³
244Å³

125
-continued
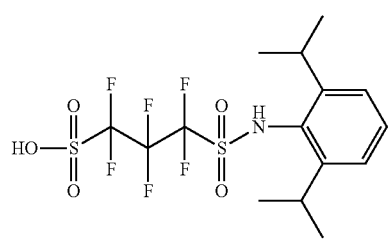
339Å³
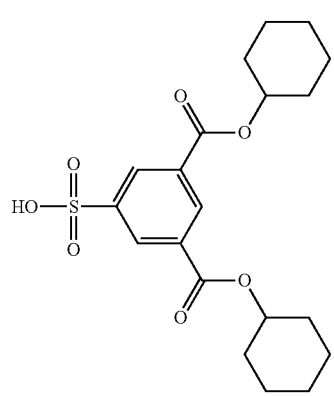
380Å³
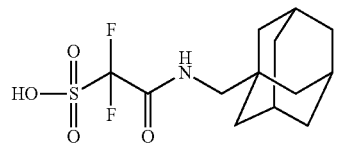
277Å³
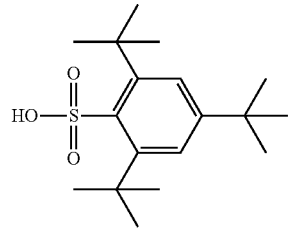
357Å³
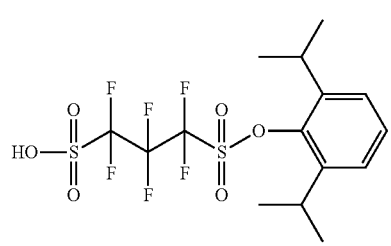
347Å³
[Chem. 64]
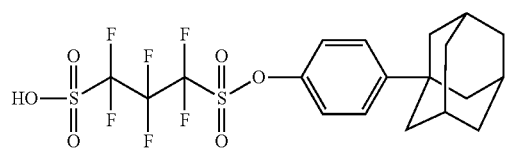
380Å³
126
-continued
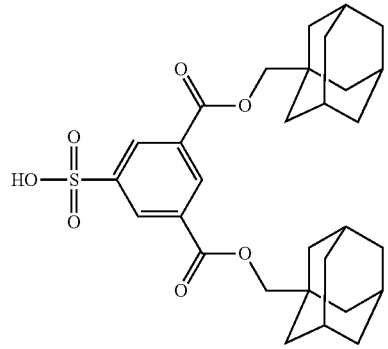
519Å³
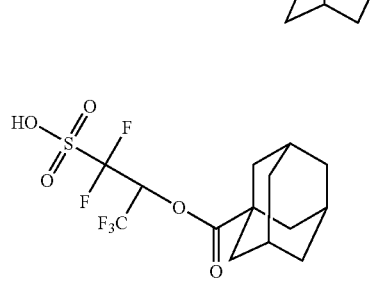
291Å³
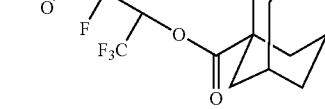
297Å³
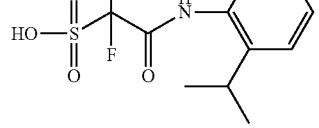
277Å³
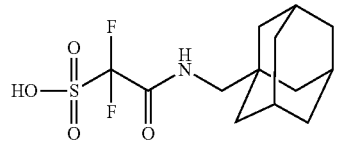
281Å³
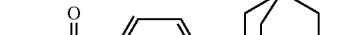
310Å³
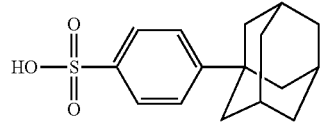
309Å³
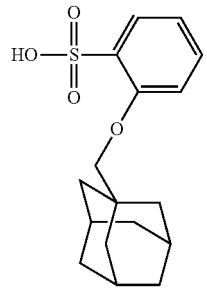

-continued

270Å³ 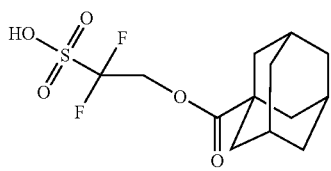

393Å³ 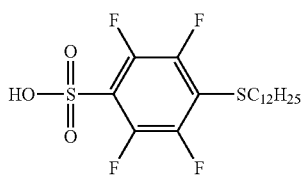

350Å³ 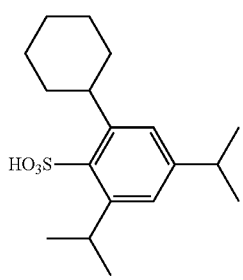

311Å³ 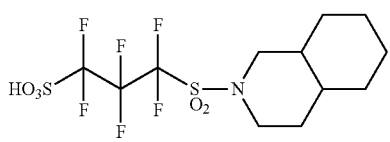

250Å³ 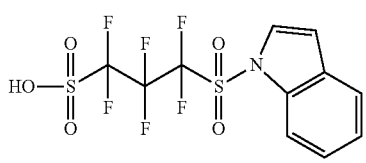

535Å³ 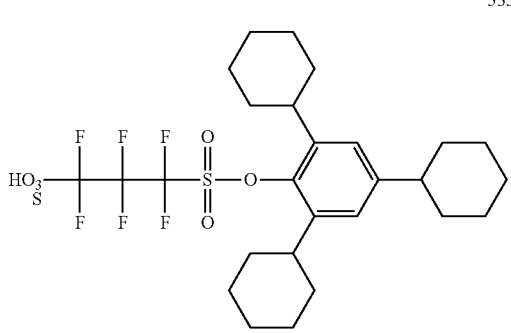

290Å³ 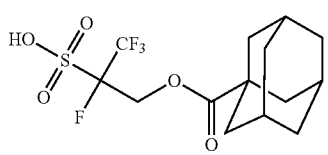

315Å³ 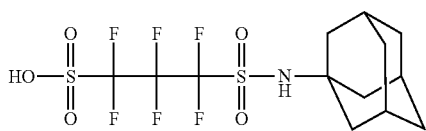

The acid generators can be used one kind alone or in combination of two or more kinds thereof.

The content of the acid generator in the composition is preferably from 0.1 to 20% by mass, more preferably from 0.5 to 15% by mass, still more preferably from 1 to 10% by mass, based on the total solid content of the composition.

[4] Resist Solvent (Coating Solvent)

The solvent which can be used at the preparation of the composition is not particularly limited as long as it dissolves respective components, and includes, for example, an alkylene glycol monoalkyl ether carboxylate (for example, propylene glycol monomethyl ether acetate (PGMEA, another name: 1-methoxy-2-acetoxypropane)), an alkylene glycol monoalkyl ether (for example, propylene glycol monomethyl ether (PGME, 1-methoxy-2-propanol)), a lactic acid alkyl ester (for example, ethyl lactate or methyl lactate), a cyclic lactone (preferably having from 4 to 10 carbon atoms, for example, γ-butyrolactone), a chain or cyclic ketone (preferably having from 4 to 10 carbon atoms, for example, 2-heptanone or cyclohexanone), an alkylene carbonate (for example, ethylene carbonate or propylene carbonate), an alkyl carboxylate (preferably an alkyl acetate, for example, butyl acetate), and an alkyl alkoxyacetate (for example, ethyl ethoxypropionate). Other solvents which can be used include solvents described in paragraph 0244 et seq. of U.S. Patent Application Publication No. 2008/0248425A1.

Of the solvents described above, an alkylene glycol monoalkyl ether carboxylate and an alkylene glycol monoalkyl ether are preferred.

The solvents may be used alone or as a mixture of two or more kinds thereof. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, and more preferably from 20/80 to 60/40.

The solvent having a hydroxyl group is preferably an alkylene glycol monoalkyl ether, and the solvent having no hydroxyl group is preferably an alkylene glycol monoalkyl ether carboxylate.

The composition according to the invention may contain a basic compound in addition to the compound represented by formula (2). The basic compound is preferably a nitrogen-containing organic basic compound. The basic compound which can be used is not particularly limited, and, for example, amine compounds, nitrogen-containing heterocyclic compounds and ammonium salts described in JP-A-2012-93398 can be used. In addition, for example, compounds synthesized in the example of JP-A-2002-363146 and compounds described in paragraph 0108 of JP-A-2007-298569 can also be used.

The basic compound can be used alone or in combination of two or more thereof.

The amount of the basic compound used is usually from 0.001 to 10% by mass, preferably from 0.01 to 5% by mass, based on the total solid content of the actinic ray-sensitive or radiation-sensitive resin composition.

[5] Compound Capable of Decomposing by Action of Acid to Generate Acid

The actinic ray-sensitive or radiation-sensitive resin composition according to the invention may further contain one kind or two or more kinds of compounds capable of decomposing by the action of an acid to generate an acid. The acid generated from the compound capable of decomposing by the action of an acid to generate an acid is preferably a sulfonic acid, a methide acid or an imide acid.

Examples of the compound capable of decomposing by the action of an acid to generate an acid, which can be used in the present invention, are set forth below, but the invention should not be construed as being limited thereto.
[Chem. 65]
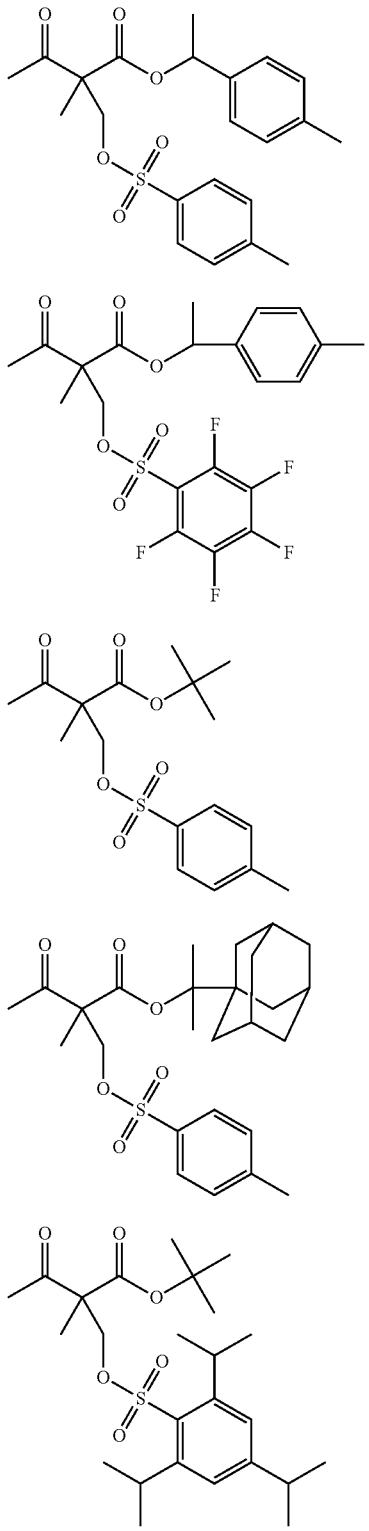
(PA-1)
(PA-2)
(PA-3)
(PA-4)
(PA-5)
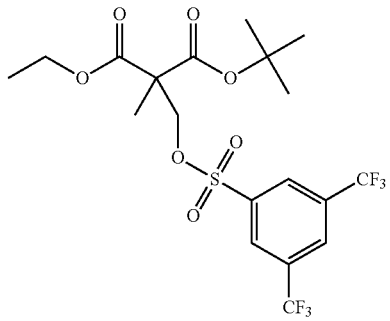
(PA-6)
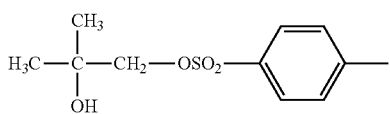
(PA-7)
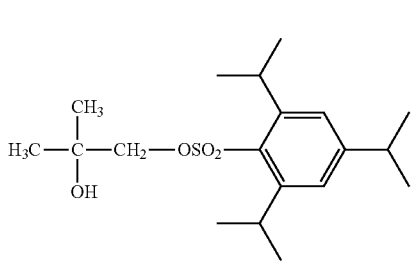
(PA-8)
(PA-9)
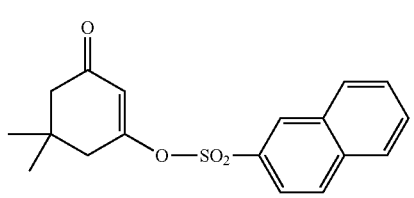
(PA-10)
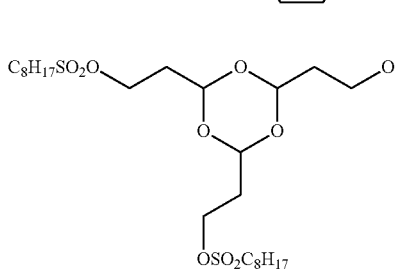
(PA-11)
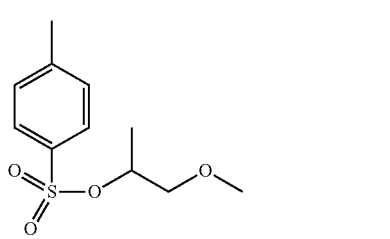
(PA-12)
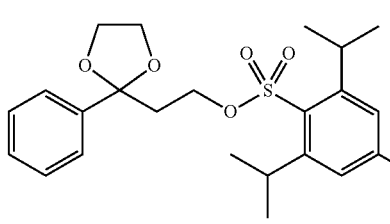

on the total solid content of the actinic ray-sensitive or radiation-sensitive resin composition.

[6] Hydrophobic Resin (HR)

The actinic ray-sensitive or radiation-sensitive resin composition according to the invention may contain a hydrophobic resin (HR) separately from the resin (A) described above.

The hydrophobic resin (HR) preferably contains a group having a fluorine atom, a group having a silicon atom or a hydrocarbon group having 5 or more carbon atoms so as to be unevenly distributed to the film surface. Such a group may be present in the main chain of the resin or may be substituted on the side chain on the resin. Specific examples of the hydrophobic resin (HR) are set forth below.

The compounds capable of decomposing by the action of an acid to generate an acid can be used one kind alone or in combination of two or more kinds thereof.

The content of the compound capable of decomposing by the action of an acid to generate an acid is preferably from 0.1 to 40% by mass, more preferably from 0.5 to 30% by mass, still more preferably from 1.0 to 20% by mass, based (HR-7) 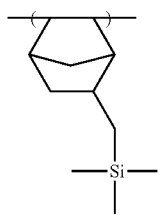 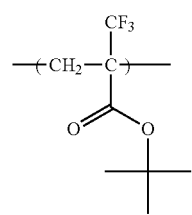
(HR-8) 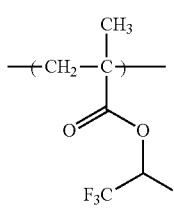 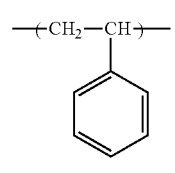
(HR-9) 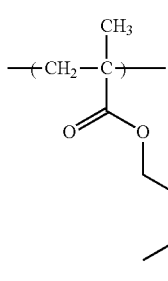 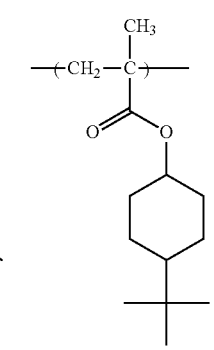
(HR-10) 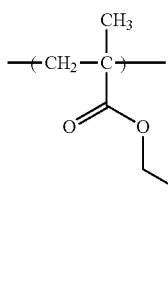 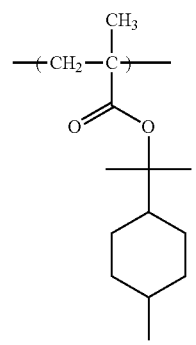
(HR-11) 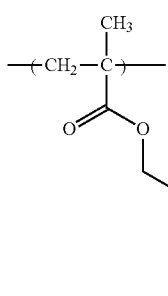 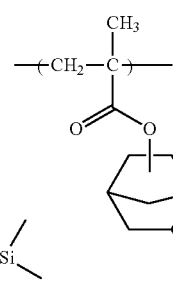
(HR-12) 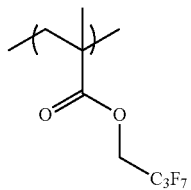 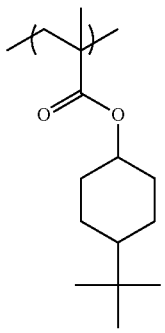
(HR-13) 
(HR-14) 
(HR-15) 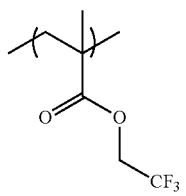
(HR-16) 
(HR-17) 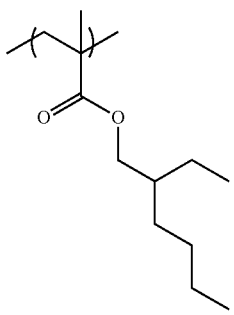

(HR-18) 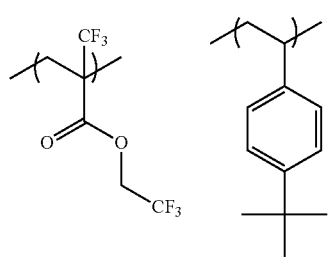
(HR-19) 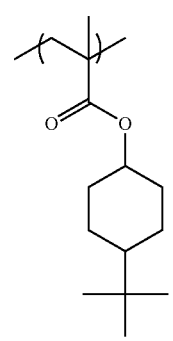
(HR-20) 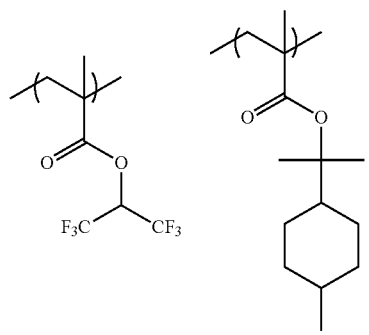
(HR-21) 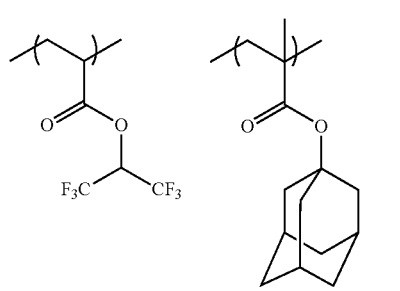
(HR-22) 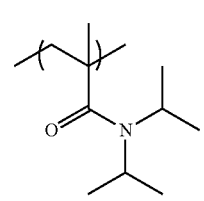
(HR-23) 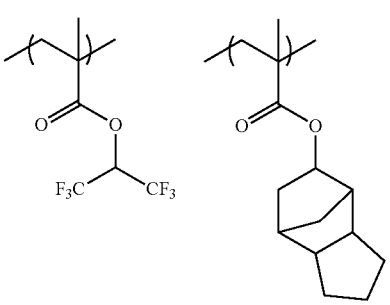
(HR-24) 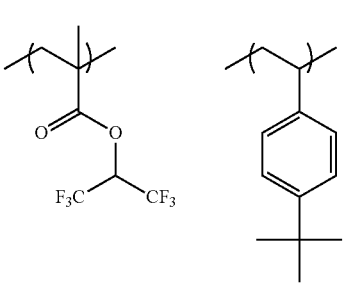
(HR-25) 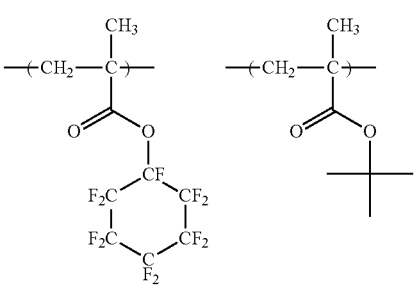
(HR-26) 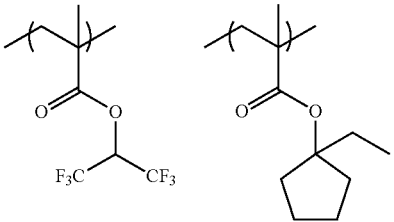
[Chem. 67]
HR-27 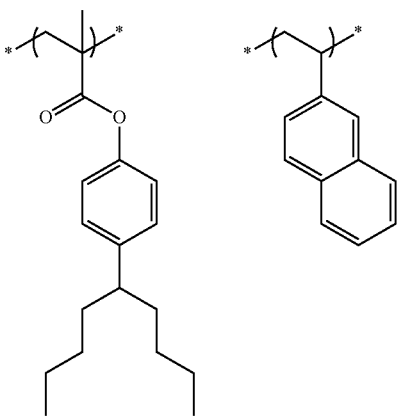

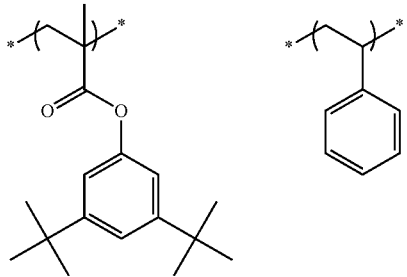

HR-28

As the hydrophobic resin, in addition, those described in JP-A-2011-248019, JP-A-2010-175859 and JP-A-2012-32544 can also be preferably used.

[7] Surfactant

The composition according to the invention may further contain a surfactant. By containing a surfactant, when an exposure light source having a wavelength of 250 nm or less, particularly 220 nm or less, is used, a pattern of good adhesion property and less development defects can be formed with good sensitivity and resolution.

As to the surfactant, it is particularly preferred to use a fluorine-containing and/or silicon-containing surfactant.

Examples of the fluorine-containing and/or silicon-containing surfactant include surfactants described in paragraph 0276 of U.S. Patent Application Publication No. 2008/0248425. Also, Eftop EF301 and EF303 (produced by Shin-Akita Kasei K. K.); Fluorad FC430, 431 and 4430 (produced by Sumitomo 3M Inc.); Megafac F171, F173, F176, F189, F113, F110, F177, F120 and R08 (produced by DIC Corp.); Surflon S-382, SC101, 102, 103, 104, 105 and 106 (produced by Asahi Glass Co., Ltd.); Troysol S-366 (produced by Troy Corp.); GF-300 and GF-150 (produced by Toagosei Chemical Industry Co., Ltd.); Surflon S-393 (produced by AGC Seimi Chemical Co., Ltd.); Eftop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA Solutions Inc.); and FTX-204G, 208G, 218G, 230G, 204D, 208D, 212D, 218D and 222D (produced by NEOS Co., Ltd.) may be used. Polysiloxane Polymer KP-341 (produced by Shin-Etsu Chemical Co., Ltd.) may also be used as the silicon-containing surfactant.

In addition to known surfactants as shown above, the surfactant may also be synthesized by using a fluoroaliphatic compound produced by a telomerization process (also called a telomer process) or an oligomerization process (also called an oligomer process). Specifically, a polymer having a fluoroaliphatic group derived from the fluoroaliphatic compound may be used as the surfactant. The fluoroaliphatic compound can be synthesized, for example, by the method described in JP-A-2002-90991.

The polymer having a fluoroaliphatic group is preferably a copolymer of a monomer having a fluoroaliphatic group with a (poly(oxyalkylene)) acrylate or methacrylate and/or a (poly(oxyalkylene)) methacrylate, and the monomers may be irregularly distributed in the polymer or may form a block copolymer.

The poly(oxyalkylene) group includes, for example, a poly(oxyethylene) group, a poly(oxypropylene) group and a poly(oxybutylene) group. The poly(oxyalkylene) group may also be a unit having alkylenes differing in the chain length in the same chain, for example, a poly(oxyethylene, oxypropylene and oxyethylene block) or a poly(oxyethylene and oxypropylene block).

Further, the copolymer of a monomer having a fluoroaliphatic group and a (poly(oxyalkylene)) acrylate or methacrylate may also be a ternary or higher copolymer obtained by simultaneously copolymerizing, for example, two or more different monomers having a fluoroaliphatic group and two or more different (poly(oxyalkylene)) acrylates or methacrylates.

Examples thereof include, as the commercially available surfactant, Megafac F178, F-470, F-473, F-475, F-476 and F-472 (produced by DIC Corp.). Further examples thereof include, for example, a copolymer of a acrylate or methacrylate having a $C_6F_{13}$ group with a (poly(oxyalkylene)) acrylate or methacrylate, a copolymer of a acrylate or methacrylate having a $C_6F_{13}$ group with a (poly(oxyethylene)) acrylate or methacrylate and a (poly(oxypropylene)) acrylate or methacrylate, a copolymer of a acrylate or methacrylate having a $C_8F_{17}$ group with a (poly(oxyalkylene)) acrylate or methacrylate, and a copolymer of a acrylate or methacrylate having a $C_8F_{17}$ group with a (poly(oxyethylene)) acrylate or methacrylate and a (poly(oxypropylene)) acrylate or methacrylate.

Surfactants other than the fluorine-containing and/or silicon-containing surfactant described in paragraph 0280 of U.S. Patent Application Publication No. 2008/0248425 may also be used.

The surfactants may be used one kind alone or in combination of two or more kinds thereof.

In the case where the composition according to the invention contains a surfactant, the content of the surfactant is preferably from 0 to 2% by mass, more preferably from 0.0001 to 2% by mass, still more preferably from 0.0005 to 1% by mass, based on the total solid content of the composition.

[8] Other Additives

The composition according to the invention can appropriately contain, in addition to the components described above, a carboxylic acid, an onium carboxylate, a dissolution-inhibiting compound having a molecular weight of 3,000 or less described, for example, in Proceeding of SPIE, 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid, for example, benzoic acid or naphthoic acid.

The content of the carboxylic acid is preferably from 0.01 to 10% by mass, more preferably from 0.01 to 5% by mass, still more preferably from 0.01 to 3% by mass, based on the total solid content concentration of the composition.

From the standpoint of enhancing the resolution, the actinic ray-sensitive or radiation-sensitive resin composition according to the invention is used preferably in a film thickness from 10 to 250 nm, more preferably in a film thickness from 20 to 200 nm, and still more preferably in a film thickness from 30 to 100 nm. Such a thickness can be achieved by setting the solid content concentration of the composition to a suitable range to impart an appropriate viscosity, thereby improving the coating property and film-forming property.

The solid content concentration of the actinic ray-sensitive or radiation-sensitive resin composition according to the invention is usually from 1.0 to 10% by mass, preferably from 2.0 to 5.7% by mass, and more preferably from 2.0 to 5.3% by mass. By setting the solid content concentration to the range described above, the resist solution can be uniformly coated on a substrate and further, a resist pattern excellent in the line width roughness can be formed. The reason therefor is not clearly known, but it is considered that probably by setting the solid content concentration to 10% by mass or less, preferably 5.7% by mass or less, aggregation of materials, particularly, a photo-acid generator, in the resist solution is suppressed and as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition according to the invention is used by dissolving the components described above in a predetermined organic solvent, preferably in the mixed solvent described above, filtering the solution through a filter, and coating the filtrate on a predetermined support (substrate). The filter used for filtration through a filter is preferably a polytetrafluoroethylene-made, polyethylene-made or nylon-made filter having a pore size of 0.1 µm or less, more preferably 0.05 µm or less, and still more preferably 0.03 µm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Further, a deaeration treatment or the like may be applied to the composition before and after the filtration through a filter.

[9] Pattern Forming Method

The present invention also relates to a resist film formed by using the composition according to the invention described above.

Further, a pattern forming method according to the invention includes at least:

(a) a step of forming a resist film using the actinic ray-sensitive or radiation-sensitive resin composition, (b) a step of exposing the film, and (c) a step of developing the exposed film using a developer to form a pattern.

The developer in the step (c) may be an alkali developer or a developer containing an organic solvent.

Specifically, the pattern forming method according to the invention may include:

(a) a step of forming a film (resist film) using the actinic ray-sensitive or radiation-sensitive resin composition, (b) a step of exposing the film, and (c') a step of developing the exposed film by using a developer containing an organic solvent to form a negative pattern.

The exposure in the step (b) may be immersion exposure.

The pattern forming method according to the invention preferably includes (d) a heating step after the exposure step (b).

The pattern forming method according to the invention may further include (e) a step of developing using an alkali developer when the developer in the step (c) is a developer containing an organic solvent, and on the other hand, may further include (e) a step of developing using a developer containing an organic solvent when the developer in the step (c) is an alkali developer.

In the pattern forming method according to the invention, the exposure step (b) can be performed a plurality of times.

In the pattern forming method according to the invention, the heating step (e) may be performed a plurality of times.

The resist film is formed from the actinic ray-sensitive or radiation-sensitive resin composition according to the invention described above and more specifically, is preferably formed on a substrate. In the pattern forming method according to the invention, the step of forming a film on a substrate using the actinic ray-sensitive or radiation-sensitive resin composition, the step of exposing the film, and the development step can be performed by conventionally known methods.

The composition is coated on a substrate (for example, a silicon/silicon dioxide-coated substrate, a silicon nitride substrate or a chromium-deposited quartz substrate) used in the production of a precision integrated circuit device, an imprint mold or the like, by using, for example, a spinner or a coater. Thereafter, the coating is dried, whereby an actinic ray-sensitive or radiation-sensitive film can be formed.

Prior to the formation of the resist film, an anti-reflection film may be previously provided on the substrate. As the anti-reflection film, any of an inorganic film type, for example, titanium, titanium dioxide, titanium nitride, chromium oxide, carbon or amorphous silicon, and an organic film type composed of a light-absorbing agent and a polymer material can be used. Also, as the organic anti-reflection film, commercially available organic anti-reflection film, for example, DUV 30 Series and DUV 40 Series produced by Brewer Science, Inc. or AR-2, AR-3 and AR-5 produced by Shipley Co., Ltd. can be used.

It is also preferred to include before the exposure step, a pre-heating step (PB; Prebake). Further, it is also preferred to include after the exposure step and before the development step, a post-exposure heating step (PEB; Post Exposure Bake).

The heating temperature in both PB and PEB is preferably from 70 to 120° C., and more preferably from 80 to 110° C.

The heating time is preferably from 30 to 300 seconds, more preferably from 30 to 180 seconds, and still more preferably from 30 to 90 seconds.

The heating can be performed by means which is equipped in a conventional exposure-development device, and may be performed by using a hot plate or the like.

The reaction after the exposure is accelerated by the baking so that the sensitivity and pattern profile are improved.

Further, it is also preferred to include after the rinse step, a heating step (Post Bake). By the baking, a developer and a rinse solution remaining between the patterns and in the inside of the pattern are removed.

The actinic ray or radiation includes, for example, infrared light, visible light, ultraviolet light, far-ultraviolet light, an X-ray and an electron beam. The actinic ray or radiation having, for example, a wavelength of 250 nm or less, particularly 220 nm or less, is preferred. Examples of such an actinic ray or radiation include KrF excimer laser (248 nm), ArF excimer laser (193 nm), $F_2$ excimer laser (157 nm), an X-ray and an electron beam. The actinic ray or radiation is preferably, for example, KrF excimer laser, ArF excimer laser, an electron beam, an X-ray or EUV light, and more preferably an electron beam, an X-ray or EUV light.

The substrate on which the film is formed in the invention is not particularly limited, and a substrate commonly used in the production process of semiconductor, for example, IC, in the production process of circuit board, for example, of liquid crystal or thermal head, or in the lithography process of other photo-fabrication, for example, an inorganic substrate, for example, silicon, SiN, $SiO_2$ or SiN, or a coating-type inorganic substrate, for example, SOG can be used.

Further, if desired, an organic anti-reflection film may be formed between the film and the substrate.

The pattern forming method according to the invention preferably includes a step of developing using an alkali developer.

As the alkali developer, for example, an aqueous alkaline solution of an inorganic alkali, for example, sodium hydroxide, potassium hydroxide, sodium carbonate, sodium silicate, sodium metasilicate or aqueous ammonia, a primary amine, for example, ethylamine or n-propylamine, a secondary amine, for example, diethylamine or di-n-butylamine, a tertiary amine, for example, triethylamine or methyldiethylamine, an alcohol amine, for example, dimethylethanolamine or triethanolamine, a quaternary ammonium salt, for example, tetramethylammonium hydroxide or tetraethylammonium hydroxide, or a cyclic amine, for example, pyrrole or piperidine can be used.

Further, the aqueous alkaline solution may also be used after adding thereto an alcohol or a surfactant in an appropriate amount.

The alkali concentration of the alkali developer is usually from 0.1 to 20% by mass.

The pH of the alkali developer is usually from 10.0 to 15.0.

In particular, a 2.38% by mass aqueous solution of tetramethylammonium hydroxide is preferred.

As a rinse solution in the rinse treatment performed after the alkali development, pure water is used, and pure water may also be used after adding a surfactant in an appropriate amount.

Further, after the development processing or the rinse treatment, a treatment of removing the developer or the rinse solution adhered on the pattern with a supercritical fluid can be performed.

The composition according to the invention can also be used in a process wherein after coating, film formation and exposure, development is performed using a developer composed of an organic solvent as the main component to form a negative type pattern. As such a process, the process described in JP-A-2010-217884 can be used.

In the organic developer, a polar solvent, for example, an ester-based solvent (for example, butyl acetate or ethyl acetate), a ketone-based solvent (for example, 2-heptanone or cyclohexanone), an alcohol-based solvent, an amide-based solvent or an ether-based solvent or a hydrocarbon-based solvent can be used. The water content in the entire organic developer is preferably less than 10% by mass, and it is more preferred to contain substantially no water.

Also, the organic developer may contain a basic compound in an appropriate amount, if desired. Examples of the basic compound include those described above.

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) can be applied.

In the rinse step, the wafer after development using a developer containing an organic solvent is subjected to rinse treatment using a rinse solution containing the organic solvent described above. The method for the rinse treatment is not particularly limited, and, for example, a method of continuously ejecting the rinse solution on the substrate spinning at a constant speed (spin coating method), a method of dipping the substrate in a bath filled with the rinse solution for a fixed time (dipping method), and a method of spraying the rinse solution on the substrate surface (spraying method) can be applied. Among them, it is preferred to perform the rinse treatment by the spin coating method and after the washing, remove the rinse solution from the substrate by spinning the substrate at a rotation number from 2,000 to 4,000 rpm. It is also preferred to include a heating step (Post Bake) after the rinse step. By the baking, the developer and rinse solution remaining between the patterns and in the inside of the pattern are removed. The heating step after the rinse step is performed at usually from 40 to 160° C., preferably from 70 to 95° C., for usually from 10 seconds to 3 minutes, preferably from 30 to 90 seconds.

The present invention also relates to a resist-coated mask blank coated with the resist film obtained as described above. In order to obtain such a resist-coated mask blank, in the case of forming a resist pattern on a photomask blank for producing a photomask, the transparent substrate used includes a transparent substrate, for example, quartz and calcium fluoride. In general, a light-shielding film, an anti-reflection film, further a phase shift film, and additionally, a required functional film, for example, an etching stopper film or an etching mask film are stacked on the substrate. As to the material of the functional layer, a film containing silicon or a transition metal, for example, chromium, molybdenum, zirconium, tantalum, tungsten, titanium or niobium is stacked. The material used for the outermost layer includes a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may be a single layer and preferably has a multilayer structure where a plurality of materials are coated one on another. In the case of the multilayer structure, the film thickness per layer is not particularly limited and is preferably from 5 to 100 nm, and more preferably from 10 to 80 nm. The thickness of the entire light-shielding film is not particularly limited and is preferably from 5 to 200 nm, and more preferably from 10 to 150 nm.

In the case of performing pattern formation using a negative type chemical amplification resist composition on a photomask blank having in the outermost layer thereof a material containing chromium and oxygen or nitrogen among the materials described above, in general, a so-called undercut profile where a constricted shape is formed in the vicinity of the substrate is liable to be formed. However, when the resist film according to the invention is used, the problem of undercut can be improved in comparison with a conventional mask blank.

Subsequently, the resist film is irradiated with an actinic ray or radiation (for example, an electron beam), preferably baked (at usually from 80 to 150° C., preferably from 90 to 130° C., for usually from 1 to 20 minutes, preferably from 1 to 10 minutes), and then developed, whereby a better pattern can be obtained. Using the pattern as the mask, etching treatment, ion implantation or the like is appropriately performed to produce, for example, a semiconductor fine circuit, an imprint mold structure or a photomask.

Moreover, an imprint mold may be produced by using the composition according to the invention, and the details thereof are referred, for example, to Japanese Patent 4,109,085, JP-A-2008-162101 and Nanoimprint no Kiso to Gijutsu Kaihatsu•Oyo Tenkai-Nanoimprint no Kiban GIjutsu to Saishin no GIjutsu Tenkai-, complied by Yoshihiko Hirai, Frontier Shuppan.

Furthermore, the present invention also relates to a photomask obtained by exposing and developing the resist-coated mask blank. To the exposure and development can be applied the steps described above. The photomask is suitably used for the production of semiconductor device.

The photomask according to the invention may be a light transmission type mask used with ArF excimer laser or the like or may be a light reflection type mask used in reflective lithography employing EUV light as a light source.

[Usage]

The pattern forming method according to the invention is suitably used for the formation of a semiconductor fine circuit, for example, in the production of VLSI or a high-capacity microchip. At the formation of a semiconductor fine circuit, the resist film having formed therein a pattern is subjected to circuit formation or etching and the remaining resist film portion is finally removed with a solvent or the like. Thus, unlike a so-called permanent resist used for a printed board and the like, the resist film derived from the actinic ray-sensitive or radiation-sensitive resin composition according to the invention does not remain in the final product, for example, a microchip.

The present invention also relates to a method for producing an electronic device containing the pattern forming method according to the invention described above, and an electronic device produced by the producing method.

The electronic device according to the invention is suitably mounted on an electric/electronic equipment (for example, home electronics, OA•media related equipment, optical equipment or communication equipment).

EXAMPLE

The present invention will be described more specifically with reference to the examples, but the invention should not be construed as being limited thereto.

Synthesis Example 1

Synthesis of Resin (P-1)

To 41.4 g of phenylacetoaldehyde dimethylacetal was added 23.5 g of acetyl chloride, and the mixture was stirred in a water bath of 45° C. for 6 hours. After returning to room temperature, the unreacted acetyl chloride was removed under a reduced pressure condition to obtain Compound CI-1 shown below as a chloroether compound.

[Chem. 68]

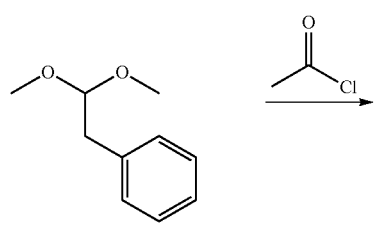

[Chem. 68]

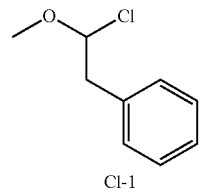

Cl-1

In 50 g of tetrahydrofuran (THF) was dissolved 10.0 g of poly(p-hydroxystyrene) (VP-2500 produced by Nippon Soda Co., Ltd.) as a polyhydroxystyrene compound, and 8.85 g of triethylamine was added thereto, followed by stirring in an ice water bath. To the reaction solution was dropwise added 4.69 g of the mixed solution containing Compound CI-1 obtained as above, followed by stirring for 4 hours. A small amount of the reaction solution was collected to be measured by $^1$H-NMR, and it was found that the protection rate was 25.2%. Subsequently, a small amount of the mixed solution containing Compound CI-1 was additionally added thereto, and the operation for measurement of $^1$H-NMR was repeated. At a point of time when the protection ratio exceeded 30.0% as the target value, distilled water was added to terminate the reaction. The THF was removed by distillation under a reduced pressure, and the reactant was dissolved in ethyl acetate. The organic layer obtained was washed 5 times with distilled water, and then the organic layer was dropwise added to 1.5 L of hexane. The resulting precipitate was collected by filtration, washed with a small amount of hexane, and then dissolved in 35 g of propylene glycol monomethyl ether acetate (PGMEA). A low-boiling point solvent was removed from the solution obtained by an evaporator, thereby obtaining 44.3 g of a PGMEA solution (26.4% by mass) of Resin (P-1).

As to the Resin (P-1), the compositional ratio (molar ratio) of Resin (P-1) was calculated by the $^1$H-NMR measurement. Also, by GPC (solvent: THF) measurement, a weight average molecular weight (Mw: expressed in terms of polystyrene), a number average molecular weight (Mn: expressed in terms of polystyrene), and polydispersity (Mw/Mn, hereinafter also referred to as "Pd") of Resin (P-1) were calculated. The Mw and Pd are shown in the chemical formula below.

[Chem. 69]

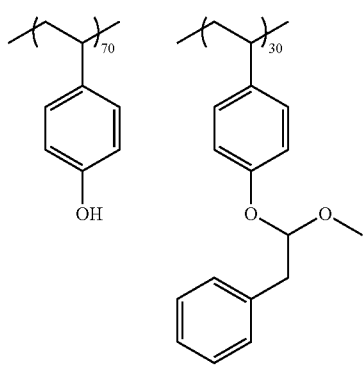

(P-1)

Mw = 4700
Pd = 1.13

Synthesis Examples 2 to 9

Synthesis of Resins (P-2) to (P-8) and (CP-9)

Resins (P-2) to (P-8) and (CP-9) were synthesized in the same method as in Synthesis Example 1 except for changing appropriately the polyhydroxystyrene compound and chloroether compound used. The chloroether compound used was synthesized using a corresponding acetal in the same manner as in Synthesis Example 1.

The structure, weight average molecular weight (Mw) and polydispersity (Pd) of the polymer synthesized are shown below. Also, the composition ratio of each repeating unit in the structure of polymer shown below is indicated by a molar ratio.

[Chem. 70]

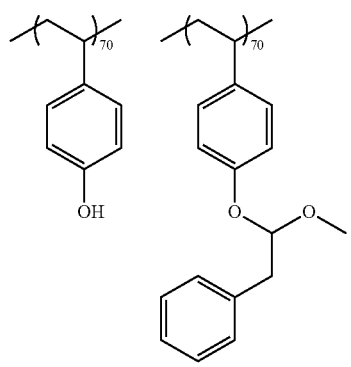
(P-1)
Mw = 4700
Pd = 1.13

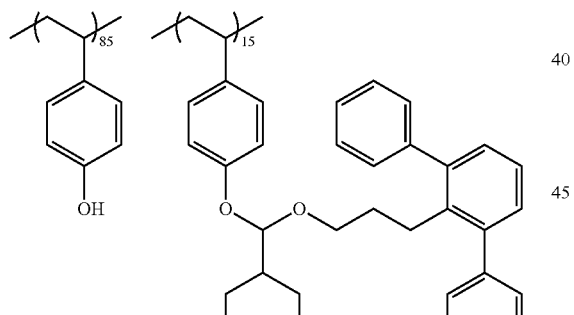
(P-2)
Mw = 11000
Pd = 1.16

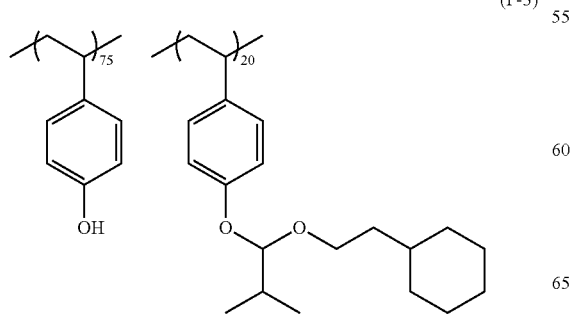
(P-3)

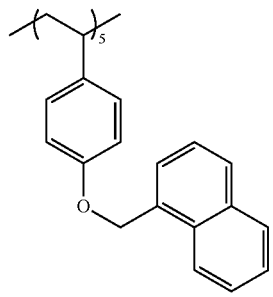
Mw = 11000
Pd = 1.19

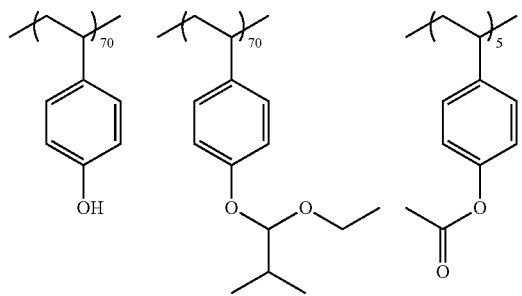
(P-4)
Mw = 4400
Pd = 1.14

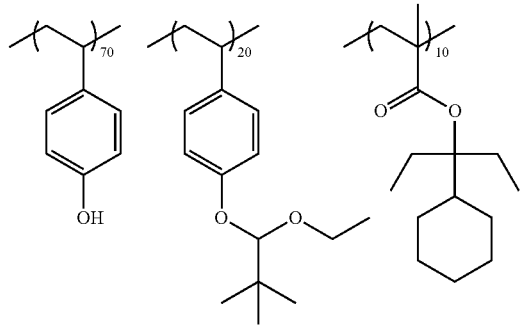
(P-5)
Mw = 8500
Pd = 1.68

[Chem. 71]

(P-6)

-continued

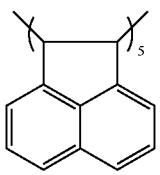
Mw = 13000
Pd = 1.55

(P-7)

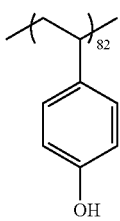

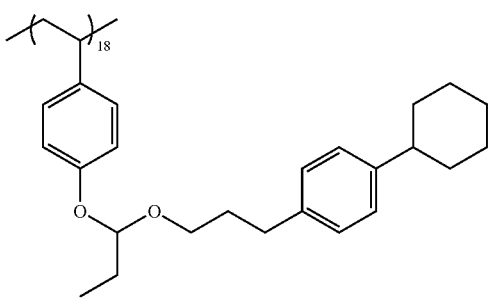
Mw = 12000
Pd = 1.13

(P-8)

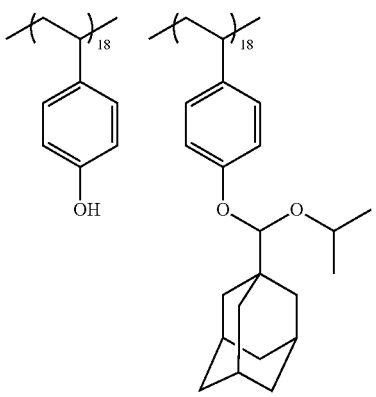

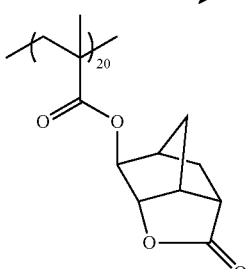
Mw = 4800
Pd = 1.59

-continued (CP-9)

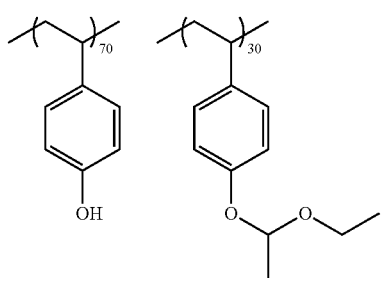
Mw = 4400
Pd = 1.14

Synthesis Example 10

Synthesis of Ionic Compound

The ionic compounds shown below were synthesized in accordance with the method described, for example, in Hiroshi Horiguchi, Gosei Kaimen Kasseizai <Eugmented Edition>, Sankyo Publishing Co., Ltd., 1969 or Kaimen Kasseizai Hyoka•Shikenho Henshuiinkai, Kaimen Kasseizai Hyoka•Shikenho, Gihodo Shuppan Co., Ltd., 2002.

[Chem. 72]

(B-1)
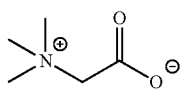

(B-2)
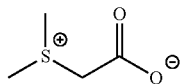

(B-3)
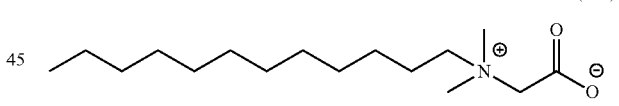

(B-4)
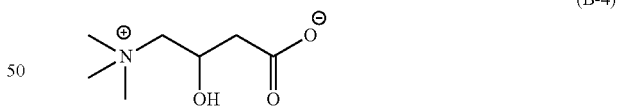

(B-6)
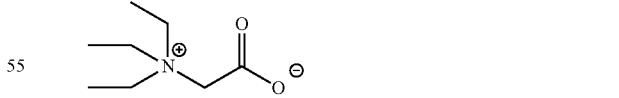

(B-7)

(B-8)
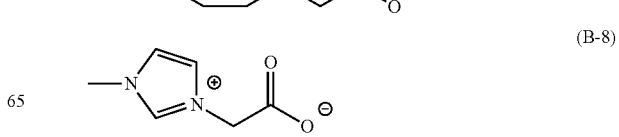

(B-18)
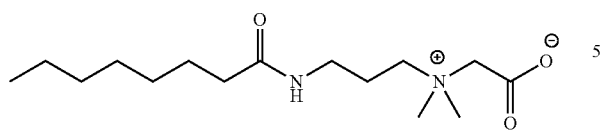

(B-19)
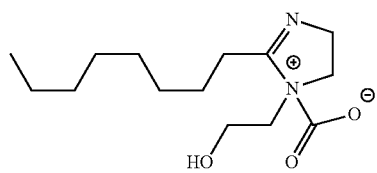

(B-20)
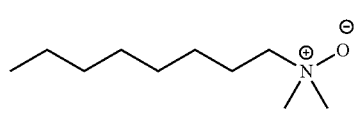

[Acid Generator]

The structures of the acid generators used in the examples are shown below.

[Chem. 73]

(PAG-1)
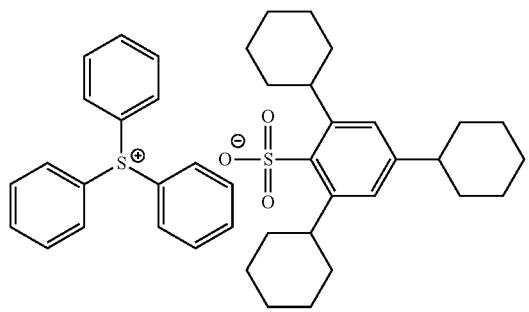

(PAG-2)
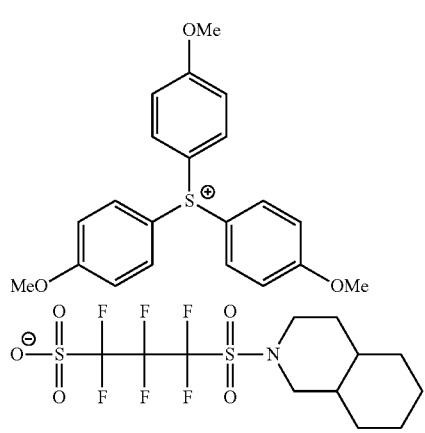

(PAG-3)
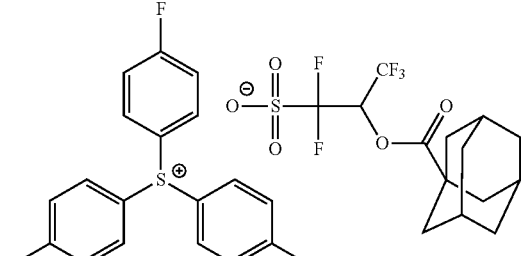

(PAG-4)
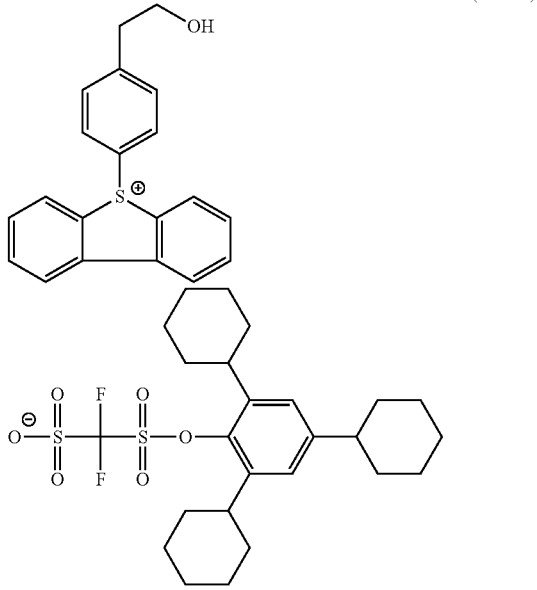

(PAG-5)
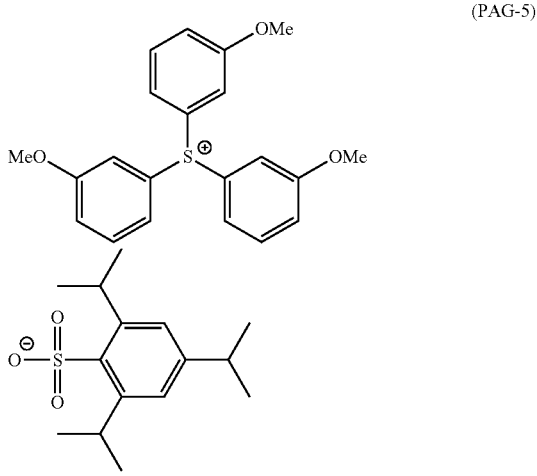

[Basic Compound]
  Q-1: Tetrabutylammonium hydroxide
  Q-2: 2-Phenylbenzimidazole

[Solvent]
  SL-1: Propylene glycol monomethyl ether acetate (PGMEA, another name: 1-methoxy-2-acetoxypropane)
  SL-2: Propylene glycol monomethyl ether (PGME, 1-methoxy-2-propanol)
  SL-3: 2-Heptane
  SL-4: Ethyl lactate
  SL-5: Cyclohexanone SL-6: γ-Butyrolactone
SL-7: Propylene carbonate
[Surfactant]
W-1: PF6320 (produced by OMNOVA Solutions Inc.)
W-2: Megafac F176 (produced by DIC Corp., fluorine-containing)
W-3: Polysiloxane Polymer KP-341 (produced by Shin-Etsu Chemical Co., Ltd., silicon-containing)
[EB Exposure a (Alkali Development, Positive): Examples 1 to 10 and Comparative Examples 1 to 3]
(1) Preparation and Coating of Coating Solution of Actinic Ray-Sensitive or Radiation-Sensitive Resin Composition A coating solution composition having the composition shown in Table 1 below was microfiltered through a membrane filter having a pore size of 0.1 μm to obtain an actinic ray-sensitive or radiation-sensitive resin composition (resist composition) solution.

The actinic ray-sensitive or radiation-sensitive resin composition solution was coated on a 6-inch Si wafer previously subjected to a hexamethyldisilazane (HMDS) treatment, by using a spin coater (Mark 8 produced by Tokyo Electron Ltd.) and dried on a hot plate at 110° C. for 90 seconds to obtain a resist film having a film thickness of 0.1 μm.

(2) EB Exposure and Development

The resist film obtained in (1) above was patternwise irradiated by using an electron beam lithography apparatus (HL750 produced by Hitachi, Ltd., accelerating voltage: 50 KeV). In this case, the lithography was performed to form two kinds of 1:1 line-and-space patterns having a line width of 0.15 μm and a line width of 0.10 respectively. After the irradiation, the resist film was heated on a hot plate at 120° C. for 90 seconds.

Subsequently, the resist film was developed using a 2.38% by mass aqueous solution of tetramethylammonium hydroxide (TMAH) for 30 seconds, washed with pure water, and finally dried by high speed spinning of 2,000 rotations (rpm) for 20 seconds.

The pattern obtained was evaluated with sensitivity, resolution, pattern profile, line width roughness (LWR), bridge margin, collapse margin and vacuum PED according to the methods described below. The evaluation results are shown in Table 2 below.

(2-1) Sensitivity ($E_0$)

The pattern obtained was observed using a scanning electron microscope (S-9220 produced by Hitachi, Ltd.).

The electron beam irradiation dose when the line width of 0.15 μm (line:space=1:1) was resolved was taken as the sensitivity ($E_0$). The smaller value indicates the higher performance.

(2-2) Resolution (LS Resolution)

The limiting resolution (the minimum line width capable of separation-resolving the line and space) at the irradiation dose giving the sensitivity described above was taken as the resolution. The smaller value indicates the higher performance.

(2-3) Pattern Profile

The cross-sectional profile of the line pattern having a line width of 0.15 μm at the irradiation dose giving the sensitivity described above and the cross-sectional profile of the line pattern having a line width of 0.10 μm at the irradiation dose for resolving the line width of 0.10 μm (line:space=1:1) were observed, respectively, using a scanning electron microscope (S-4800 produced by Hitachi Ltd.), and evaluated on a scale of five grades of rectangular, tapered, somewhat tapered, reverse tapered and somewhat reverse tapered.

(2-4) Line Width Roughness (LWR)

The line width was measured at arbitrary 30 points in the region of 5 μm in the longitudinal direction of the line pattern having a line width of 0.15 μm at the irradiation dose giving the sensitivity described above, and the variation thereof was evaluated by 3σ. As to LWR of the line pattern having a line width of 0.10 μm, the line width was measured at the irradiation dose for resolving the line width of 0.10 μm (line:space=1:1) in the same manner as above, and the variation thereof was evaluated by 3σ. The smaller value indicates the higher performance.

(2-5) Bridge Margin

When the irradiation dose was decreased from the irradiation dose for $E_0$ described above in the case of irradiating the line pattern having a line width of 0.15 μm, a space width when a bridge began to generate between the spaces was determined to be used as the index of bridge margin. The smaller value indicates the higher performance.

(2-6) Collapse Margin

When the irradiation dose was increased from the irradiation dose for $E_0$ described above in the case of irradiating the line pattern having a line width of 0.15 μm, a space width when the line pattern began to collapse was determined to be used as the index of collapse margin. The larger value indicates the higher performance.

TABLE 1

| Resist Composition | Acid-decomposable Resin | Acid Generator | (g) | Ionic Compound (B) | (g) | Basic Compound | (g) | Surfactant | (g) | Solvent | (Mass ratio) | Solid Content Concentration (wt %) |
|---|---|---|---|---|---|---|---|---|---|---|---|---|
| R-1 | P-1 | 10 PAG-1 | 0.9 | B-18 | 0.15 | | | W-3 | 0.05 | SL-3/SL-4 | 80/20 | 3.5 |
| R-2 | P-2 | 10 PAG-2 | 1.0 | B-6 | 0.15 | | | W-2 | 0.05 | SL-1/SL-5 | 60/40 | 3.5 |
| R-3 | P-3 | 10 PAG-3 | 0.9 | B-1 | 0.10 | Q-1 | 0.05 | W-1 | 0.05 | SL-1/SL-6 | 80/20 | 3.5 |
| R-4 | P-4 | 10 PAG-4 | 0.8 | B-4 | 0.15 | | | | | SL-3/SL-6 | 70/30 | 3.5 |
| R-5 | P-5 | 10 PAG-5 | 0.9 | B-3 | 0.15 | | | W-1 | 0.05 | SL-1/SL-5/SL-7 | 70/20/10 | 3.5 |
| R-6 | P-6 | 10 PAG-1 | 1.0 | B-1/B-7 | 0.05/0.10 | | | W-3 | 0.05 | SL-2/SL-7 | 90/10 | 3.5 |
| R-7 | P-7 | 10 PAG-2 | 0.9 | B-8 | 0.10 | Q-1 | 0.05 | W-1 | 0.05 | SL-1/SL-7 | 90/10 | 3.5 |
| R-8 | P-8 | 10 PAG-3 | 1.1 | B-2 | 0.15 | | | W-3 | 0.05 | SL-1/SL-5 | 80/20 | 3.5 |
| R-9 | P-5/P-7 | 5/5 PAG-4 | 1.0 | B-19 | 0.15 | | | W-2 | 0.05 | SL-1/SL-5 | 70/30 | 3.5 |
| R-10 | P-1 | 10 PAG-1/PAG-5 | 0.6/0.6 | B-20 | 0.15 | | | W-1 | 0.05 | SL-1/SL-5 | 60/40 | 3.5 |
| R-11 | P-1 | 10 PAG-1 | 0.9 | | | Q-1 | 0.15 | W-3 | 0.05 | SL-3/SL-4 | 80/20 | 3.5 |
| R-12 | P-2 | 10 PAG-2 | 1.0 | | | Q-2 | 0.15 | W-2 | 0.05 | SL-1/SL-5 | 60/40 | 3.5 |
| R-13 | CP-9 | 10 PAG-3 | 0.9 | B-1 | 0.15 | | | W-1 | 0.05 | SL-1/SL-6 | 80/20 | 3.5 |

(2-7) Vacuum PED

The line pattern having a line width of 0.15 μm was irradiated at the irradiation dose for $E_0$ described above, promptly taken out from the exposure apparatus, subjected to PEB treatment (heating on a hot plate at 120° C. for 90 seconds), and measured the line width thereof (0 h). Also, the line pattern having a line width of 0.15 μM was irradiated at the irradiation dose for $E_0$ described above, taken out from the exposure apparatus after 24 hours, subjected to the PEB treatment, and measured the line width thereof (24 h). The change ratio of line width was calculated according to the formula shown below.

Change ratio of line width (%)=$\Delta CD$(24 h−0 h)μm/ 0.1 μm

The smaller value indicates the higher performance. The value was used as the index of vacuum PED stability.

The evaluation results are shown in Table 2 below.

comparative Examples 1 to 3, as to the LWR in line width of 0.10 μm, the line was not resolved to the extent that the evaluation could be performed and the evaluation was impossible.

On the other hand, it can be seen that in Examples 1 to 10 in which the resin contains the repeating unit represented by formula (1) and the ionic compound represented by formula (2) (B) is used, the LS resolution, LWR in line width of 0.15 μm and 0.10 μm, bridge margin, collapse margin and vacuum PED are excellent, and the pattern profile in line width of 0.15 μm and 0.10 μm is rectangular.

[EB Exposure B (Alkali Development, Positive): Examples 11 to 20 and Comparative Examples 4 to 6]

(1) Preparation and Coating of Coating Solution of Actinic Ray-Sensitive or Radiation-Sensitive Resin Composition A coating solution composition having the composition shown in Table 3 below was microfiltered through a mem-

TABLE 2

| | Exposure Condition | Resist Composition | Sensitivity E0 (μC/cm²) | LS Resolution (nm) | Pattern Profile in Line Width of 0.15 μm and 0.10 μm | LWR in Line Width of 0.15 μm (nm) | LWR in Line Width of 0.10 μm (nm) | Bridge Margin (nm) | Collapse Margin (nm) | Vacuum PED (%) |
|---|---|---|---|---|---|---|---|---|---|---|
| Example | | | | | | | | | | |
| Example 1 | EB Exposure A | R-1 | 47 | 87.5 | Rectangular | 5.8 | 4.8 | 75.0 | 125.0 | 1.5 |
| Example 2 | EB Exposure A | R-2 | 45 | 87.5 | Rectangular | 5.9 | 4.9 | 75.0 | 125.0 | 1.7 |
| Example 3 | EB Exposure A | R-3 | 48 | 87.5 | Rectangular | 5.6 | 4.7 | 75.0 | 125.0 | 1.8 |
| Example 4 | EB Exposure A | R-4 | 49 | 87.5 | Rectangular | 5.9 | 4.9 | 75.0 | 125.0 | 1.9 |
| Example 5 | EB Exposure A | R-5 | 47 | 87.5 | Rectangular | 5.4 | 4.5 | 75.0 | 137.5 | 1.3 |
| Example 6 | EB Exposure A | R-6 | 46 | 87.5 | Rectangular | 5.7 | 4.8 | 75.0 | 125.0 | 1.7 |
| Example 7 | EB Exposure A | R-7 | 47 | 87.5 | Rectangular | 5.7 | 4.8 | 75.0 | 125.0 | 1.8 |
| Example 8 | EB Exposure A | R-8 | 43 | 87.5 | Rectangular | 5.3 | 4.4 | 75.0 | 137.5 | 1.3 |
| Example 9 | EB Exposure A | R-9 | 46 | 87.5 | Rectangular | 5.9 | 4.9 | 75.0 | 125.0 | 1.9 |
| Example 10 | EB Exposure A | R-10 | 41 | 87.5 | Rectangular | 5.6 | 4.7 | 75.0 | 125.0 | 1.8 |
| Comparative Example | | | | | | | | | | |
| Comparative Example 1 | EB Exposure A | R-11 | 47 | 125.0 | Tapered | 10.9 | Unevaluable | 87.5 | 87.5 | 4.2 |
| Comparative Example 2 | EB Exposure A | R-12 | 45 | 100.0 | Somewhat Tapered | 11.2 | Unevaluable | 112.5 | 87.5 | 5.4 |
| Comparative Example 3 | EB Exposure A | R-13 | 48 | 100.0 | Tapered | 8.1 | Unevaluable | 87.5 | 112.5 | 5.3 |

As is apparent from the results shown in Table 2 above, in Comparative Examples 1 and 2 in which the ionic compound represented by formula (2) is not used, but conventional basic compounds Q-1 and Q-2 are used, respectively, and in Comparative Example 3 in which although the ionic compound represented by formula (2) is contained, the resin does not contain the repeating unit represented by formula (1) (number of carbon atoms of Ra being 1), the LS resolution, pattern profile in line width of 0.15 μm and 0.10 μm, LWR in line width of 0.15 μm, bridge margin, collapse margin and vacuum PED are poor. In brane filter having a pore size of 0.1 μm to obtain an actinic ray-sensitive or radiation-sensitive resin composition (resist composition) solution.

The actinic ray-sensitive or radiation-sensitive resin composition solution was coated on a 8-inch Si wafer previously subjected to a hexamethyldisilazane (HMDS) treatment, by using a spin coater (Mark 8 produced by Tokyo Electron Ltd.) and dried on a hot plate at 110° C. for 90 seconds to obtain a resist film having a film thickness of 0.05 μm.

TABLE 3

| Resist Composition | Acid-decomposable Resin | (g) | Acid Generator | (g) | Ionic Compound (B) | (g) | Basic Compound | (g) | Surfactant | (g) | Solvent | (Mass ratio) | Solid Content Concentration (wt %) |
|---|---|---|---|---|---|---|---|---|---|---|---|---|---|
| R-14 | P-1 | 10 | PAG-1 | 0.9 | B-18 | 0.15 | | | W-3 | 0.05 | SL-3/SL-4 | 80/20 | 1.5 |
| R-15 | P-2 | 10 | PAG-2 | 1.0 | B-6 | 0.15 | | | W-2 | 0.05 | SL-1/SL-5 | 60/40 | 1.5 |
| R-16 | P-3 | 10 | PAG-3 | 0.9 | B-1 | 0.10 | Q-1 | 0.05 | W-1 | 0.05 | SL-1/SL-6 | 80/20 | 1.5 |
| R-17 | P-4 | 10 | PAG-4 | 0.8 | B-4 | 0.15 | | | | | SL-3/SL-6 | 70/30 | 1.5 |
| R-18 | P-5 | 10 | PAG-5 | 0.9 | B-3 | 0.15 | | | W-1 | 0.05 | SL-1/SL-5/SL-7 | 70/20/10 | 1.5 |
| R-19 | P-6 | 10 | PAG-1 | 1.0 | B-1/B-7 | 0.05/0.10 | | | W-3 | 0.05 | SL-2/SL-7 | 90/10 | 1.5 |
| R-20 | P-7 | 10 | PAG-2 | 0.9 | B-8 | 0.10 | Q-1 | 0.05 | W-1 | 0.05 | SL-1/SL-7 | 90/10 | 1.5 |
| R-21 | P-8 | 10 | PAG-3 | 1.1 | B-2 | 0.15 | | | W-3 | 0.05 | SL-1/SL-5 | 80/20 | 1.5 |
| R-22 | P-5/P-7 | 5/5 | PAG-4 | 1.0 | B-19 | 0.15 | | | W-2 | 0.05 | SL-1/SL-5 | 70/30 | 1.5 |
| R-23 | P-1 | 10 | PAG-1/PAG-5 | 0.6/0.6 | B-20 | 0.15 | | | W-1 | 0.05 | SL-1/SL-5 | 60/40 | 1.5 |
| R-24 | P-1 | 10 | PAG-1 | 0.9 | | | Q-1 | 0.15 | W-3 | 0.05 | SL-3/SL-4 | 80/20 | 1.5 |
| R-25 | P-2 | 10 | PAG-2 | 1.0 | | | Q-2 | 0.15 | W-2 | 0.05 | SL-1/SL-5 | 60/40 | 1.5 |
| R-26 | CP-9 | 10 | PAG-3 | 0.9 | B-1 | 0.15 | | | W-1 | 0.05 | SL-1/SL-6 | 80/20 | 1.5 |

(2) EB Exposure and Development

The resist film obtained in (1) above was exposed by using an electron beam irradiation apparatus (JBX 6000 produced by JEOL Ltd., accelerating voltage: 50 KeV), while changing the irradiation dose so as to form line patterns (longitudinal direction: 0.2 mm, lithography lines: 40 lines) having a line width from 25 to 40 nm at 2.5 nm intervals. After the irradiation, the resist film was heated on a hot plate at 100° C. for 90 seconds.

Subsequently, the resist film was developed using a 2.38% by mass aqueous solution of tetramethylammonium hydroxide (TMAH) for 30 seconds, washed with pure water, and finally dried by high speed spinning of 2,000 rotations (rpm) for 20 seconds.

The pattern obtained was evaluated with sensitivity, resolution and pattern profile according to the methods described below. The evaluation results are shown in Table 4 below.

(2-1) Sensitivity ($E_0$)

The pattern obtained was observed using a scanning electron microscope (S-9380 produced by Hitachi, Ltd.). The electron beam irradiation dose when the line width of 30 nm (line:space=1:1) was resolved was taken as the sensitivity ($E_0$). The smaller value indicates the higher performance.

(2-2) Resolution (LS Resolution)

The limiting resolution (the minimum line width capable of separation-resolving the line and space) at the irradiation dose giving the sensitivity described above was taken as the resolution. The smaller value indicates the higher performance.

(2-3) Pattern Profile

The cross-sectional profile of the line pattern having a line width of 30 nm at the irradiation dose giving the sensitivity described above was observed using a scanning electron microscope (S-4800 produced by Hitachi Ltd.), and evaluated on a scale of five grades of rectangular, tapered, somewhat tapered, reverse tapered and somewhat reverse tapered.

The evaluation results are shown in Table 4 below.

TABLE 4

| Example | Exposure Condition | Resist Composition | Sensitivity $E_0$ ($\mu C/cm^2$) | LS Resolution (nm) | Pattern Profile |
|---|---|---|---|---|---|
| Example 11 | EB Exposure B | R-14 | 74 | 27.5 | Rectangular |
| Example 12 | EB Exposure B | R-15 | 70 | 27.5 | Rectangular |
| Example 13 | EB Exposure B | R-16 | 76 | 27.5 | Rectangular |
| Example 14 | EB Exposure B | R-17 | 78 | 30.0 | Rectangular |
| Example 15 | EB Exposure B | R-18 | 74 | 25.0 | Rectangular |
| Example 16 | EB Exposure B | R-19 | 72 | 27.5 | Rectangular |
| Example 17 | EB Exposure B | R-20 | 74 | 27.5 | Rectangular |
| Example 18 | EB Exposure B | R-21 | 69 | 25.0 | Rectangular |
| Example 19 | EB Exposure B | R-22 | 71 | 27.5 | Rectangular |
| Example 20 | EB Exposure B | R-23 | 68 | 27.5 | Rectangular |
| Comparative Example 4 | EB Exposure B | R-24 | 74 | 37.5 | Tapered |
| Comparative Example 5 | EB Exposure B | R-25 | 70 | 35.0 | Somewhat Tapered |
| Comparative Example 6 | EB Exposure B | R-26 | 76 | 35.0 | Tapered |

As is apparent from the results shown in Table 4 above, in Comparative Examples 4 and 5 in which the ionic compound represented by formula (2) is not used, but conventional basic compounds Q-1 and Q-2 are used, respectively, and in Comparative Example 6 in which although the ionic compound represented by formula (2) is contained, the resin does not contain the repeating unit represented by formula (1) (number of carbon atoms of Ra being 1), the LS resolution and pattern profile are poor.

On the other hand, it can be seen that in Examples 11 to 20 in which the resin contains the repeating unit represented by formula (1) and the ionic compound represented by formula (2) (B) is used, the LS resolution is excellent, and the pattern profile is rectangular.

INDUSTRIAL APPLICABILITY

According to the invention, an actinic ray-sensitive or radiation-sensitive resin composition capable of forming an ultrafine pattern (for example, a pattern formed by an electron beam exposure) while satisfying high vacuum PED stability, high resolution, high rectangularity of pattern profile, less occurrence of bridge and pattern collapse and a state of low LWR at the same time, a resist film using the same, a pattern forming method, a resist-coated mask blank, a photomask, and a method for producing an electronic device using them, and an electronic device can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 29, 2013 (Japanese Patent Application No. 2013-73754), and the contents thereof are incorporated herein by reference.

The invention claimed is:

1. An actinic ray-sensitive or radiation-sensitive resin composition containing:
a resin (A) containing a repeating unit represented by formula (1) shown below, and
an ionic compound (B) represented by formula (2) shown below:

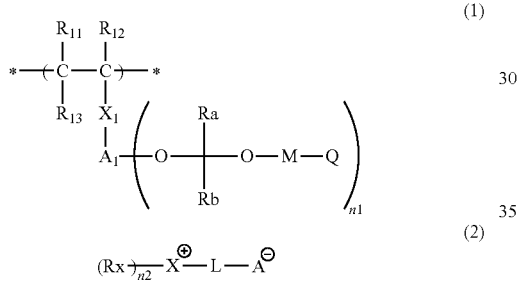

wherein in formula (1) above,
$X_1$ represents a single bond or a divalent connecting group,
$A_1$ represents an (n1+1) valent aromatic ring group,
each of $R_{11}$, $R_{12}$, and $R_{13}$ independently represents a hydrogen atom, an alkyl group, a cycloalkyl group, a halogen atom, a cyano group or an alkoxycarbonyl group, $R_{13}$ may be connected to $A_1$ to form a ring and in this case $R_{13}$ represents an alkylene group,
Ra has a structure represented by formula (4) shown below,

Rb is a hydrogen atom,
wherein in formula (4), Rd represents an alkyl group, a cycloalkyl group or an aryl group, each of Re and Rf independently represents a hydrogen atom, an alkyl group, a cycloalkyl group or an aryl group, Rd may be connected to any one of Re and Rf or both of them to form a ring structure,
M represents a single bond or a divalent connecting group, Q represents an alkyl group, a cycloalkyl group, an aryl group, an aralkyl group or a heterocyclic group,
Ra and Rb may be connected to form a ring, at least two of Ra, M and Q may be connected to form a ring,
when $A_1$ is an (n1+1) valent aromatic ring group, n1 represents an integer from 1 to 4, when n1 is 2 or more, each of a plurality of Ra, each of a plurality of Rb, each of a plurality of M and each of a plurality of Q may be the same as or different from every other Ra, Rb, M and Q, respectively,
in formula (2) above,
$A^-$ represents an organic acid anion,
L represents a divalent connecting group,
cation $X^+$ represents a nitrogen cation,
each Rx independently represents an alkyl group, a cycloalkyl group, an aryl group, an aralkyl group or a heterocyclic group, a plurality of Rx may be connected to each other to from a ring, and the ring formed may contain a nitrogen atom, an oxygen atom or a sulfur atom, as a ring member,
n2 is 3.

2. The actinic ray-sensitive or radiation-sensitive resin composition as claimed in claim 1,
wherein the resin (A) further comprises a repeating unit represented by formula (3) shown below:

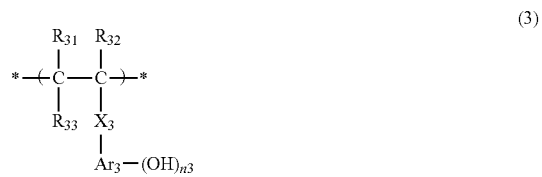

wherein in formula (3) above,
each of $R_{31}$, $R_{32}$ and $R_{33}$ independently represents a hydrogen atom, an alkyl group, a cycloalkyl group, a halogen atom, a cyano group or an alkoxycarbonyl group, $R_{33}$ may be connected to $Ar_3$ to form a ring and in this case $R_{33}$ represents an alkylene group,
$X_3$ represents a single bond or a divalent connecting group,
$Ar_3$ represents an (n3+1) valent aromatic ring group, and when $Ar_3$ is connected to $R_{33}$ to form a ring, $Ar_3$ represents an (n3+2) valent aromatic ring group, and
n3 represents an integer from 1 to 4.

3. The actinic ray-sensitive or radiation-sensitive resin composition as claimed in claim 1,
wherein in formula (2) above, $A^-$ is a carboxylic acid anion or a sulfonic acid anion.

4. The actinic ray-sensitive or radiation-sensitive resin composition as claimed in claim 1,
wherein in formula (2) above, L is a group selected from any of an alkylene group, a cycloalkylene group and an arylene group.

5. A resist film comprising the actinic ray-sensitive or radiation-sensitive resin composition as claimed in claim 1.

6. A pattern forming method including:
(a) a step of forming the resist film as claimed in claim 5,
(b) a step of exposing the film, and
(c) a step of developing the exposed film using a developer to form a pattern.

7. The pattern forming method as claimed in claim 6,
wherein the exposure is performed using an X-ray, an electron beam or EUV.

8. A method for producing an electronic device including the pattern forming method as claimed in claim 6.

9. A resist-coated mask blank coated with the resist film as claimed in claim 5.

10. A resist pattern forming method including:
exposing the resist-coated mask blank as claimed in claim 9, and
developing the exposed mask blank.

11. An actinic ray-sensitive or radiation-sensitive resin composition containing:
a resin (A) containing a repeating unit represented by formula (1) shown below, and
an ionic compound (B) represented by formula (2) shown below:

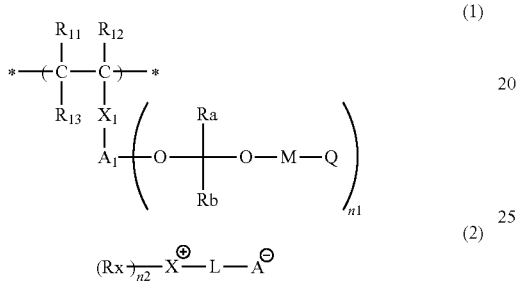

wherein in formula (1) above,
$X_1$ represents a single bond or a divalent connecting group,
$A_1$ represents a keto group or an (n1+1) valent aromatic ring group,
each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may be connected to $A_1$ to form a ring and in this case $R_{13}$ represents an alkylene group,
Ra represents an alkyl group having 2 or more carbon atoms, a cycloalkyl group, an aryl group, an aralkyl group or a heterocyclic group,
Rb represents a hydrogen atom,
M represents a single bond or a divalent connecting group,
Q represents an alkyl group, a cycloalkyl group, an aryl group, an aralkyl group or a heterocyclic group,
Ra and Rb may be connected to form a ring, at least two of Ra, M and Q are not connected to form a ring,
when $A_1$ is a keto group, n1 represents 1, and when $A_1$ is an (n1+1) valent aromatic ring group, n1 represents an integer from 1 to 4, when n1 is 2 or more, each of a plurality of Ra, each of a plurality of Rb, each of a plurality of M and each of a plurality of Q may be the same as or different from every other Ra, Rb, M and Q, respectively,
in formula (2) above,
$A^-$ represents an organic acid anion,
L represents a divalent connecting group,
cation $X^+$ represents a nitrogen cation,
each Rx independently represents an alkyl group, a cycloalkyl group, an aryl group, an aralkyl group or a heterocyclic group, a plurality of Rx may be connected to each other to from a ring, and the ring formed may contain a nitrogen atom, an oxygen atom or a sulfur atom, as a ring member,
n2 is 3.

* * * * *